US007719098B2

(12) United States Patent
Wehrly, Jr.

(10) Patent No.: US 7,719,098 B2
(45) Date of Patent: May 18, 2010

(54) STACKED MODULES AND METHOD

(75) Inventor: James Douglas Wehrly, Jr., Austin, TX (US)

(73) Assignee: Entorian Technologies LP, Austin, TX (US)

( * ) Notice: Subject to any disclaimer, the term of this patent is extended or adjusted under 35 U.S.C. 154(b) by 163 days.

(21) Appl. No.: 11/873,351

(22) Filed: Oct. 16, 2007

(65) Prior Publication Data

US 2008/0088003 A1   Apr. 17, 2008

Related U.S. Application Data

(63) Continuation of application No. 11/403,081, filed on Apr. 12, 2006, and a continuation-in-part of application No. 11/317,425, filed on Dec. 22, 2005, which is a continuation of application No. 10/400,309, filed on Mar. 27, 2003, now abandoned, which is a continuation of application No. 10/005,581, filed on Oct. 26, 2001, now Pat. No. 6,576,992, application No. 11/873,351, which is a continuation-in-part of application No. 11/258,438, filed on Oct. 25, 2005, now Pat. No. 7,310,458, which is a continuation-in-part of application No. 11/015,521, filed on Dec. 17, 2004, now abandoned, which is a continuation-in-part of application No. 10/845,029, filed on May 13, 2004, now abandoned, which is a continuation-in-part of application No. PCT/US03/29000, filed on Sep. 15, 2003, application No. 11/873,351, which is a continuation-in-part of application No. 11/263,627, filed on Oct. 31, 2005, now Pat. No. 7,656,678, which is a continuation-in-part of application No. 10/958,584, filed on Oct. 5, 2004, now Pat. No. 7,606,048, which is a continuation (Continued)

(51) Int. Cl.
    *H01L 23/538* (2006.01)

(52) U.S. Cl. .............................. 257/686; 257/E23.177
(58) Field of Classification Search ................. 257/686, 257/E23.078, E23.177, E21.511
See application file for complete search history.

(56) References Cited

U.S. PATENT DOCUMENTS 3,411,122 A   11/1968   Schiller et al.

(Continued)

FOREIGN PATENT DOCUMENTS

DE   004215467 A1   11/1992

(Continued)

OTHER PUBLICATIONS

PCT/US2006/017015, International Search Report and Written Opinion dated Oct. 17, 2006.

(Continued)

*Primary Examiner*—Marcos D. Pizarro

(57) ABSTRACT

The present invention stacks integrated circuits into modules that conserve board surface area. In a precursor assembly devised as a component for a stacked circuit module in accordance with a preferred embodiment of the present invention, one or more stiffeners are disposed at least partially between a flex circuit and an integrated circuit. In a two-high stacked circuit module devised in accordance with a preferred embodiment of the present invention, an integrated circuit is stacked above a precursor assembly. The two integrated circuits are connected with the flex circuit of the precursor assembly. The present invention may be employed to advantage in numerous configurations and combinations of integrated circuits in modules.

12 Claims, 48 Drawing Sheets

Related U.S. Application Data of application No. 10/136,890, filed on May 2, 2002, now Pat. No. 6,940,729, said application No. 11/263,627 is a continuation-in-part of application No. 10/873,847, filed on Jun. 22, 2004, now Pat. No. 7,094,632, which is a continuation of application No. 10/631,886, filed on Jul. 11, 2003, now Pat. No. 7,026,708, which is a continuation-in-part of application No. 10/453,398, filed on Jun. 3, 2003, now Pat. No. 6,914,324, which is a continuation-in-part of application No. 10/005,581, said application No. 10/631,886 is a continuation-in-part of application No. 10/457,608, filed on Jun. 9, 2003, now abandoned, which is a continuation-in-part of application No. 10/005,581.

(56) References Cited

U.S. PATENT DOCUMENTS

| | | |
|---|---|---|
| 3,436,604 A | 4/1969 | Hyltin |
| 3,654,394 A | 4/1972 | Gordon |
| 3,746,934 A | 7/1973 | Stein |
| 3,766,439 A | 10/1973 | Isaacson |
| 3,772,776 A | 11/1973 | Weisenburger |
| 3,806,767 A | 4/1974 | Lehrfeld |
| 3,983,547 A | 9/1976 | Almasi |
| 4,079,511 A | 3/1978 | Grabbe |
| 4,288,841 A | 9/1981 | Gogal |
| 4,381,421 A | 4/1983 | Coats et al. |
| 4,406,508 A | 9/1983 | Sadigh-Behzadi |
| 4,420,794 A | 12/1983 | Anderson |
| 4,437,235 A | 3/1984 | McIver |
| 4,513,368 A | 4/1985 | Houseman |
| 4,587,596 A | 5/1986 | Bunnell |
| 4,645,944 A | 2/1987 | Uya |
| 4,696,525 A | 9/1987 | Coller et al. |
| 4,712,129 A | 12/1987 | Orcutt |
| 4,722,691 A | 2/1988 | Gladd et al. |
| 4,733,461 A | 3/1988 | Nakano |
| 4,758,875 A | 7/1988 | Fujisawa et al. |
| 4,763,188 A | 8/1988 | Johnson |
| 4,821,007 A | 4/1989 | Fields et al. |
| 4,823,234 A | 4/1989 | Konishi et al. |
| 4,833,568 A | 5/1989 | Berhold |
| 4,839,717 A | 6/1989 | Phy et al. |
| 4,862,249 A | 8/1989 | Carlson |
| 4,884,237 A | 11/1989 | Mueller et al. |
| 4,891,789 A | 1/1990 | Quattrini et al. |
| 4,903,169 A | 2/1990 | Kitagawa et al. |
| 4,911,643 A | 3/1990 | Perry et al. |
| 4,953,060 A | 8/1990 | Lauffer et al. |
| 4,956,694 A | 9/1990 | Eide |
| 4,983,533 A | 1/1991 | Go |
| 4,985,703 A | 1/1991 | Kaneyama |
| 5,012,323 A | 4/1991 | Farnworth |
| 5,016,138 A | 5/1991 | Woodman |
| 5,034,350 A | 7/1991 | Marchisi |
| 5,041,015 A | 8/1991 | Travis |
| 5,041,902 A | 8/1991 | McShane |
| 5,050,039 A | 9/1991 | Edfors |
| 5,057,903 A | 10/1991 | Olla |
| 5,064,782 A | 11/1991 | Nishiguchi |
| 5,068,708 A | 11/1991 | Newman |
| 5,081,067 A | 1/1992 | Shimizu et al. |
| 5,099,393 A | 3/1992 | Bentlage et al. |
| 5,104,820 A | 4/1992 | Go et al. |
| 5,117,282 A | 5/1992 | Salatino |
| 5,122,862 A | 6/1992 | Kajihara et al. |
| 5,138,430 A | 8/1992 | Gow et al. |
| 5,138,434 A | 8/1992 | Wood et al. |
| 5,158,912 A | 10/1992 | Kellerman et al. |
| 5,159,434 A | 10/1992 | Kohno et al. |
| 5,159,535 A | 10/1992 | Desai et al. |
| 5,168,926 A | 12/1992 | Watson et al. |
| 5,198,888 A | 3/1993 | Sugano et al. |
| 5,198,965 A | 3/1993 | Curtis et al. |
| 5,214,307 A | 5/1993 | Davis |
| 5,219,794 A | 6/1993 | Satoh et al. |
| 5,222,014 A | 6/1993 | Lin |
| 5,224,023 A | 6/1993 | Smith et al. |
| 5,229,641 A | 7/1993 | Katayama |
| 5,229,916 A | 7/1993 | Frankeny et al. |
| 5,239,198 A | 8/1993 | Lin et al. |
| 5,240,588 A | 8/1993 | Uchida |
| 5,241,454 A | 8/1993 | Ameen et al. |
| 5,243,133 A | 9/1993 | Engle et al. |
| 5,247,423 A | 9/1993 | Lin et al. |
| 5,252,855 A | 10/1993 | Ogawa et al. |
| 5,252,857 A | 10/1993 | Kane et al. |
| 5,259,770 A | 11/1993 | Bates et al. |
| 5,261,068 A | 11/1993 | Gaskins et al. |
| 5,262,927 A | 11/1993 | Chia et al. |
| 5,276,418 A | 1/1994 | Klosowiak et al. |
| 5,281,852 A | 1/1994 | Normington |
| 5,289,062 A | 2/1994 | Wyland |
| 5,289,346 A | 2/1994 | Carey et al. |
| 5,313,097 A | 5/1994 | Haj-Ali-Ahmadi et al. |
| 5,337,388 A | 8/1994 | Jacobowitz et al. |
| 5,343,366 A | 8/1994 | Cipolla et al. |
| 5,345,205 A | 9/1994 | Kornrumpf |
| 5,347,159 A | 9/1994 | Khandros et al. |
| 5,347,428 A | 9/1994 | Carson et al. |
| 5,357,478 A | 10/1994 | Kikuda et al. |
| 5,361,228 A | 11/1994 | Adachi et al. |
| 5,362,656 A | 11/1994 | McMahon |
| 5,375,041 A | 12/1994 | McMahon |
| 5,384,690 A | 1/1995 | Davis et al. |
| 5,386,341 A | 1/1995 | Olson et al. |
| 5,394,303 A | 2/1995 | Yamaji |
| 5,396,573 A | 3/1995 | Ecker et al. |
| 5,397,916 A | 3/1995 | Normington |
| 5,428,190 A | 6/1995 | Stopperan |
| 5,432,630 A | 7/1995 | Lebby et al. |
| 5,438,224 A | 8/1995 | Papageorge et al. |
| 5,448,511 A | 9/1995 | Paurus et al. |
| 5,477,082 A | 12/1995 | Buckley, III et al. |
| 5,484,959 A | 1/1996 | Burns |
| 5,502,333 A | 3/1996 | Bertin et al. |
| 5,509,197 A | 4/1996 | Stone |
| 5,516,989 A | 5/1996 | Uedo et al. |
| 5,523,619 A | 6/1996 | McAllister et al. |
| 5,523,695 A | 6/1996 | Lin |
| 5,572,065 A | 11/1996 | Burns |
| 5,588,205 A | 12/1996 | Roane |
| 5,594,275 A | 1/1997 | Kwon et al. |
| 5,610,833 A | 3/1997 | Chang et al. |
| 5,612,570 A | 3/1997 | Eide et al. |
| 5,620,782 A | 4/1997 | Davis et al. |
| 5,631,193 A | 5/1997 | Burns |
| 5,642,055 A | 6/1997 | Difrancesco |
| 5,644,839 A | 7/1997 | Stone |
| 5,646,446 A | 7/1997 | Nicewarner, Jr. et al. |
| 5,654,877 A | 8/1997 | Burns |
| 5,657,537 A | 8/1997 | Saia et al. |
| 5,677,569 A | 10/1997 | Choi et al. |
| 5,717,556 A | 2/1998 | Yanagida |
| 5,729,894 A | 3/1998 | Rostoker et al. |
| 5,744,827 A | 4/1998 | Jeong et al. |
| 5,751,553 A | 5/1998 | Clayton |
| 5,763,296 A | 6/1998 | Casati et al. |
| 5,764,497 A | 6/1998 | Mizumo et al. |
| 5,776,797 A | 7/1998 | Nicewarner, Jr. et al. |
| 5,778,522 A | 7/1998 | Burns |
| 5,783,464 A | 7/1998 | Burns |

| | | | |
|---|---|---|---|
| 5,789,815 A | 8/1998 | Tessier et al. | |
| 5,801,439 A | 9/1998 | Fujisawa et al. | |
| 5,804,870 A | 9/1998 | Burns | |
| 5,805,422 A | 9/1998 | Otake et al. | |
| 5,835,988 A | 11/1998 | Ishii | |
| 5,841,721 A | 11/1998 | Kwon et al. | |
| 5,852,326 A | 12/1998 | Khandros et al. | |
| 5,869,353 A | 2/1999 | Levy et al. | |
| 5,895,969 A | 4/1999 | Masuda et al. | |
| 5,895,970 A | 4/1999 | Miyoshi et al. | |
| 5,899,705 A | 5/1999 | Akram | |
| 5,917,709 A | 6/1999 | Johnson et al. | |
| 5,922,061 A | 7/1999 | Robinson | |
| 5,925,934 A | 7/1999 | Lim | |
| 5,926,369 A | 7/1999 | Ingraham et al. | |
| 5,933,712 A | 8/1999 | Bernhardt et al. | |
| 5,949,657 A | 9/1999 | Karabatsos | |
| 5,953,215 A | 9/1999 | Karabatsos | |
| 5,959,839 A | 9/1999 | Gates | |
| 5,963,427 A | 10/1999 | Bollesen | |
| 5,973,395 A | 10/1999 | Suzuki et al. | |
| 5,995,370 A | 11/1999 | Nakamori | |
| 6,002,167 A | 12/1999 | Hatano et al. | |
| 6,002,589 A | 12/1999 | Perino | |
| 6,013,948 A | 1/2000 | Akram et al. | |
| 6,014,316 A | 1/2000 | Eide | |
| 6,028,352 A | 2/2000 | Eide | |
| 6,028,365 A | 2/2000 | Akram et al. | |
| 6,034,878 A | 3/2000 | Osaka et al. | |
| 6,040,624 A | 3/2000 | Chambers et al. | |
| 6,072,233 A | 6/2000 | Corisis et al. | |
| 6,084,293 A | 7/2000 | Ohuchi | |
| 6,084,294 A | 7/2000 | Tomita | |
| 6,084,778 A | 7/2000 | Malhi | |
| 6,097,087 A | 8/2000 | Farnworth et al. | |
| 6,102,710 A | 8/2000 | Beilin et al. | |
| 6,111,761 A | 8/2000 | Peana et al. | |
| 6,114,763 A | 9/2000 | Smith | |
| 6,121,676 A | 9/2000 | Solberg | |
| RE36,916 E | 10/2000 | Moshayedi | |
| 6,130,477 A | 10/2000 | Chen et al. | |
| 6,157,541 A | 12/2000 | Hacke | |
| 6,165,817 A | 12/2000 | Akram | |
| 6,166,443 A | 12/2000 | Inaba et al. | |
| 6,172,874 B1 | 1/2001 | Bartilson | |
| 6,178,093 B1 | 1/2001 | Bhatt et al. | |
| 6,186,106 B1 | 2/2001 | Glovatsky | |
| 6,187,652 B1 | 2/2001 | Chou et al. | |
| 6,205,654 B1 | 3/2001 | Burns | |
| 6,208,521 B1 | 3/2001 | Nakatsuka | |
| 6,218,731 B1 | 4/2001 | Huang et al. | |
| 6,222,737 B1 | 4/2001 | Ross | |
| 6,225,688 B1 | 5/2001 | Kim et al. | |
| 6,233,650 B1 | 5/2001 | Johnson et al. | |
| 6,234,820 B1 | 5/2001 | Perino et al. | |
| 6,236,565 B1 | 5/2001 | Gordon | |
| 6,262,895 B1 | 7/2001 | Forthun | |
| 6,265,660 B1 | 7/2001 | Tandy | |
| 6,265,766 B1 | 7/2001 | Moden | |
| 6,266,252 B1 | 7/2001 | Karabatsos | |
| 6,271,058 B1 | 8/2001 | Yoshida | |
| 6,272,741 B1 | 8/2001 | Kennedy et al. | |
| 6,281,577 B1 * | 8/2001 | Oppermann et al. | ........ 257/724 |
| 6,285,560 B1 | 9/2001 | Lyne | |
| 6,288,907 B1 | 9/2001 | Burns | |
| 6,300,679 B1 | 10/2001 | Mukerji et al. | |
| 6,303,981 B1 | 10/2001 | Moden | |
| 6,310,392 B1 | 10/2001 | Burns | |
| 6,313,998 B1 | 11/2001 | Kledzik | |
| 6,316,825 B1 | 11/2001 | Park et al. | |
| 6,320,137 B1 | 11/2001 | Bonser et al. | |
| 6,323,060 B1 | 11/2001 | Isaak | |
| 6,329,708 B1 | 12/2001 | Komiyama | |
| 6,336,262 B1 | 1/2002 | Dalal et al. | |
| 6,351,029 B1 | 2/2002 | Isaak | |
| 6,358,836 B1 * | 3/2002 | Lu et al. | ..................... 438/618 |
| 6,360,433 B1 | 3/2002 | Ross | |
| 6,360,935 B1 | 3/2002 | Flake | |
| 6,368,896 B2 | 4/2002 | Farnworth et al. | |
| 6,376,769 B1 | 4/2002 | Chung | |
| 6,384,339 B1 | 5/2002 | Neuman | |
| 6,392,162 B1 | 5/2002 | Karabatsos | |
| 6,410,857 B1 | 6/2002 | Gonya | |
| 6,414,384 B1 | 7/2002 | Lo et al. | |
| 6,423,622 B1 | 7/2002 | Chen et al. | |
| 6,426,240 B2 | 7/2002 | Isaak | |
| 6,426,549 B1 | 7/2002 | Isaak | |
| 6,426,560 B1 | 7/2002 | Kawamura et al. | |
| 6,433,418 B1 | 8/2002 | Fujisawa et al. | |
| 6,437,990 B1 | 8/2002 | Degani et al. | |
| 6,444,490 B2 | 9/2002 | Bertin et al. | |
| 6,444,921 B1 | 9/2002 | Wang et al. | |
| 6,446,158 B1 | 9/2002 | Karabatsos | |
| 6,447,321 B1 | 9/2002 | Perino et al. | |
| 6,449,159 B1 | 9/2002 | Haba | |
| 6,452,826 B1 | 9/2002 | Kim et al. | |
| 6,462,408 B1 | 10/2002 | Wehrly, Jr. | |
| 6,462,412 B2 | 10/2002 | Kamei et al. | |
| 6,462,423 B1 | 10/2002 | Akram et al. | |
| 6,465,877 B1 | 10/2002 | Farnworth et al. | |
| 6,465,893 B1 | 10/2002 | Khandros et al. | |
| 6,473,308 B2 | 10/2002 | Forthun | |
| 6,486,544 B1 | 11/2002 | Hashimoto | |
| 6,487,078 B2 | 11/2002 | Kledzik et al. | |
| 6,489,178 B2 | 12/2002 | Coyle et al. | |
| 6,489,687 B1 | 12/2002 | Hashimoto | |
| 6,492,718 B2 | 12/2002 | Ohmori | |
| 6,500,697 B2 | 12/2002 | Ahmad | |
| 6,504,104 B2 | 1/2003 | Hacke et al. | |
| 6,509,639 B1 | 1/2003 | Lin | |
| 6,514,793 B2 | 2/2003 | Isaak | |
| 6,521,530 B2 | 2/2003 | Peters et al. | |
| 6,522,018 B1 | 2/2003 | Tay et al. | |
| 6,528,870 B2 | 3/2003 | Fukatsu et al. | |
| 6,532,162 B2 | 3/2003 | Schoenborn | |
| 6,538,895 B2 | 3/2003 | Worz et al. | |
| 6,549,413 B2 | 4/2003 | Karnezos et al. | |
| 6,552,910 B1 | 4/2003 | Moon et al. | |
| 6,559,521 B2 | 5/2003 | Tuttle | |
| 6,560,117 B2 | 5/2003 | Moon | |
| 6,572,387 B2 | 6/2003 | Burns et al. | |
| 6,576,992 B1 | 6/2003 | Cady et al. | |
| 6,588,095 B2 | 7/2003 | Pan | |
| 6,590,282 B1 | 7/2003 | Wang et al. | |
| 6,600,222 B1 | 7/2003 | Levardo | |
| 6,608,763 B1 | 8/2003 | Burns et al. | |
| 6,614,664 B2 | 9/2003 | Lee | |
| 6,617,510 B2 | 9/2003 | Schreiber et al. | |
| 6,620,651 B2 | 9/2003 | He et al. | |
| 6,624,507 B1 | 9/2003 | Nguyen et al. | |
| 6,627,984 B2 | 9/2003 | Bruce et al. | |
| 6,646,333 B1 | 11/2003 | Hogerl | |
| 6,646,335 B2 | 11/2003 | Emoto | |
| 6,657,134 B2 | 12/2003 | Spielberger et al. | |
| 6,660,561 B2 | 12/2003 | Forthun | |
| 6,670,700 B1 | 12/2003 | Hashimoto | |
| 6,673,651 B2 | 1/2004 | Ohuchi et al. | |
| 6,677,670 B2 | 1/2004 | Kondo | |
| 6,683,377 B1 | 1/2004 | Shim et al. | |
| 6,689,634 B1 | 2/2004 | Lyne | |
| 6,690,584 B2 | 2/2004 | Uzuka et al. | |
| 6,699,730 B2 | 3/2004 | Kim et al. | |
| 6,707,148 B1 | 3/2004 | Mostafazedeh et al. | |
| 6,707,684 B1 | 3/2004 | Andric et al. | |
| 6,709,893 B2 | 3/2004 | Moden et al. | |
| 6,710,437 B2 | 3/2004 | Takahashi et al. | |

| | | |
|---|---|---|
| 6,724,076 B1 | 4/2004 | Kahlisch et al. |
| 6,726,346 B2 | 4/2004 | Shoji |
| 6,737,891 B2 | 5/2004 | Karabatsos |
| 6,746,894 B2 | 6/2004 | Fee et al. |
| 6,762,495 B1 | 7/2004 | Reyes et al. |
| 6,762,769 B2 | 7/2004 | Guo et al. |
| 6,765,288 B2 | 7/2004 | Damberg |
| 6,768,660 B2 | 7/2004 | Kong et al. |
| 6,773,848 B1 | 8/2004 | Nortoft et al. |
| 6,776,797 B1 | 8/2004 | Blom |
| 6,778,404 B1 | 8/2004 | Bolken et al. |
| 6,781,240 B2 | 8/2004 | Choi et al. |
| 6,803,651 B1 | 10/2004 | Chiang |
| 6,812,567 B2 | 11/2004 | Kim et al. |
| 6,821,029 B1 | 11/2004 | Grung et al. |
| 6,833,984 B1 | 12/2004 | Belgacem |
| 6,838,761 B2 | 1/2005 | Karnezos |
| 6,841,855 B2 | 1/2005 | Jaeck et al. |
| 6,849,949 B1 | 2/2005 | Lyu et al. |
| 6,858,910 B2 | 2/2005 | Coyle et al. |
| 6,867,496 B1 | 3/2005 | Hashimoto |
| 6,869,825 B2 | 3/2005 | Chiu |
| 6,873,039 B2 | 3/2005 | Beroz et al |
| 6,876,074 B2 | 4/2005 | Kim |
| 6,879,047 B1 | 4/2005 | Heo |
| 6,884,653 B2 | 4/2005 | Larson |
| 6,891,729 B2 | 5/2005 | Ko et al. |
| 6,893,897 B2 | 5/2005 | Sweterlitsch |
| 6,897,565 B2 | 5/2005 | Pflughaupt et al. |
| 6,908,792 B2 | 6/2005 | Bruce et al. |
| 6,910,268 B2 | 6/2005 | Miller |
| 6,913,949 B2 | 7/2005 | Pflughaupt et al. |
| 6,914,324 B2 | 7/2005 | Rapport et al. |
| 6,919,626 B2 | 7/2005 | Burns |
| 6,927,471 B2 | 8/2005 | Salmon |
| 6,940,158 B2 | 9/2005 | Haba et al. |
| 6,940,729 B2 | 9/2005 | Cady et al. |
| 6,956,883 B2 | 10/2005 | Kamoto |
| 6,965,166 B2 | 11/2005 | Hikita et al. |
| 6,977,440 B2 | 12/2005 | Pflughaupt et al. |
| 6,978,538 B2 | 12/2005 | DiStefano et al. |
| 6,998,704 B2 | 2/2006 | Yamazaki et al. |
| 7,023,701 B2 | 4/2006 | Stocken et al. |
| 7,053,485 B2 | 5/2006 | Bang et al. |
| 7,071,547 B2 | 7/2006 | Kang et al. |
| 7,081,373 B2 | 7/2006 | Roeters et al. |
| 7,104,804 B2 | 9/2006 | Batinovich |
| 7,115,986 B2 | 10/2006 | Moon et al. |
| 7,129,571 B2 | 10/2006 | Kang |
| 7,149,095 B2 | 12/2006 | Warner et al. |
| 7,246,431 B2 | 7/2007 | Bang et al. |
| 7,291,906 B2 | 11/2007 | Cha et al. |
| 2001/0013423 A1 | 8/2001 | Dalal et al. |
| 2001/0018124 A1* | 8/2001 | Yamakawa et al. .......... 428/346 |
| 2001/0040793 A1 | 11/2001 | Inaba |
| 2002/0006032 A1 | 1/2002 | Karabatsos |
| 2002/0044423 A1 | 4/2002 | Primavera et al. |
| 2002/0114143 A1 | 8/2002 | Morrison et al. |
| 2002/0126951 A1 | 9/2002 | Sutherland et al. |
| 2003/0113998 A1 | 6/2003 | Ross |
| 2003/0164551 A1 | 9/2003 | Lee et al. |
| 2004/0004281 A1 | 1/2004 | Bai et al. |
| 2004/0075991 A1 | 4/2004 | Haba et al. |
| 2004/0217461 A1 | 11/2004 | Damberg |
| 2004/0217471 A1 | 11/2004 | Haba |
| 2004/0245617 A1 | 12/2004 | Damberg |
| 2004/0267409 A1 | 12/2004 | De Lorenzo et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0047250 A1 | 3/2005 | Ruckerbauer et al. |
| 2005/0133897 A1 | 6/2005 | Baek et al. |

FOREIGN PATENT DOCUMENTS

| | | |
|---|---|---|
| DE | 004214102 A1 | 12/1992 |
| EP | 0426-303(A2) | 10/1990 |
| JP | 359088863(A) | 5/1984 |
| JP | 60-254762(A) | 12/1985 |
| JP | 60254762 | 12/1985 |
| JP | 3641047659(A) | 3/1986 |
| JP | 62-230027(A) | 8/1987 |
| JP | 4-209562(A) | 7/1992 |
| JP | 4-4368167(A) | 12/1992 |
| JP | 50-29534(A) | 2/1993 |
| JP | 63-153849(A) | 6/1998 |
| JP | 2000-88921 | 3/2000 |
| JP | 2000/307029 A | 11/2000 |
| JP | 2003/309246(A) | 10/2003 |
| JP | 2003/309247(A) | 10/2003 |
| JP | 2003/347475(A) | 12/2003 |
| JP | 2003/347503(A) | 12/2003 |
| WO | WO9744824 | 11/1997 |
| WO | 03/037053 A1 | 5/2003 |

OTHER PUBLICATIONS

PCT/US2005/013345, International Preliminary Report on Patentability dated Nov. 2, 2006.
PCT/US2005/016764; International Preliminary Report on Patentability dated Nov. 23, 2006.
PCT/US2005/010756, International Search Report and Written Opinion dated Oct. 12, 2006.
PCT/US2005/010756, International Preliminary Report on Patentability dated Apr. 12, 2007.
PCT/US2005/039307, International Search Report and Written Opinion dated Sep. 26, 2006.
PCT/US2005/013336, International Preliminary Report on Patentability dated Nov. 9, 2006.
Howard W. Markstein, Western Editor, Rigid-Flex: A Maturing Technology dated Feb. 1996, Electronic Packaging & Production.
Design Requirements for Outlines of Solid State and Related Products, Ball Grid Array Package (BGA), Sep. 2005, Jedec Publication 95.
William R. Newberry, Xynetix Design Systems, Inc., Design Techniques for Ball Grid Arrays, 1997 published on the Internet.
Flexible Printed Circuit Technology—A Versatile Interconnection Option. (Website 2 pages) Fjelstad, Joseph. Dec. 3, 2002.
Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.
Tessera uZ Ball Stack Package. 4 figures that purport to be directed to the uZ—Ball Stacked Memory, Published on the Internet.
Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.
Flexible Thinking: Examining the Flexible Circuit Tapes. (Website 2 pages) Fjelstad, Joseph., Published Apr. 20, 2000 on Internet.
Ron. Bauer, Intel. "Stacked-CSP Delivers Flexibility, Reliability, and Space-Saving Capabilities", vol. 3, Spring 2002. Published on the Internet.
Tessera Technologies, Inc.—Semiconductor Intellectual Property, Chip Scale Packaging—Website pages (3), Internet.
Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.
William R. Newberry, Design Techniques for Ball Grid Arrays, Xynetix Design Systems, Inc., Portland, Maine, Published on the Internet.

Chip Scale Packaging and Redistribution, Paul A. Magill, Glenn A. Rinne, J. Daniel Mis, Wayne C. Machon, Joseph W. Baggs, Unitive Electronics Inc.

Dense-Pac Microsystems, 16 Megabit High Speed CMOS SRAM DPSIMX16MKn3.

Dense-Pac Microsystems, 256 Megabyte CMOS DRAM DP3ED32MS72RW5.

Dense-Pac Microsystems, Breaking Space, Barriers, 3-D Technology 1993.

Dense-Pac Microsystems, DPS512X16A3, Ceramic 512K X 16 CMOS SRAM Module.

IBM Preliminary 168 Pin SDRAM Registered DIMM Functional Description & Timing Diagrams.

3D Interconnection for Ultra-Dense Multichip Modules, Christian VAL, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Intergrated Package, Alvin Weinberg, Pacesetter, Inc. and W. Kinzy Jones, Florida International University.

1992 Proceedings, 42nd Electronic Components & Technology Conference, May 18-20, 1992.

Research Disclosure, Organic Card Device Carrier, 31318, May 1990, No. 313.

IBM Technical Disclosure Bulletin, vol. 23, No. 12, May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chip Mount—A 3D Hybrid Wafer Scale Integration Technology, International Electron Device Meeting, IEDM Technical Digest, Washington, D.C., Dec. 6-9, 1987.

* cited by examiner

JEDEC Pinout for the X4 and X8 FBGA DDR-II Package Reference

| | 1 | 2 | 3 | 4 | 5 | 6 | 7 | 8 | 9 |
|---|---|---|---|---|---|---|---|---|---|
| A | VDD | NU,RDQS# | VSS | X | X | X | VSSQ-S | DQS# | VDDQ |
| B | NC/DQ | VDDQ | DM/RDQS | X | X | X | DQS | VDDQ-S | NC/DQ |
| C | VDDQ | DQ | VSSQ | X | X | X | VSSQ | DQ | VDDQ |
| D | NC/DQ | VSSQ | DQ | X | X | X | DQ | VSSQ | NC/DQ |
| E | VSSDL | VREF | VDDL | X | X | X | VDD | CK | VSS |
| F | X | WE# | CAS | X | X | X | RAS# | CK | X |
| G | X | CS# | CKE | X | X | X | BA1# | BA0 | X |
| H | VSS | A10 | A1 | X | X | X | A2 | A0 | VDDQ |
| J | X | A3 | A5 | X | X | X | A6 | A4 | X |
| K | X | A7 | A9 | X | X | X | A11 | A8 | VSS |
| L | VDD | A12 | A14 | | | | A15 | A13 | X |

FIG. 17

X8 Configuration 2Hi Using 2 x 4 parts — 8 Data Out

| | 1 | 2 | 3 | 4 | 5 | 6 | 7 | 8 | 9 |
|---|---|---|---|---|---|---|---|---|---|
| A | VDD | NU_RDQS# | VSS | X | X | X | VSSQ-S | DQS# | VDDQ |
| B | DQ top | VDDQ | DM/RDQS | X | X | X | DQS | VDDQ-S | DQ top |
| C | VDDQ | DQ bot | VSSQ | X | X | X | VSSQ | DQ bot | VDDQ |
| D | DQ top | VSSQ | DQ bot | X | X | X | DQ bot | VSSQ | DQ top |
| E | VSSDL | VREF | VDDL | X | X | X | VDD | CK | VSS |
| F | NC | WE# | CAS | X | X | X | RAS# | CK | X |
| G | NC | CS# | CKE | X | X | X | BA1# | BA0 | X |
| H | VSS | A10 | A1 | X | X | X | A2 | A0 | VDDQ |
| J | X | A3 | A5 | X | X | X | A6 | A4 | X |
| K | X | A7 | A9 | | | | A11 | A8 | VSS |
| L | VDD | A12 | A14 | | | | A15 | A13 | X |

FIG. 18

X16 Configuration 2H Using 2 x 8 parts — 16 Data Out

|   | 1 | 2 | 3 | 4 | 5 | 6 | 7 | 8 | 9 |
|---|---|---|---|---|---|---|---|---|---|
| A | VDD | RDQS# | VSS | RDQS0# | X | DQS1# | VSSQ-S | DQS0# | VDDQ |
| B | DQ top | VDDQ | DM/RDQS | DM/RDQS1 | X | DQS1 | DQS0 | VDDQ-S | DQ top |
| C | VDDQ | DQ top | VSSQ | DQ BOT | X | DQ BOT | VSSQ | DQ top | VDDQ |
| D | DQ top | VSSQ | DQ top | DQ BOT | X | DQ BOT | DQ top | VSSQ | DQ top |
| E | VSSQL | VREF | VDDL | DQ BOT | X | DQ BOT | VDD | VSSQ | VSS |
| F | NC | WE# | CAS | X | X | X | RAS# | CK | X |
| G | NC | CS# | CKE | X | X | X | BA1# | CK | X |
| H | VSS | A10 | A1 | X | X | X | BA0 | BA0 | VDDQ |
| J | X | A3 | A5 | X | X | X | A2 | A0 | X |
| K | X | A7 | A9 | X | X | X | A6 | A4 | VSS |
| L | VDD | A12 | A14 | X | X | X | A11 | A8 | X |
|   |   |   |   |   |   |   | A15 | A13 |   |

FIG. 19

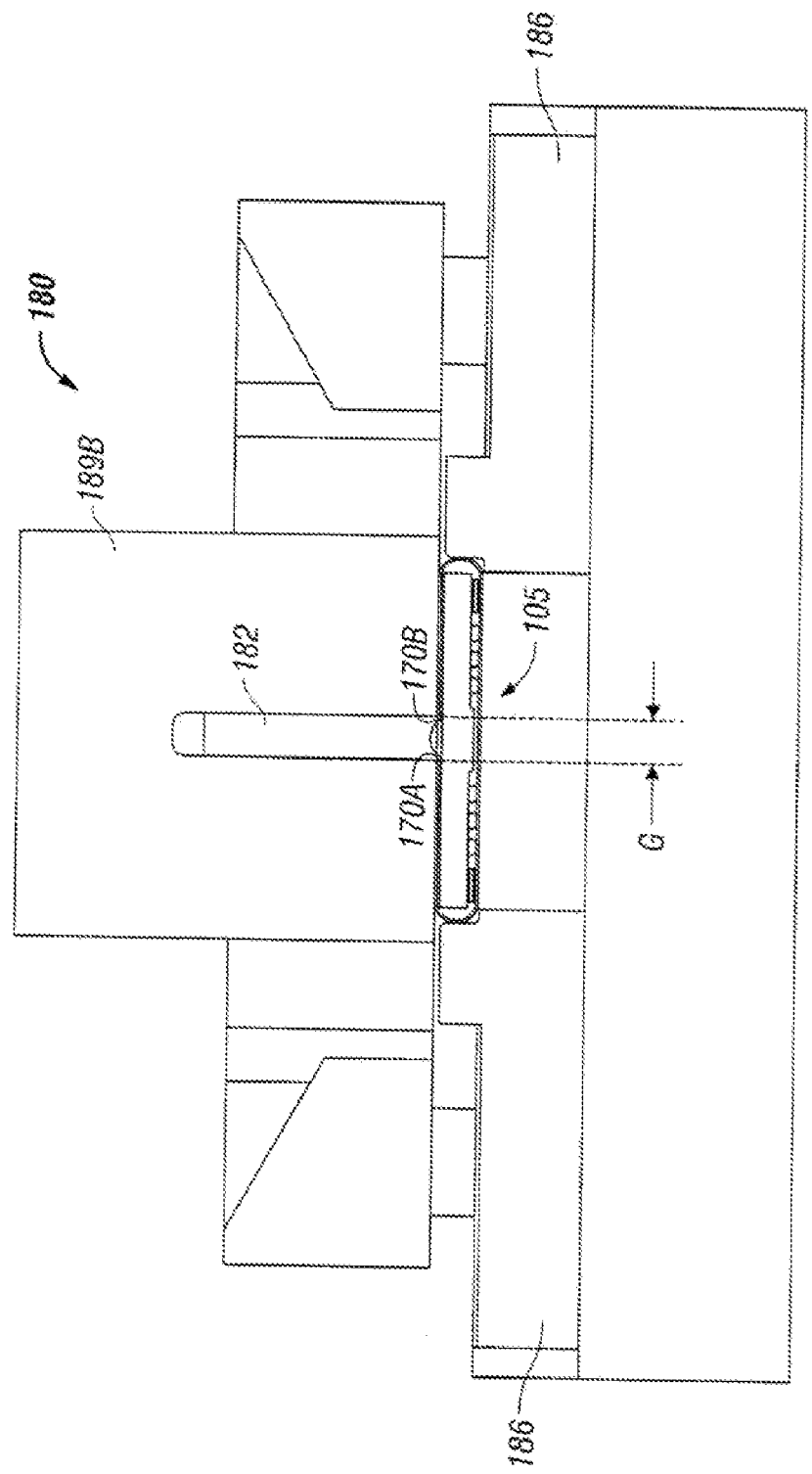

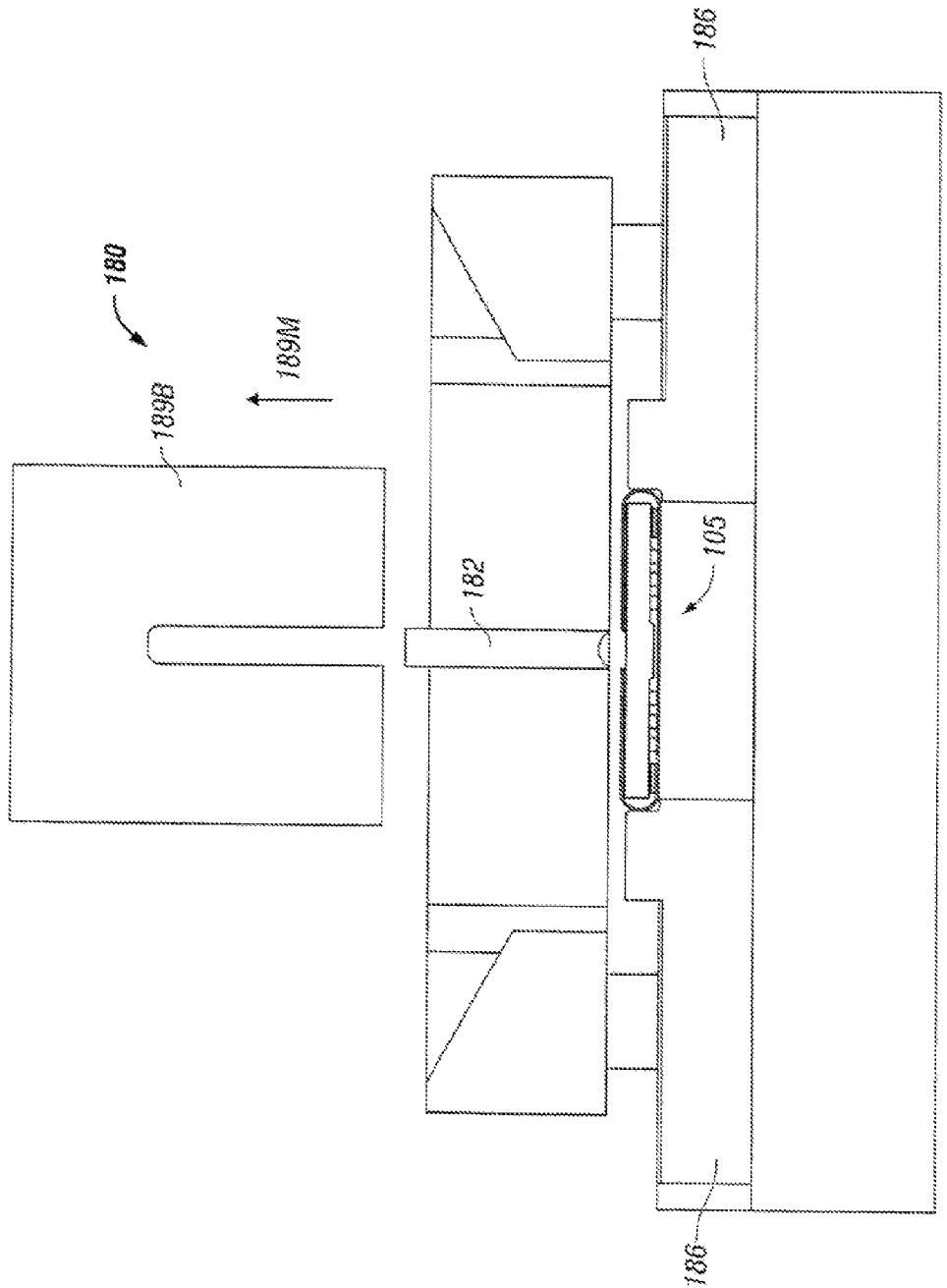

STACKED MODULES AND METHOD

RELATED APPLICATIONS

This application is a continuation of U.S. patent application Ser. No. 11/403,081, filed Apr. 12, 2006. This application is a continuation-in-part of U.S. patent application Ser. No. 11/317,425 filed Dec. 22, 2005, which is a continuation of U.S. patent application Ser. No. 10/400,309 filed Mar. 27, 2003 now abandoned, which is a continuation of U.S. patent application Ser. No. 10/005,581, filed Oct. 26, 2001, now issued as U.S. Pat. No. 6,576,992 B2.

This application also is a continuation-in-part of U.S. patent application Ser. No. 11/258,438 filed Oct. 25, 2005, now U.S. Pat. No. 7,310,458, which is a continuation-in-part of U.S. patent application Ser. No. 11/015,521, filed Dec. 17, 2004, now abandoned, which is a continuation-in-part of U.S. patent application Ser. No. 10/845,029, filed May 13, 2004, now abandoned, which is a continuation-in-part of PCT Application No. PCT/US03/29000, filed Sep. 15, 2003, pending.

This application also is a continuation-in-part of U.S. patent application Ser. No. 11/263,627, filed Oct. 31, 2005, now U.S. Pat No. 7,656,678, which is a continuation-in-part of U.S. patent application Ser. No. 10/958,584, filed Oct. 5, 2004, now U.S. Pat. No. 7,606,048, which is a continuation of U.S. patent application Ser. No. 10/136,890, filed May. 2, 2002, now U.S. Pat. No. 6,940,729 B2, issued Sep. 6, 2005. U.S. patent application Ser. No. 11/263,627 also is a continuation-in-part of U.S. patent application Ser. No. 10/873,847, filed Jun. 22, 2004, now U.S. Pat. No. 7,094,632, which is a continuation of U.S. patent application Ser. No. 10/631,886, filed Jul. 11, 2003, now U.S. Pat. No. 7,026,708, which is a continuation-in-part of U.S. patent application Ser. No. 10/453,398, filed Jun. 3, 2003, now U.S. Pat. No. 6,914,324 B2, issued Jul. 5, 2005, which is a continuation-in-part of U.S. patent application Ser. No. 10/005,581, filed Oct. 26, 2001, now U.S. Pat. No. 6,576,992 B2, issued Jun. 10, 2003. U.S. patent application Ser. No. 10/631,886 also is a continuation-in-part of U.S. patent application Ser. No. 10/457,608, filed Jun. 9, 2003, now abandoned, which is a continuation-in-part of U.S. patent application Ser. No. 10/005,581, filed Oct. 26, 2001, now U.S. Pat. No. 6,576,992 B2, issued Jun. 10, 2003.

U.S. patent application Ser. Nos. 10/005,581, 10/136,890, 10/400,309, 10/453,398, 10/457,608, 10/631,886, 10/845,029, 10/873,847, 10/958,584, 11/015,521, 11/258,438, 11/263,627, 11/317,425, and PCT Application No. PCT/US03/29000 are hereby incorporated by reference for all purposes.

TECHNICAL FIELD

The present invention relates to aggregating integrated circuits and, in particular, to stacking integrated circuits in chip-scale packages and methods for creating stacked modules of chip-scale packages.

BACKGROUND

A variety of techniques are used to stack packaged integrated circuits. Some methods require special packages, while other techniques stack packages configured to allow stand-alone deployment in an operating environment.

"Chip scale packaging" or CSP refers generally to packages that provide connection to an integrated circuit through a set of contacts (often embodied as "bumps" or "balls") arrayed across a major surface of the package. Instead of leads emergent from a peripheral side of the package as in "leaded" packages, in a CSP, contacts are placed on a major surface and typically emerge from the planar bottom surface of the package. The absence of "leads" on package sides renders most stacking techniques devised for leaded packages inapplicable for CSP stacking.

CSP has enabled reductions in size and weight parameters for many applications. CSP is a broad category including a variety of packages from near chip scale to die-sized packages such as the die sized ball grid array (DSBGA). To meet the continuing demands for cost and form factor reductions concurrent with increasing capabilities and capacities, technologies that aggregate plural integrated circuit dies in a package been developed. The techniques and technology for stacking plural integrated circuit dies within a single package, however, are not generally applicable for stacking packages that are configured to allow stand-alone deployment in an operating environment.

There are several known techniques for stacking integrated circuit packages articulated in chip scale technology. A variety of previous techniques for stacking CSPs typically present complex structural arrangements and thermal or high frequency performance issues. For example, thermal performance is a characteristic of importance in CSP stacks. With increasing operating frequencies of most systems, high frequency performance issues are also increasingly important. Further, many stacking techniques result in modules that exhibit profiles taller than may be preferred for particular applications.

Staktek Group L.P., the assignee of the present invention, has developed a variety of stacked module designs that employ a form standard or mandrel that can provide thermal and/or construction advantages while providing a standard form that may allow use of a flexible circuit design with a variety of CSP types and body sizes. The mandrel or form standard stack designs come in a variety of shapes and sizes and materials. Some form standards extend beyond the perimeter edge or the extent of the CSP body and thus provide a form about which the flex circuitry transits. Some other form standards are substantially planar and have a lateral extent smaller than the lateral extent of an adjacent CSP. Although form standards provide numerous benefits in stacked module designs, the use of form standards may add various cost and complexity issues to the design and manufacturing issues inherent with stacked modules.

Stacked module design and assembly techniques and systems that provide a thermally efficient, reliable structure that perform well at higher frequencies but do not add excessive height to the stack that can be manufactured at reasonable cost with readily understood and managed materials and methods are provided.

SUMMARY

The present invention allows chip scale-packaged integrated circuits (CSPs) that are configured to allow stand-alone deployment in an operating environment to instead be stacked into modules that conserve PWB or other board surface area. The present invention can be used to advantage with CSP packages of a variety of sizes and configurations ranging from typical BGAs with footprints somewhat larger than the contained die to smaller packages such as, for example, die-sized packages such as DSBGA. Although the present invention is applied most frequently to chip scale packages that contain one die, it may be employed with chip scale packages that include more than one integrated circuit die.

In a two-high CSP stack or module devised in accordance with a preferred embodiment of the present invention, two CSPs are stacked, with one CSP disposed above the other. The two CSPs are connected with a pair of flex circuits. Each of the pair of flex circuits is partially wrapped about a respective opposite lateral edge of the lower CSP of the module. The flex circuit pair connects the upper and lower CSPs and provides a thermal and electrical path connection path between the module and an application environment such as a printed wiring board (PWB).

In an alternate preferred embodiment of the present invention, a precursor assembly for use as a component of a stacked circuit module is devised having a CSP and a flex circuit with one or more stiffeners attached to the flex circuit. The stiffeners are disposed along a major surface of the CSP and may be attached to the major surface of the CSP by adhesive. Exemplary stacked circuit modules devised in accordance with a preferred embodiment of the present invention comprise a second CSP disposed above the CSP of the precursor assembly, the second CSP being connected to the upper portions of the flex circuit.

A tooling apparatus devised in accordance with a preferred embodiment of the present invention may be use to assemble precursor assemblies. Preferred embodiments of the tooling apparatus include a physical form used to impose a preselected distance between the edges of the flex circuit, which in various embodiments comprises a flex aligner that limits the lateral placement of the edges of the flex circuit along upper surface of the CSP.

The present invention may be employed to advantage in numerous configurations and combinations of CSPs in modules provided for high-density memories, high capacity computing, and other applications.

The present invention also provides methods for constructing stacked circuit modules and precursor assemblies with flexible circuitry. Using preferred methods of the present invention, a single set of flexible circuitry, whether articulated as one or two flex circuits, may be employed with CSP devices of a variety of configurations.

BRIEF DESCRIPTION OF THE SEVERAL VIEWS OF THE DRAWINGS

FIG. 17 illustrates a JEDEC pinout for DDR-II FBGA packages.

FIG. 18 illustrates the pinout of a module 10 in an alternative preferred embodiment of the invention.

FIG. 19 illustrates the pinout of a module 10 in an alternative embodiment of the invention.

FIG. 47 illustrates another step in devising an assembly in accordance with another preferred embodiment of the present invention.

FIG. 48 depicts another step in devising an assembly in accordance with another preferred embodiment of the present invention.

DETAILED DESCRIPTION OF PREFERRED EMBODIMENTS

Figure 1:
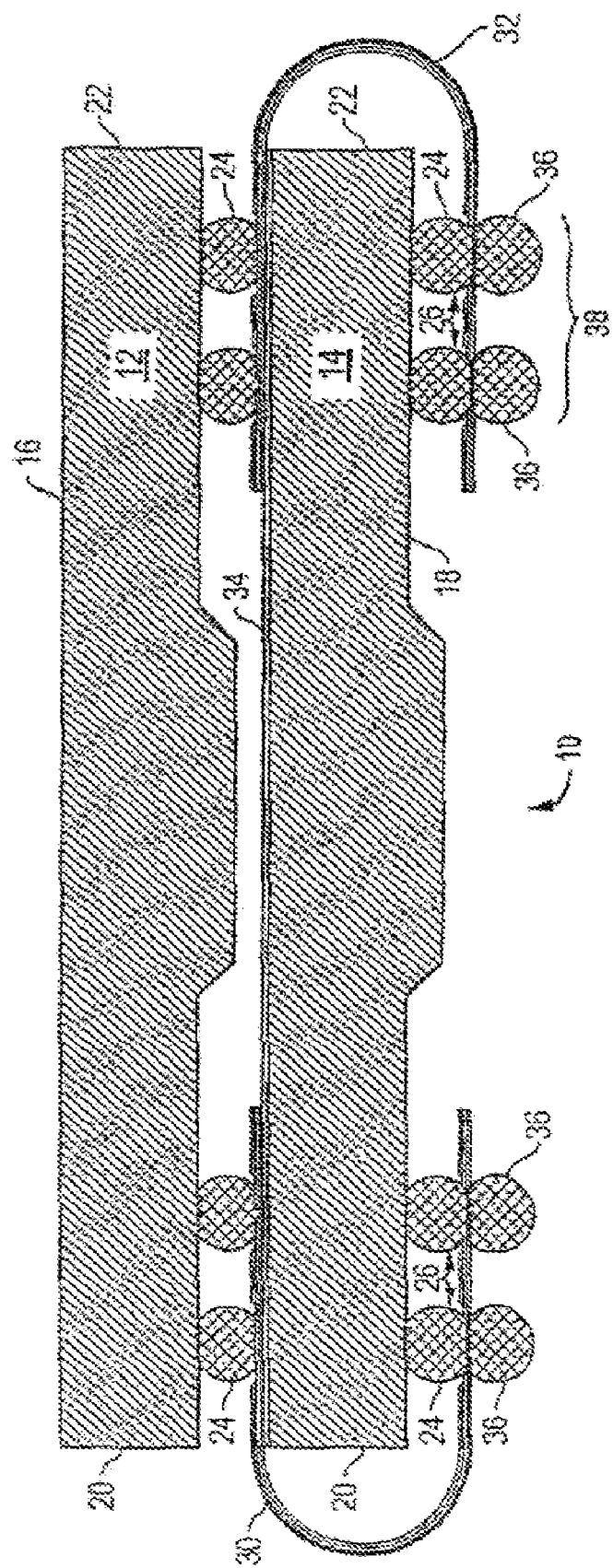
FIG. 1 is an elevation view of module 10 devised in accordance with a preferred embodiment of the present invention.

FIG. 1 is an elevation view of module 10 devised in accordance with a preferred embodiment of the present invention. Module 10 is comprised of upper CSP 12 and lower CSP 14. Each of CSPs 12 and 14 have an upper surface 16 and a lower surface 18 and opposite lateral sides 20 and 22.

Figure 2:
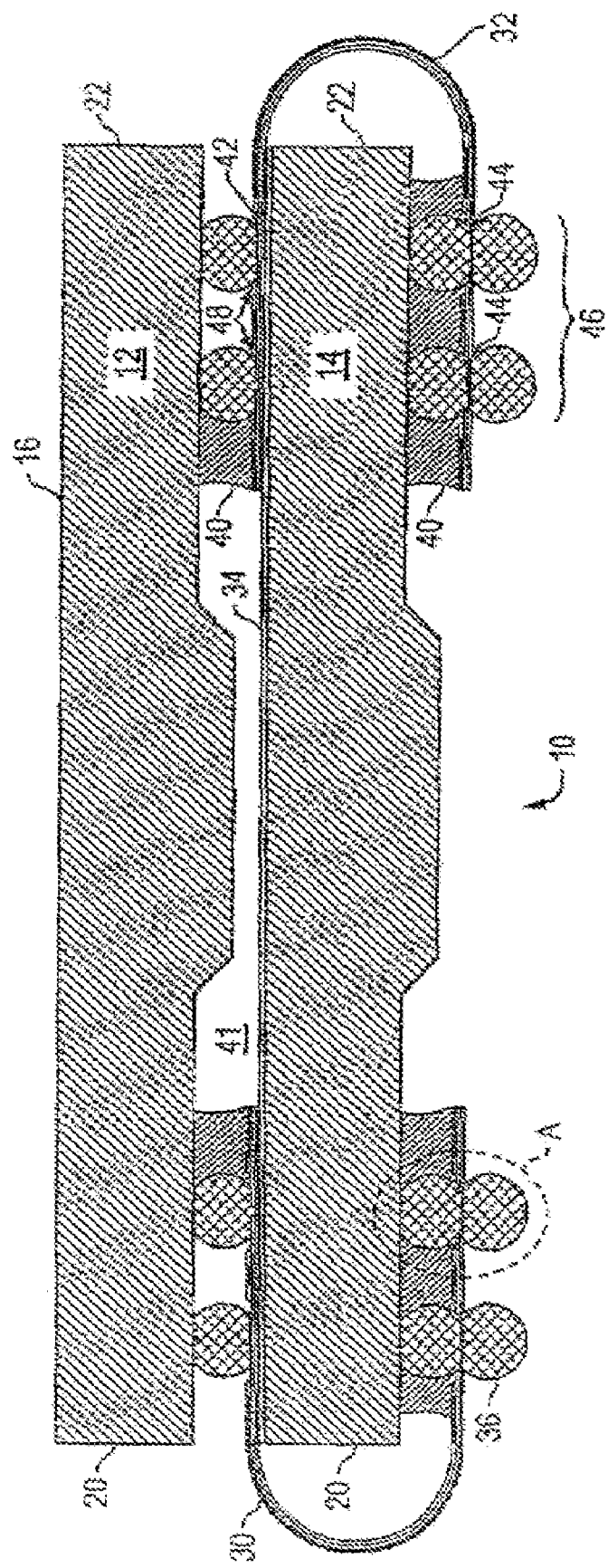
FIG. 2 is an elevation view of module 10 devised in accordance with a preferred embodiment of the present invention.

The invention is used with CSP packages of a variety of types and configurations such as, for example, those that are die-sized, as well those that are near chip-scale as well as the variety of ball grid array packages known in the art. Collectively, these will be known herein as chip scale packaged integrated circuits (CSPs) and preferred embodiments will be described in terms of CSPs, but the particular configurations used in the explanatory figures are not, however, to be construed as limiting. For example, the elevation views of FIGS. 1 and 2 are depicted with CSPs of a particular profile known to those in the art, but it should be understood that the figures are exemplary only. Later figures show embodiments of the invention that employ CSPs of other configurations as an example of one other of the many alternative CSP configurations with which the invention may be employed. The invention may be employed to advantage in the wide range of CSP configurations available in the art where an array of connective elements is available from at least one major surface. The invention is advantageously employed with CSPs that contain memory circuits but may be employed to advantage with logic, computing, and other types of circuits where added capacity without commensurate PWB or other board surface area consumption is desired.

Typical CSPs, such as, for example, ball-grid-array ("BGA"), micro-ball-grid array ("μBGA"), and fine-pitch ball grid array ("FBGA") packages have an array of connective contacts embodied, for example, as leads, bumps, solder balls, or balls that extend from lower surface 18 of a plastic casing in any of several patterns and pitches. An external portion of the connective contacts is often finished with a ball of solder. Shown in FIG. 1 are CSP contacts 24 along lower surfaces 18 of CSPs 12 and 14. CSP contacts 24 provide connection to the integrated circuit within the respective packages. Collectively, CSP contacts 24 comprise CSP array 26 shown as to lower CSP 14 in the depicted particular package configuration as CSP arrays $26_1$ and $26_2$ which collectively comprise CSP array 26.

In FIG. 1, flex circuits ("flex", "flex circuits" or "flexible circuit structures") 30 and 32 are shown partially wrapped about lower CSP 14 with flex 30 partially wrapped over lateral side 20 of lower CSP 14 and flex 32 partially wrapped about lateral side 22 of lower CSP 14. Lateral sides 20 and 22 may be in the character of sides or may, if the CSP is especially thin, be in the character of an edge. Any flexible or conformable substrate with a multiple internal layer connectivity capability may be used as a flex circuit in the invention. The entire flex circuit may be flexible or, as those of skill in the art will recognize, a PCB structure made flexible in certain areas to allow conformability around lower CSP 14 and rigid in other areas for planarity along CSP surfaces may be employed as an alternative flex circuit in the present invention. For example, structures known as rigid-flex may be employed.

Portions of flex circuits 30 and 32 are fixed to upper surface 16 of lower CSP 14 by adhesive 34 which is shown as a tape adhesive, but may be a liquid adhesive or may be placed in discrete locations across the package. Preferably, adhesive 34 is thermally conductive. Adhesives that include a flux are used to advantage in assembly of module 10. Layer 34 may also be a thermally conductive medium to encourage heat flow between the CSPs of module 10.

Flex circuits 30 and 32 are multi-layer flexible circuit structures that have at least two conductive layers. Preferably, the conductive layers are metal such as alloy 110. The use of plural conductive layers provides advantages as will be seen and the creation of a distributed capacitance across module 10 intended to reduce noise or bounce effects that can, particularly at higher frequencies, degrade signal integrity, as those of skill in the art will recognize. Module 10 of FIG. 1 has module contacts 36 collectively identified as module array 38.

FIG. 2 shows a module 10 devised in accordance with a preferred embodiment of the invention. FIG. 2 illustrates use of a conformal media 40 provided in a preferred embodiment to assist in creating conformality of structural areas of module 10. Planarity of the module is improved by conformal media 40. Preferably, conformal media 40 is thermally conductive. In alternative embodiments, thermal spreaders or a thermal medium may be placed as shown by reference 41. Identified in FIG. 2 are upper flex contacts 42 and lower flex contacts 44 that are at one of the conductive layers of flex circuits 30 and 32. Upper flex contacts 42 and lower flex contacts 44 are conductive material and, preferably, are solid metal. Lower flex contacts 44 are collectively lower flex contact array 46. Upper flex contacts 42 are collectively upper flex contact array 48. Only some of upper flex contacts 42 and lower flex contacts 44 are identified in FIG. 2 to preserve clarity of the view. It should be understood that each of flex circuits 30 and 32 have both upper flex contacts 42 and lower flex contacts 44. Lower flex contacts 44 are employed with lower CSP 14 and upper flex contacts 42 are employed with upper CSP 12. FIG. 2 has an area marked "A" that is subsequently shown in enlarged depiction in FIG. 3.

Figure 3:
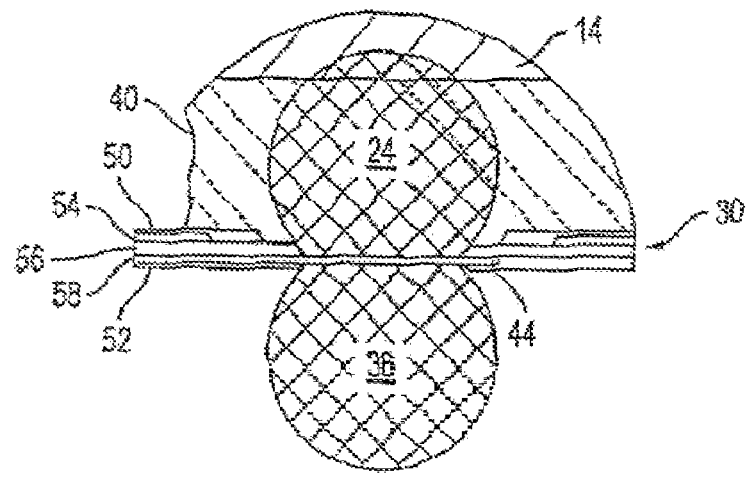
FIG. 3 depicts, in enlarged view, the area marked "A" in FIG. 2.

FIG. 3 depicts in enlarged view, the area marked "A" in FIG. 2. FIG. 3 illustrates the connection between example CSP contact 24 and module contact 36 through lower flex contact 44 to illustrate the solid metal path from lower CSP 14 to module contact 36 and, therefore, to an application PWB to which module is connectable. As those of skill in the art will understand, heat transference from module 10 is thereby encouraged.

With continuing reference to FIG. 3, CSP contact 24 and module contact 36 together offset module 10 from an application platform such as a PWB. The combined heights of CSP contact 24 and module contact 36 provide a moment arm longer than the height of a single CSP contact 24 alone. This provides a longer moment arm through which temperature-gradient-over-time stresses (such as typified by temp cycle), can be distributed.

Flex 30 is shown in FIG. 3 to be comprised of multiple layers. Flex 30 has a first outer surface 50 and a second outer surface 52. Flex circuit 30 has at least two conductive layers interior to first and second outer surfaces 50 and 52. There may be more than two conductive layers in flex 30 and flex 32. In the depicted preferred embodiment, first conductive layer 54 and second conductive layer 58 are interior to first and second outer surfaces 50 and 52. Intermediate layer 56 lies between first conductive layer 54 and second conductive layer 58. There may be more than one intermediate layer, but one intermediate layer of polyimide is preferred.

As depicted in FIG. 3 and seen in more detail in later figures, lower flex contact 44 is preferably comprised from metal at the level of second conductive layer 58 interior to second outer surface 52. Lower flex contact 44 is solid metal in a preferred embodiment and is comprised of metal alloy such as alloy 110. This results in a solid metal pathway from lower CSP 14 to an application board thereby providing a significant thermal pathway for dissipation of heat generated in module 10.

Figure 4:
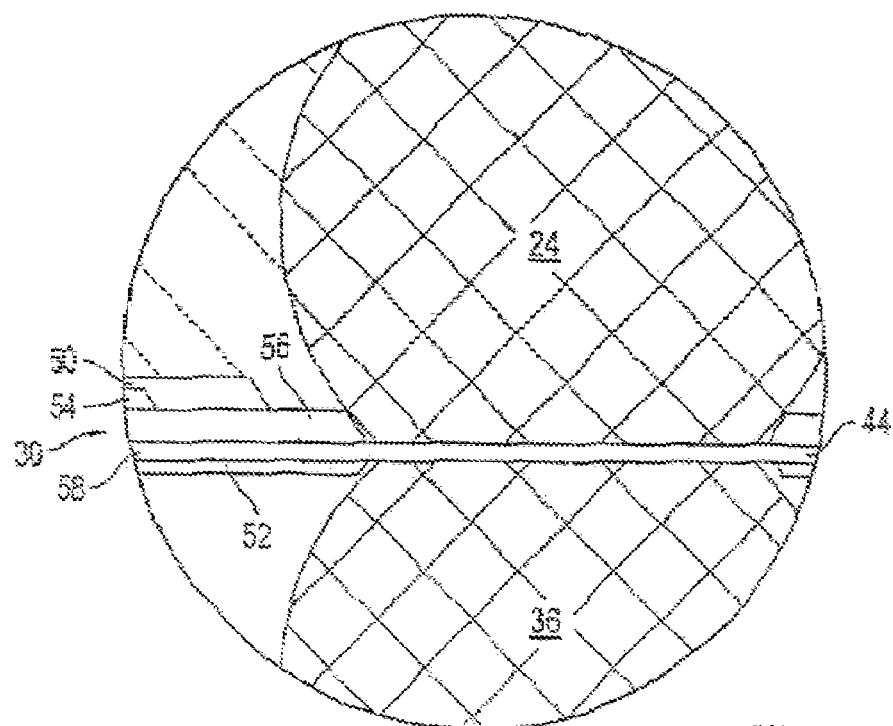
FIG. 4 is an enlarged detail of an exemplar connection in a preferred embodiment of the present invention.

FIG. 4 is an enlarged detail of an exemplar connection between example CSP contact 24 and example module contact 36 through lower flex contact 44 to illustrate the solid metal path from lower CSP 14 to module contact 36 and, therefore, to an application PWB to which module 10 is connectable. As shown in FIG. 4, lower flex contact 44 is at second conductive layer 58 that is interior to first and second outer surface layers 50 and 52 respectively, of flex circuit 30.

Figure 5:
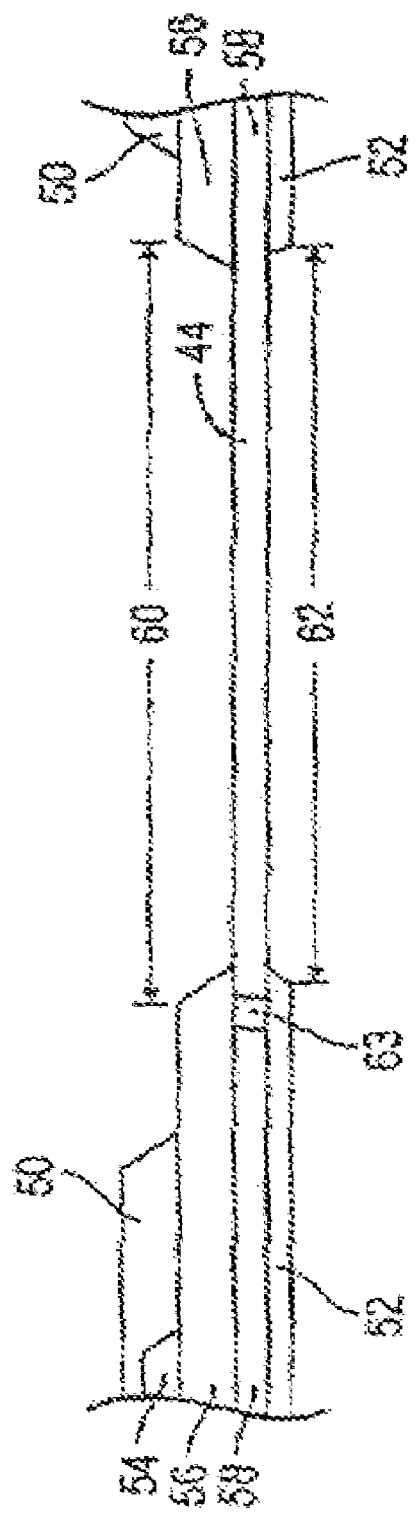
FIG. 5 is an enlarged depiction of an exemplar area around a lower flex contact in a preferred embodiment of the present invention.

FIG. 5 is an enlarged depiction of an exemplar area around a lower flex contact 44 in a preferred embodiment. Windows 60 and 62 are opened in first and second outer surface layers 50 and 52 respectively, to provide access to particular lower flex contacts 44 residing at the level of second conductive layer 58 in the flex. The upper flex contacts 42 are contacted by CSP contacts 24 of upper CSP 12. Lower flex contacts 44 and upper flex contacts 42 are particular areas of conductive material (preferably metal such as alloy 110) at the level of second conductive layer 58 in the flex. Upper flex contacts 42 and lower flex contacts 44 are demarked in second conductive layer 58 and, as will be shown in subsequent Figs., may be connected to or isolated from the conductive plane of second conductive layer 58. Demarking a lower flex contact 44 from second conductive layer 58 is represented in FIG. 5 by demarcation gap 63 shown at second conductive layer 58. Where an upper or lower flex contact 42 or 44 is not completely isolated from second conductive layer 58, demarcation gaps do not extend completely around the flex contact as shown, for example, by lower flex contacts 44C in later FIG. 12. CSP contacts 24 of lower CSP 14 pass through a window 60 opened through first outer surface layer 50, first conductive layer 54, and intermediate layer 56, to contact an appropriate lower flex contact 44. Window 62 is opened through second outer surface layer 52 through which module contacts 36 pass to contact the appropriate lower flex contact 44.

Respective ones of CSP contacts 24 of upper CSP 12 and lower CSP 14 are connected at the second conductive layer 58 level in flex circuits 30 and 32 to interconnect appropriate signal and voltage contacts of the two CSPs. Respective CSP contacts 24 of upper CSP 12 and lower CSP 14 that convey ground (VSS) signals are connected at the first conductive layer 54 level in flex circuits 30 and 32 by vias that pass through intermediate layer 56 to connect the levels as will subsequently be described in further detail. Thereby, CSPs 12 and 14 are connected. Consequently, when flex circuits 30 and 32 are in place about lower CSP 14, respective CSP contacts 24 of each of upper and lower CSPs 12 and 14 are in contact with upper and lower flex contacts 42 and 44, respectively. Selected ones of upper flex contacts 42 and lower flex contacts 44 are connected. Consequently, by being in contact with lower flex contacts 44, module contacts 36 are in contact with both upper and lower CSPs 12 and 14.

In a preferred embodiment, module contacts 36 pass through windows 62 opened in second outer layer 52 to contact lower flex contacts 44. In some embodiments, as will be later shown, module 10 will exhibit a module contact array 38 that has a greater number of contacts than do the constituent CSPs of module 10. In such embodiments, some of module contacts 36 may contact lower flex contacts 44 that do not contact one of the CSP contacts 24 of lower CSP 14 but are connected to CSP contacts 24 of upper CSP 12. This allows module 10 to express a wider datapath than that expressed by the constituent CSPs 12 or 14. A module contact 36 may also be in contact with a lower flex contact 44 to provide a location through which different levels of CSPs in the module may be enabled when no unused CSP contacts are available or convenient for that purpose.

In a preferred embodiment, first conductive layer 54 is employed as a ground plane, while second conductive layer 58 provides the functions of being a signal conduction layer and a voltage conduction layer. Those of skill will note that roles of the first and second conductive layers may be reversed with attendant changes in windowing and use of commensurate interconnections.

As those of skill will recognize, interconnection of respective voltage CSP contacts 24 of upper and lower CSPs 12 and 14 will provide a thermal path between upper and lower CSPs to assist in moderation of thermal gradients through module 10. Such flattening of the thermal gradient curve across module 10 is further encouraged by connection of common ground CSP contacts 24 of upper and lower CSPs 12 and 14 through first conductive layer 54. Those of skill will notice that between first and second conductive layers 54 and 58 there is at least one intermediate layer 56 that, in a preferred embodiment, is a polyimide. Placement of such an intermediate layer between ground-conductive first conductive layer 54 and signal/voltage conductive second conductive layer 58 provides, in the combination, a distributed capacitance that assists in mitigation of ground bounce phenomena to improve high frequency performance of module 10.

Figure 6:
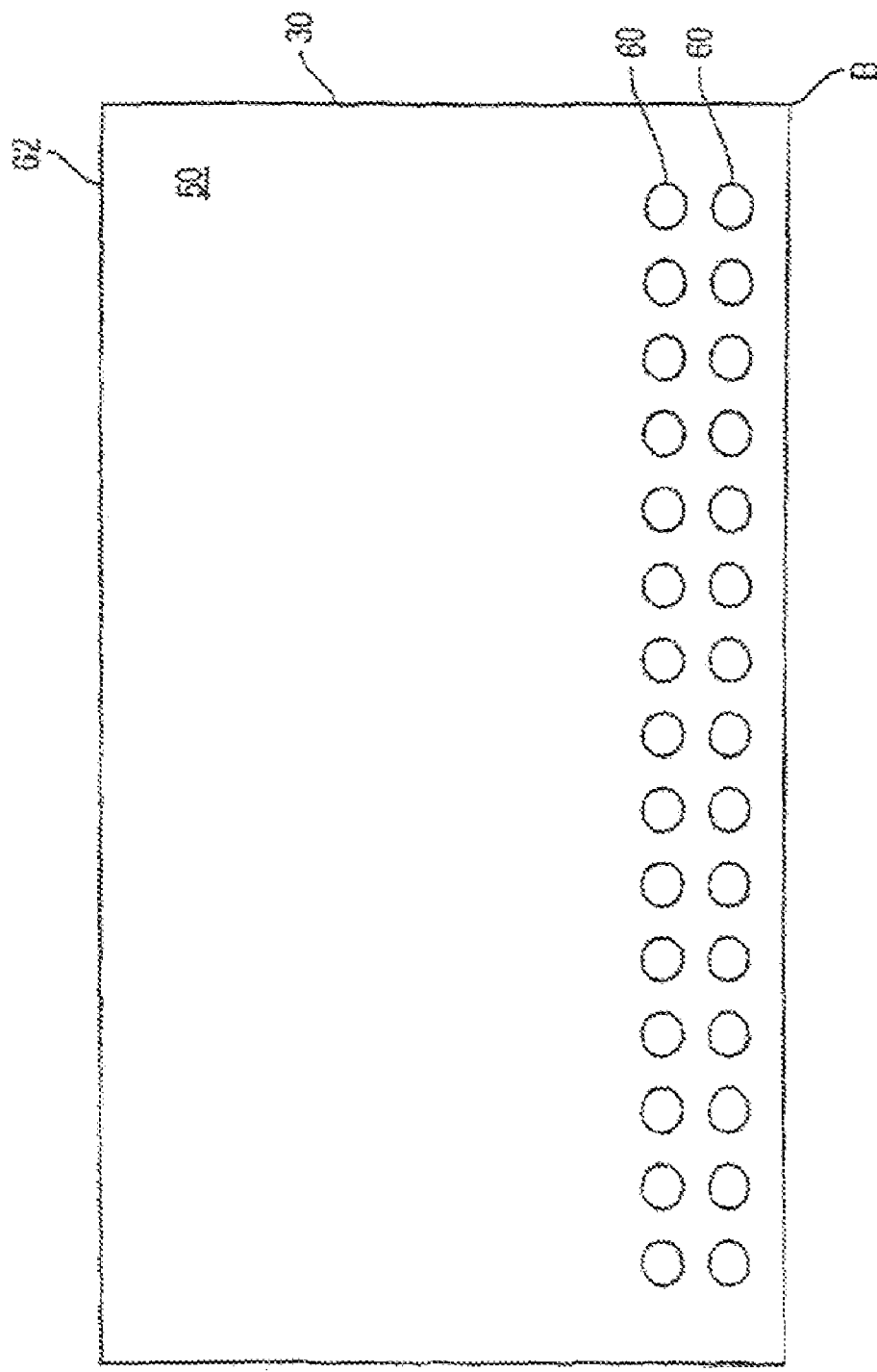
FIG. 6 depicts a first outer surface layer of a flex circuit employed in a preferred embodiment of the present invention.

In a preferred embodiment, FIG. 6 depicts first outer surface layer 50 of flex 30 (i.e., left side of FIG. 1). The view is from above the flex looking down into flex 30 from the perspective of first conductive layer 54. Throughout the Figs., the location reference "B" is to orient views of layers of flex 30 to those of flex 32 as well as across layers. Windows 60 are opened through first outer surface layer 50, first conductive layer 54, and intermediate layer 56. CSP contacts 24 of lower CSP 14 pass through windows 60 of first outer surface layer 50, first conductive layer 54, and intermediate layer 56 to reach the level of second conductive layer 58 of flex 30. At second conductive layer 58, selected CSP contacts 24 of lower CSP 14 make contact with selected lower flex contacts 44. Lower flex contacts 44 provide several types of connection in a preferred embodiment as will be explained with reference to later FIG. 12. When module 10 is assembled, a portion of flex 30 will be wrapped about lateral side 20 of lower CSP 14 to place edge 62 above upper surface 16 of lower CSP 14.

Figure 7:
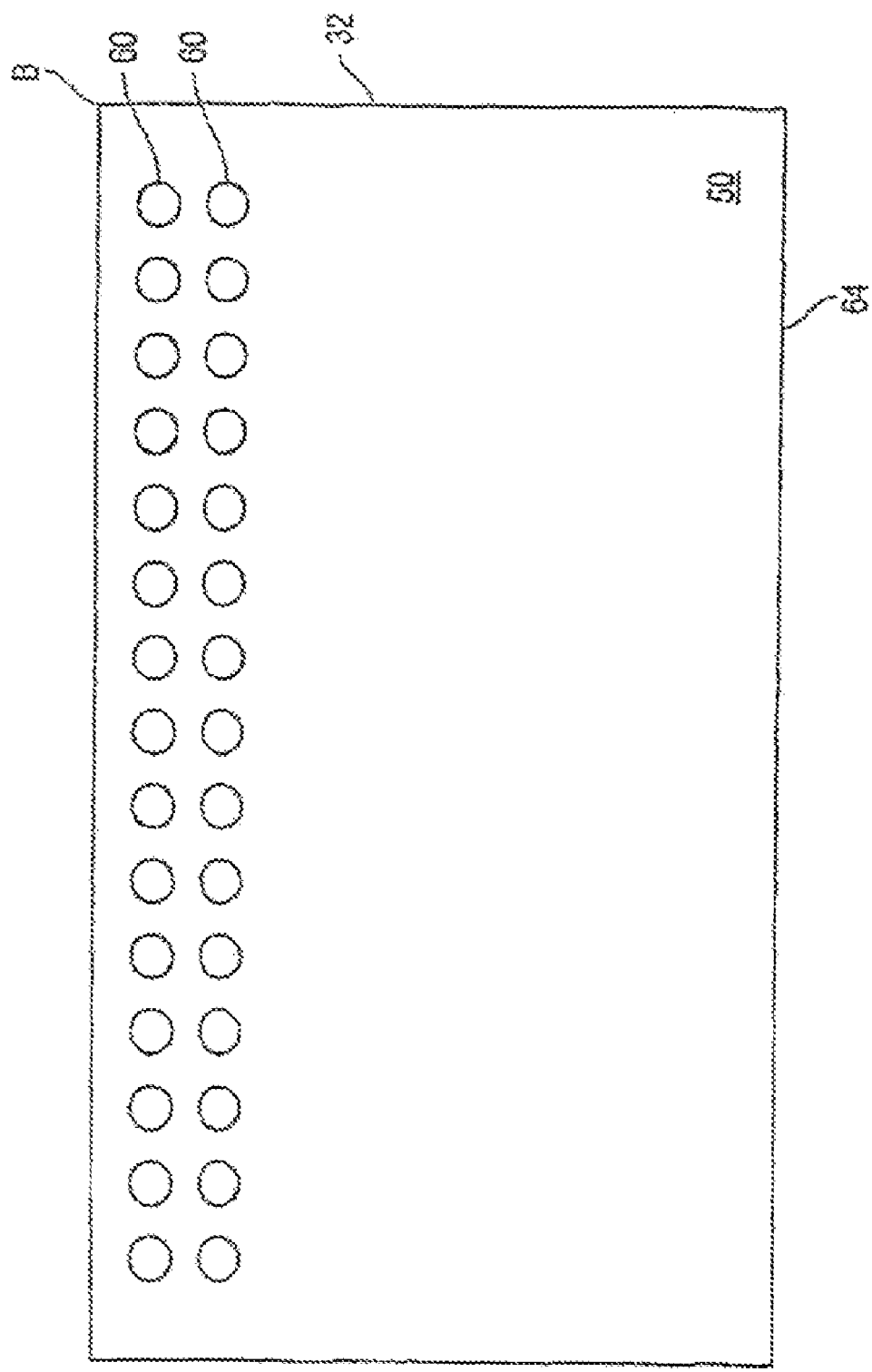
FIG. 7 depicts a first outer surface layer of a flex circuit employed in a preferred embodiment of the present invention.

In a preferred embodiment, FIG. 7 depicts first outer surface layer 50 of flex 32 (i.e., right side of FIG. 1). The view is from above the flex looking down into flex 32 from the perspective of first conductive layer 54. The location reference "B" relatively orients the views of FIGS. 6 and 7. The views of FIGS. 6 and 7 may be understood together with the reference marks "B" of each view being placed nearer each other than to any other corner of the other view of the pair of views of the same layer. As shown in FIG. 7, windows 60 are opened through first outer surface layer 50, first conductive layer 54 and intermediate layer 56. CSP contacts 24 of lower CSP 14 pass through windows 60 of first outer surface layer 50, first conductive layer 54, and intermediate layer 56 to reach the level of second conductive layer 58 of flex 30. At second conductive layer 58, selected CSP contacts 24 of lower CSP 14 make contact with lower flex contacts 44. Lower flex contacts 44 provide several types of connection in a preferred embodiment as will be explained with reference to later FIG. 12. When module 10 is assembled, a portion of flex 32 will be wrapped about lateral side 22 of lower CSP 14 to place edge 64 above upper surface 16 of lower CSP 14.

Figure 8:
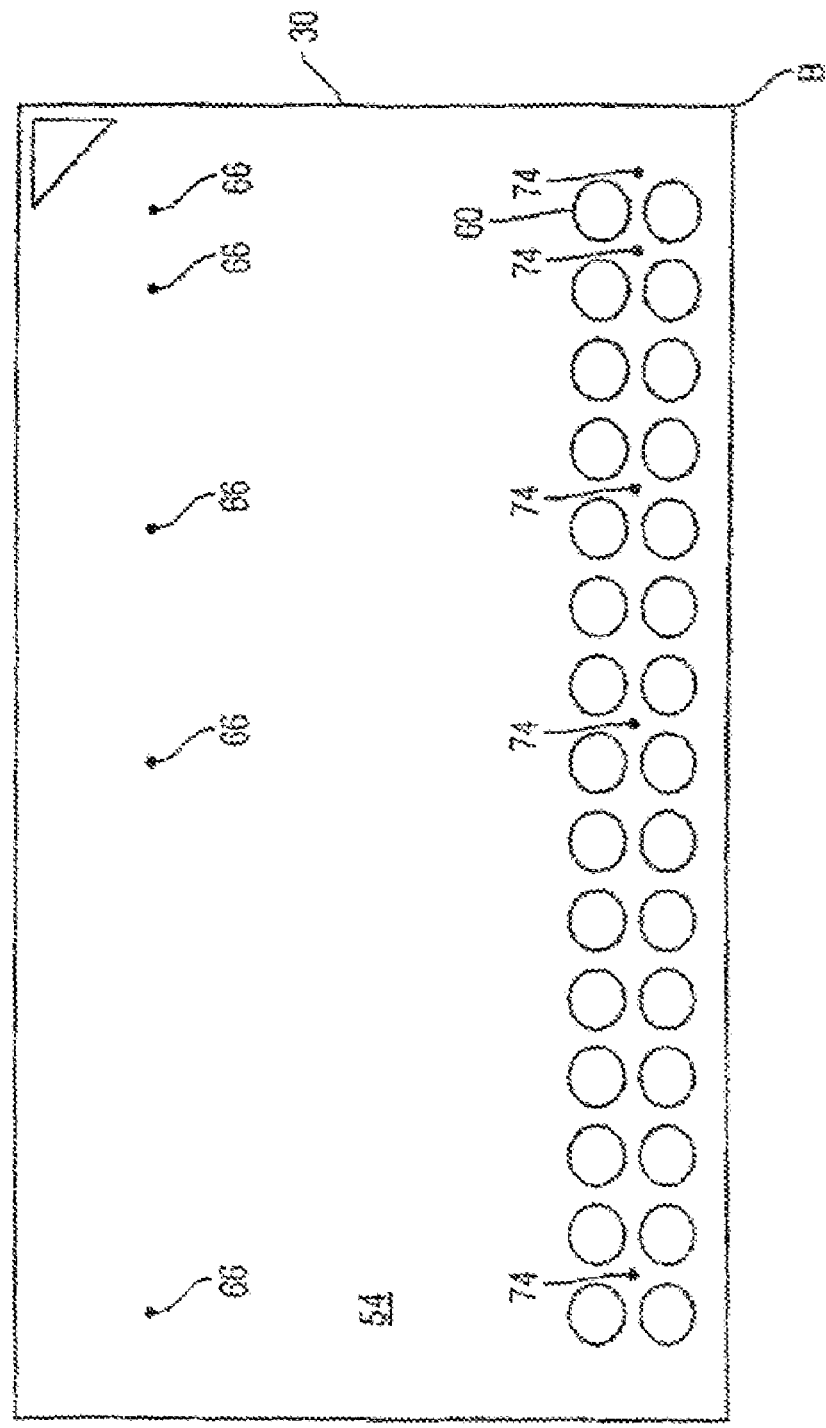
FIG. 8 depicts a first conductive layer of a flex circuit employed in a preferred embodiment of the present invention.

FIG. 8 depicts first conductive layer 54 of flex 30. Windows 60 continue the opened orifice in flex 30 through which CSP contacts 24 of lower CSP 14 pass to reach second conductive layer 58 and, therefore, selected lower flex contacts 44 at the level of second conductive layer 58.

Those of skill will recognize that as flex 30 is partially wrapped about lateral side 20 of lower CSP 14, first conductive layer 54 becomes, on the part of flex 30 disposed above upper surface 16 of lower CSP 14, the lower most conductive layer of flex 30 from the perspective of upper CSP 12. In the depicted embodiment, those CSP contacts 24 of upper CSP 12 that provide ground (VSS) connections are connected to the first conductive layer 54. First conductive layer 54 lies beneath, however, second conductive layer 58 in that part of flex 30 that is wrapped above lower CSP 14. Consequently, some means must be provided for connection of the upper flex contact 42 to which ground-conveying CSP contacts 24 of upper CSP 12 are connected and first conductive layer 54. Consequently, in the depicted preferred embodiment, those upper flex contacts 42 that are in contact with ground-conveying CSP contacts 24 of upper CSP 12 have vias that route through intermediate layer 56 to reach first conductive layer 54. The sites where those vias meet first conductive layer 54 are identified in FIG. 8 as vias 66. These vias may be "on-pad" or coincident with the flex contact 42 to which they are connected. Those of skill will note a match between the vias 66 identified in FIG. 8 and vias 66 identified in the later view of second conductive layer 58 of the depicted preferred embodiment. In a preferred embodiment, vias 66 in coincident locations from Fig. to Fig. are one via. For clarity of the view, depicted vias in the figures are shown larger in diameter than in manufactured embodiments. As those of skill will recognize, the connection between conductive layers provided by vias (on or off pad) may be provided any of several well-known techniques such as plated holes or solid lines or wires and need not literally be vias.

Also shown in FIG. 8 are off-pad vias 74. Off-pad vias 74 are disposed on first conductive layer 54 at locations near, but not coincident with selected ones of windows 60. Unlike vias 66 that connect selected ones of upper flex contacts 42 to first conductive layer 54, off-pad vias 74 connect selected ones of lower flex contacts 44 to first conductive layer 54. In the vicinity of upper flex contacts 42, second conductive layer 58 is between the CSP connected to module 10 by the upper flex contacts 42 (i.e., upper CSP 12) and first conductive layer 54. Consequently, vias between ground-conveying upper flex contacts 42 and first conductive layer 54 may be directly attached to the selected upper flex contacts 42 through which ground signals are conveyed. In contrast, in the vicinity of lower flex contacts 44, first conductive layer 54 is between the CSP connected to module 10 by the lower flex contacts 44 (i.e., lower CSP 14) and second conductive layer 58. Consequently, vias between ground-conveying lower flex contacts 44 and first conductive layer 54 are offset from the selected lower flex contacts 44 by off-pad vias 74 shown in offset locations.

Figure 9:
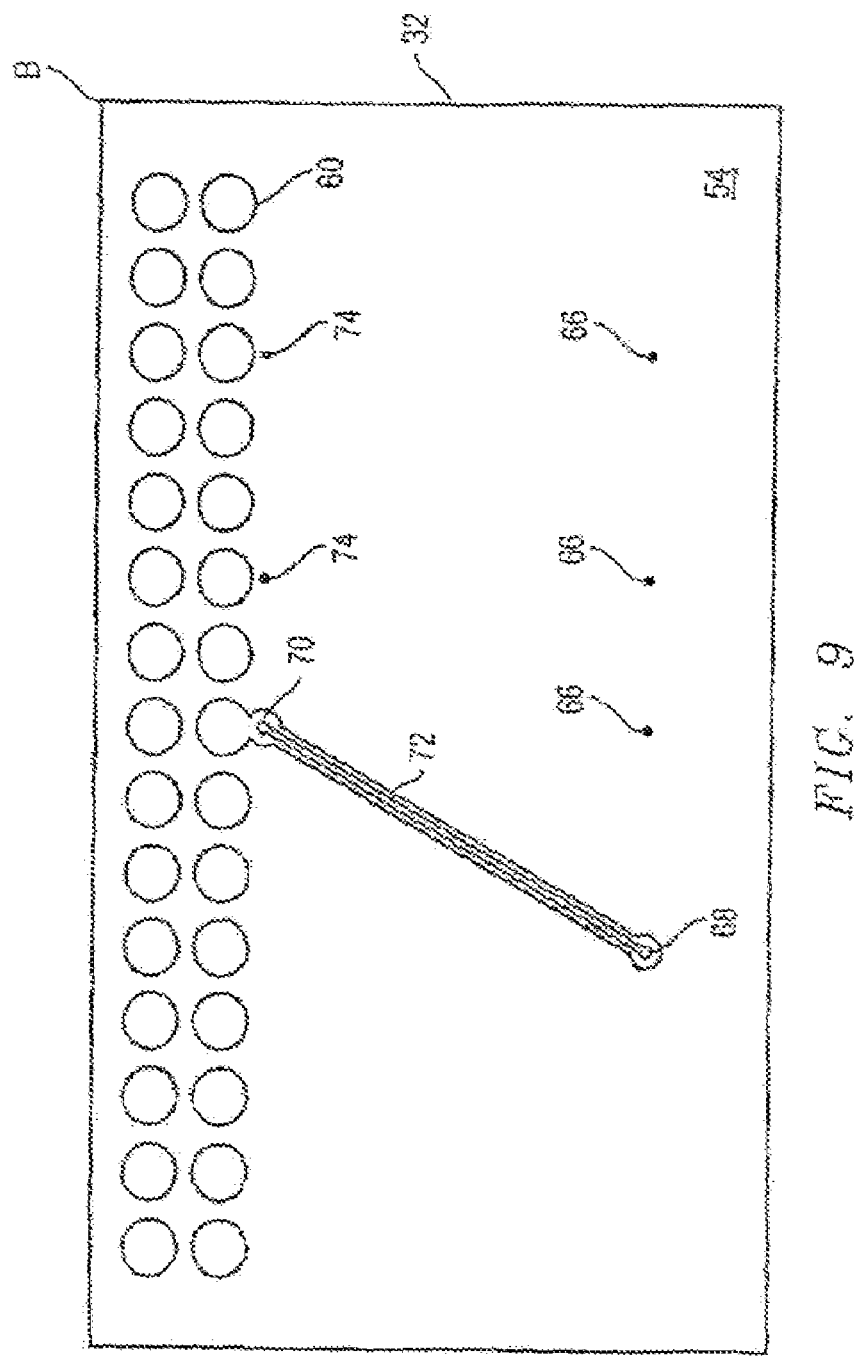
FIG. 9 illustrates a first conductive layer of a flex circuit employed in a preferred embodiment of the present invention.

FIG. 9 illustrates first conductive layer 54 of flex 32. The location reference marks "B" are employed to relatively orient FIGS. 8 and 9. Windows 60, vias 66 and off-pad vias 74 are identified in FIG. 9. Also shown in FIG. 9, are enable vias 68 and 70 and enable trace 72. Enable via 70 is connected off-pad to a selected lower flex contact 44 that corresponds, in this preferred embodiment, to an unused CSP contact 24 of lower CSP 14 (i.e., a N/C). A module contact 36 at that site conveys an enable signal (C/S) for upper CSP 12 through the selected lower flex contact 44 (which is at the level of second conductive layer 58) to off-pad enable via 70 that conveys the enable signal to first conductive layer 54 and thereby to enable trace 72. Enable trace 72 further conveys the enable signal to enable via 68 which extends through intermediate layer 56 to selected upper flex contact 42 at the level of second conductive layer 58 where contact is made with the C/S pin of upper CSP 12. Thus, upper and lower CSPs 12 and 14 may be independently enabled.

Figure 10:
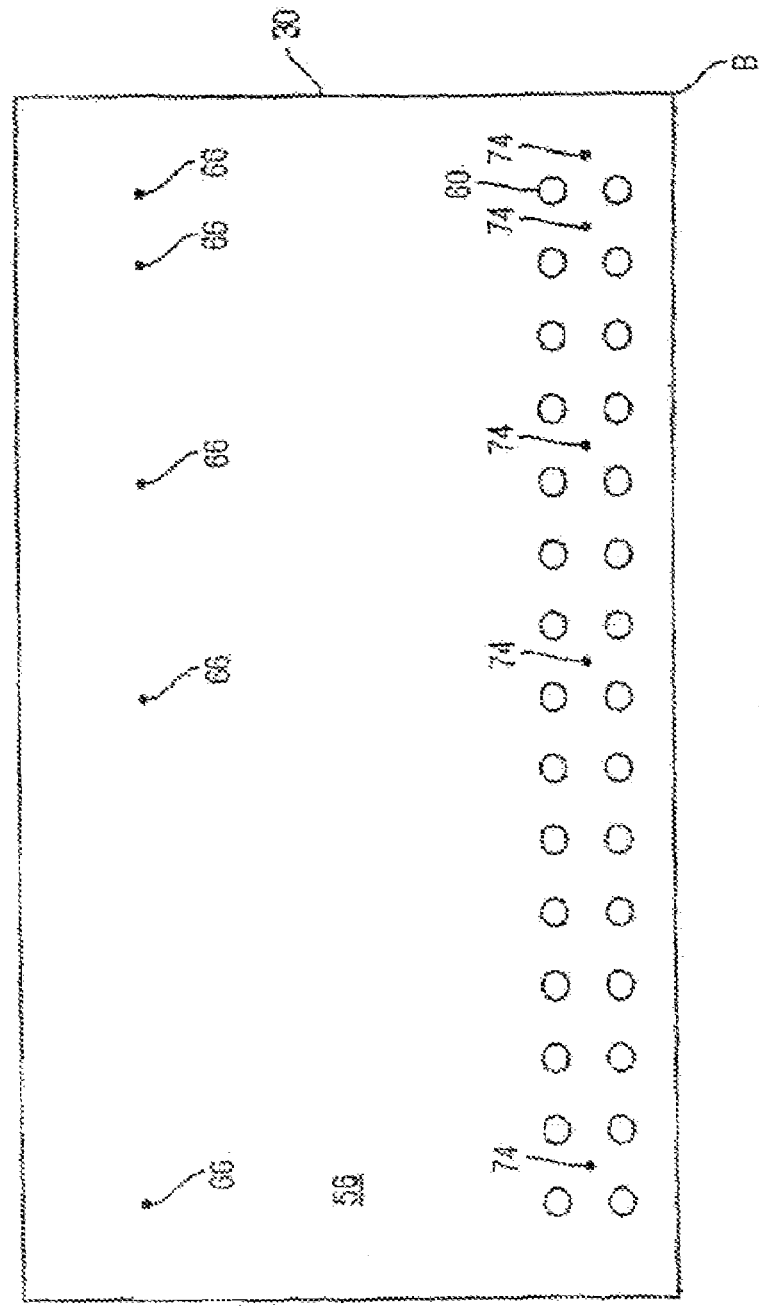
FIG. 10 depicts an intermediate layer of a flex circuit employed in a preferred embodiment of the present invention.
Figure 11:
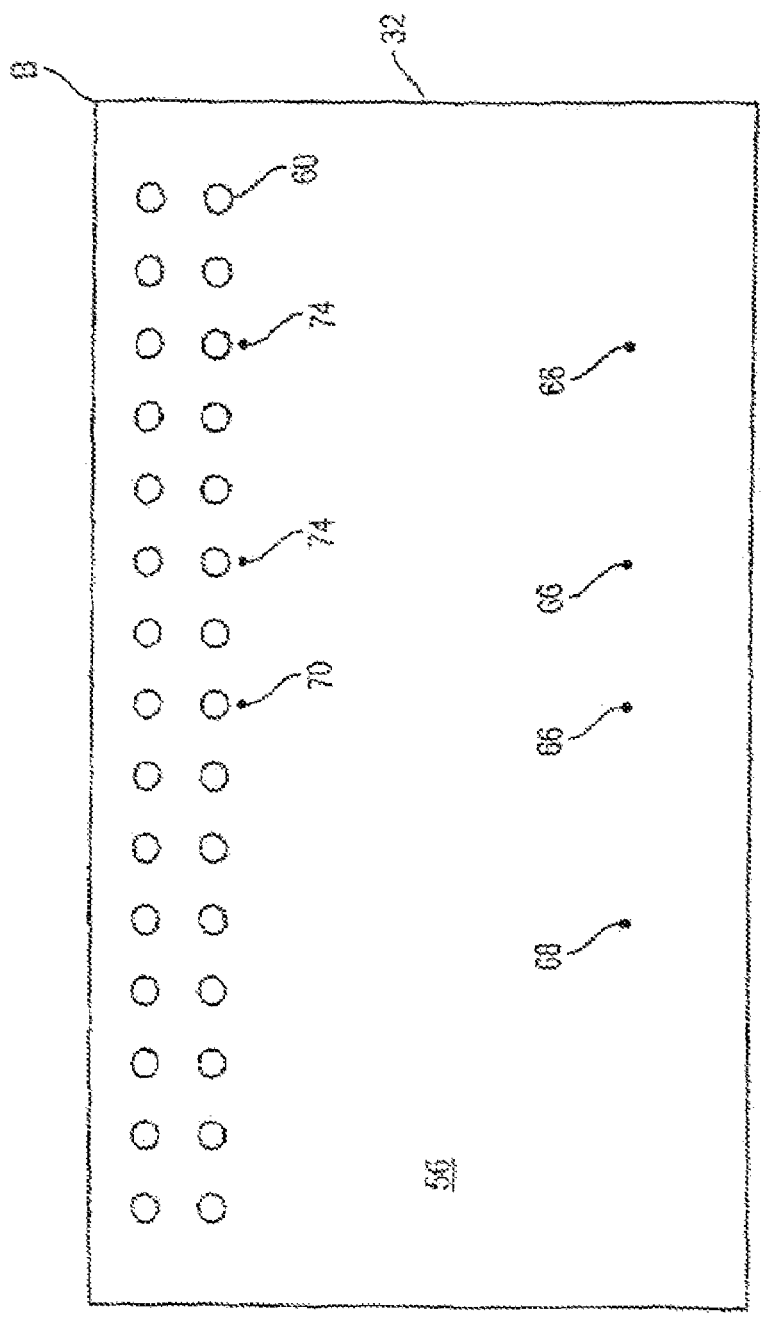
FIG. 11 depicts an intermediate layer of a right side flex circuit employed in a preferred embodiment of the present invention.

FIG. 10 depicts intermediate layer 56 of flex 30. Windows 60 are shown opened in intermediate surface 56. CSP contacts 24 of lower CSP 14 pass through windows 60 in intermediate layer 58 to reach lower flex contacts 44 at the level of second conductive layer 58. Those of skill will notice that, in the depicted preferred embodiment, windows 60 narrow in diameter from their manifestation in first outer layer 50. Vias 66, off-pad vias 74, and enable vias 68 and 70 pass through intermediate layer 56 connecting selected conductive areas at the level of first and second conductive layers 54 and 58, respectively. FIG. 11 depicts intermediate layer 56 of flex 32 showing windows 60, vias 66, off-pad vias 74, and enable vias 68 and 70 passing through intermediate layer 56.

Figure 12:
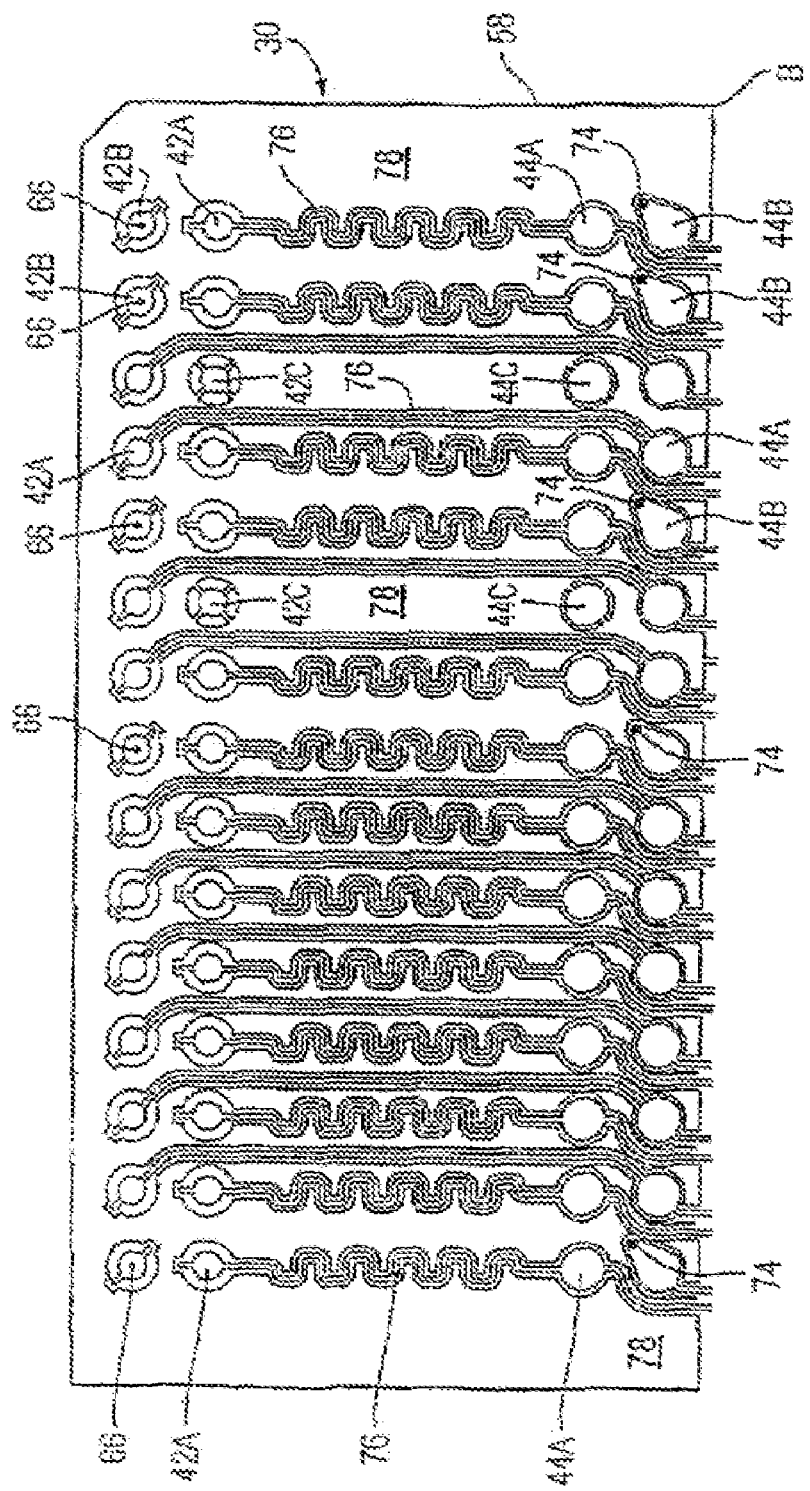
FIG. 12 depicts a second conductive layer of a flex circuit of a preferred embodiment of the present invention.

FIG. 12 depicts second conductive layer 58 of flex 30 of a preferred embodiment of the present invention. Depicted are various types of upper flex contacts 42, various types of lower flex contacts 44, signal traces 76, and VDD plane 78 as well as previously described vias 66 and off-pad vias 74. Throughout FIGS. 12 and 13, only exemplars of particular features are identified to preserve clarity of the view. Flex contacts 44A are connected to corresponding selected upper flex contacts 42A with signal traces 76. To enhance the clarity of the view, only exemplar individual flex contacts 44A and 42A are literally identified in FIG. 12. As shown, in this preferred embodiment, signal traces 76 exhibit path routes determined to provide substantially equal signal lengths between corresponding flex contacts 42A and 44A. As shown, traces 76 are separated from the larger surface area of second conductive layer 58 that is identified as VDD plane 78. VDD plane 78 may be in one or more delineated sections but, preferably is one section. Lower flex contacts 44C provide connection to VDD plane 78. In a preferred embodiment, upper flex contacts 42C and lower flex contacts 44C connect upper CSP 12 and lower CSP 14, respectively, to VDD plane 78. Lower flex contacts 44 that are connected to first conductive layer 54 by off-pad vias 74 are identified as lower flex contacts 44B. To enhance the clarity of the view, only exemplar individual lower flex contacts 44B are literally identified in FIG. 12. Upper flex contacts 42 that are connected to first conductive layer 54 by vias 66 are identified as upper flex contacts 42B.

Figure 13:
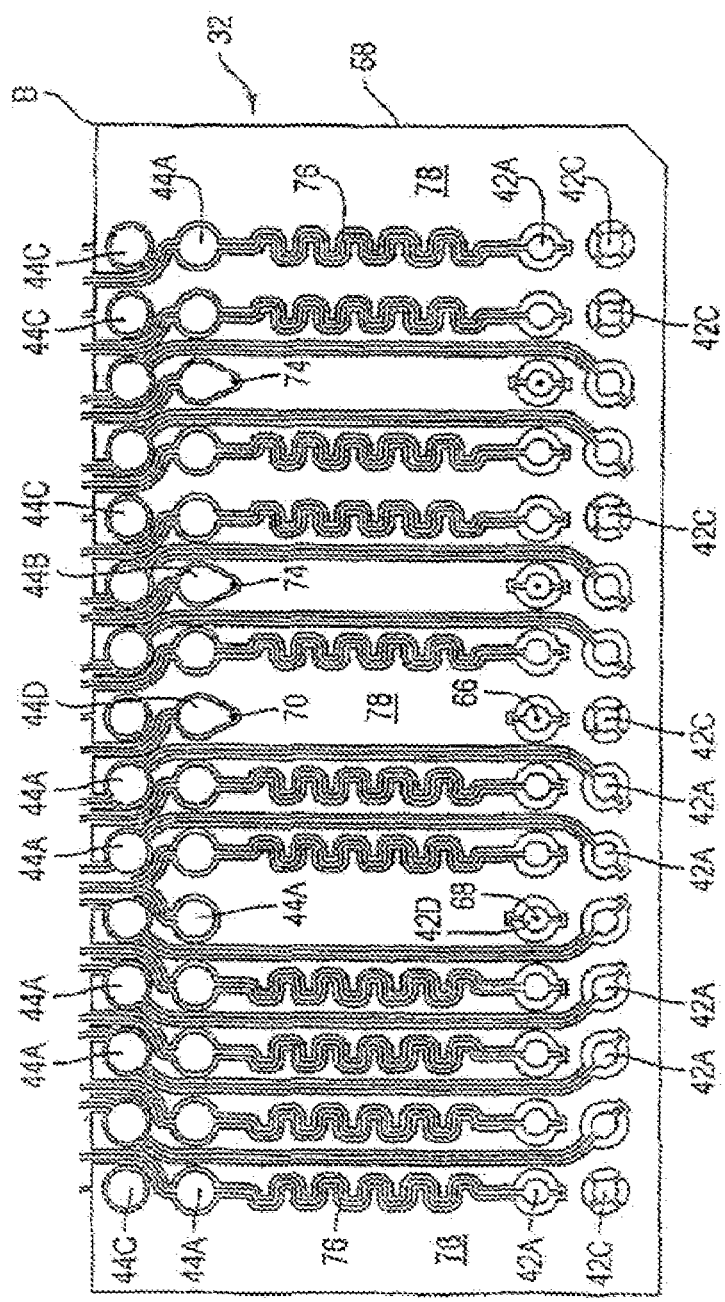
FIG. 13 depicts a second conductive layer of a flex circuit of a preferred embodiment of the present invention.

FIG. 13 depicts second conductive layer 58 of right side flex 32 of a preferred embodiment of the present invention. Depicted are various types of upper flex contacts 42, various types of lower flex contacts 44, signal traces 76, and VDD plane 78 as well as previously described vias 66, off-pad vias 74, and enable vias 70 and 68. FIG. 13 illustrates upper flex contacts 42A connected by traces 76 to lower flex contacts 44A. VDD plane 78 provides a voltage plane at the level of second conductive layer 58. Lower flex contacts 44C and upper flex contacts 42C connect lower CSP 14 and upper CSP 12, respectively, to VDD plane 78. Lower flex contact 44D is shown with enable via 70 described earlier. Corresponding upper flex contact 42D is connected to lower flex contact 44D through enable vias 70 and 68 that are connected to each other through earlier described enable trace 72 at the first conductive layer 54 level of flex 32.

Figure 14:
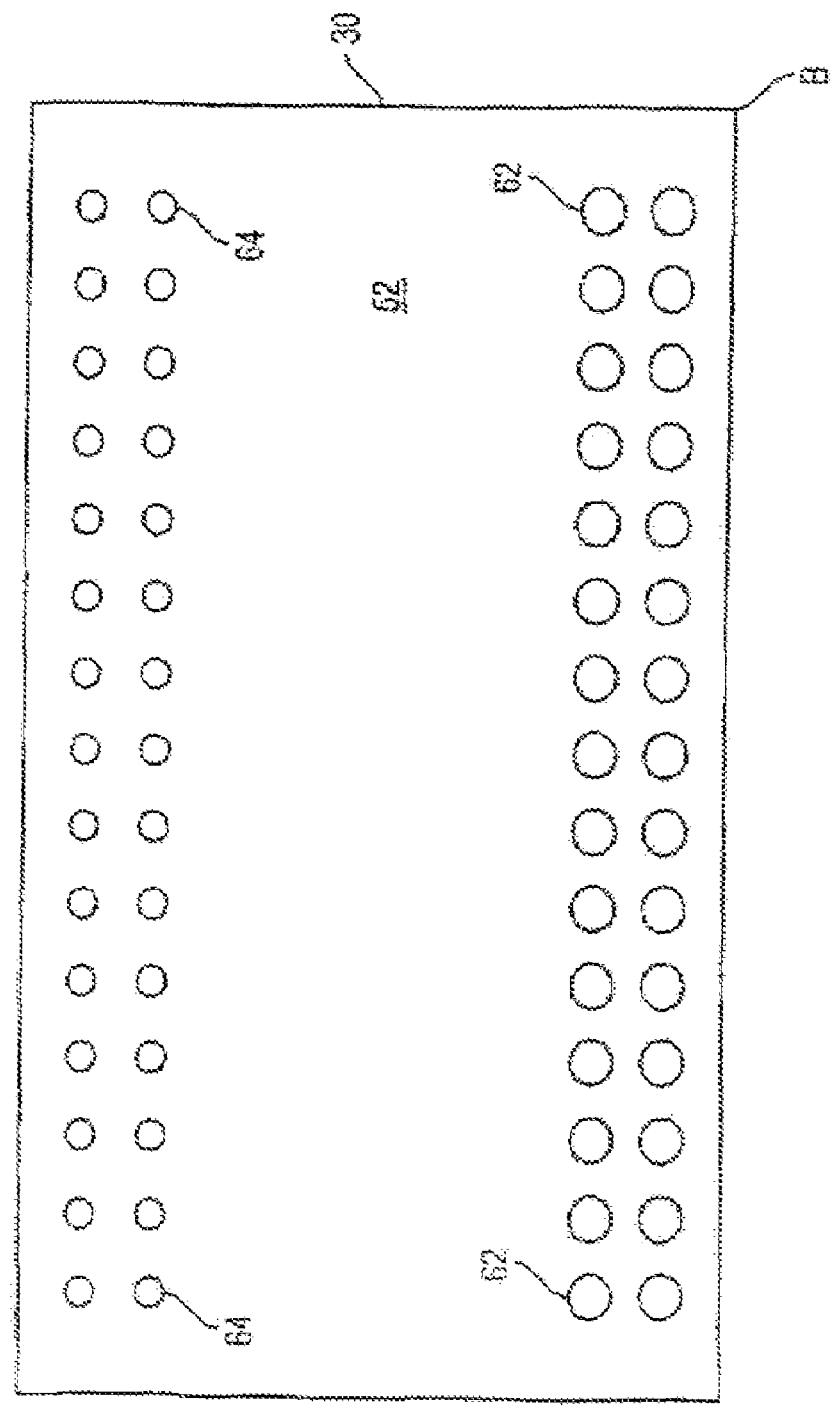
FIG. 14 depicts a second outer layer of a flex circuit employed in a preferred embodiment of the present invention.
Figure 15:
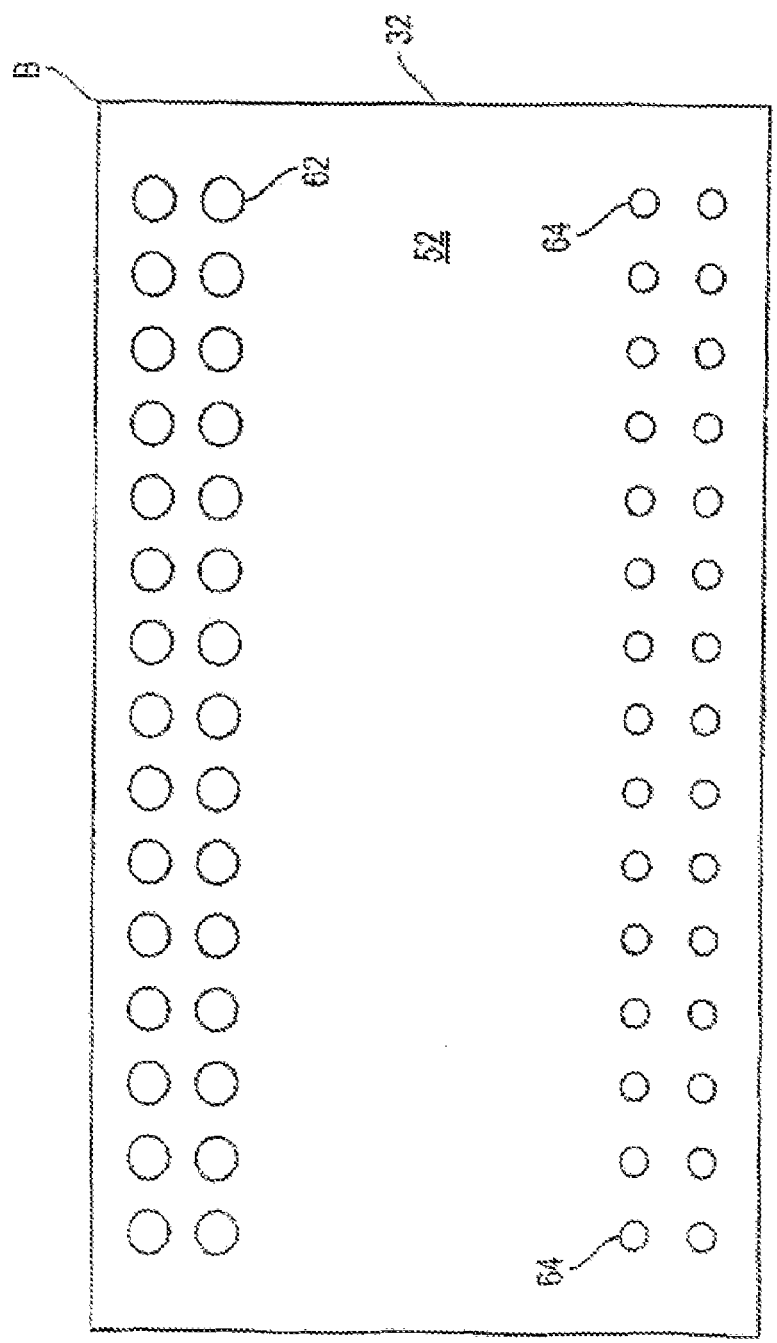
FIG. 15 reflects a second outer layer of a flex circuit employed in a preferred embodiment of the present invention.

FIG. 14 depicts second outer layer 52 of flex 30. Windows 62 are identified. Those of skill will recognize that module contacts 36 pass through windows 62 to contact appropriate lower flex contacts 44. When flex 30 is partially wrapped about lateral side 20 of lower CSP 14, a portion of second outer layer 52 becomes the upper-most layer of flex 30 from the perspective of upper CSP 12. CSP contacts 24 of upper CSP 12 pass through windows 64 to reach second conductive layer 58 and make contact with appropriate ones of upper flex contacts 42 located at that level. FIG. 15 reflects second outer layer 52 of flex 32 and exhibits windows 64 and 62. Module contacts 36 pass through windows 62 to contact appropriate lower flex contacts 44. CSP contacts 24 of upper CSP 12 pass through windows 64 to reach second conductive layer 58 and make contact with appropriate ones of upper flex contacts 42 located at that level.

Figure 16:
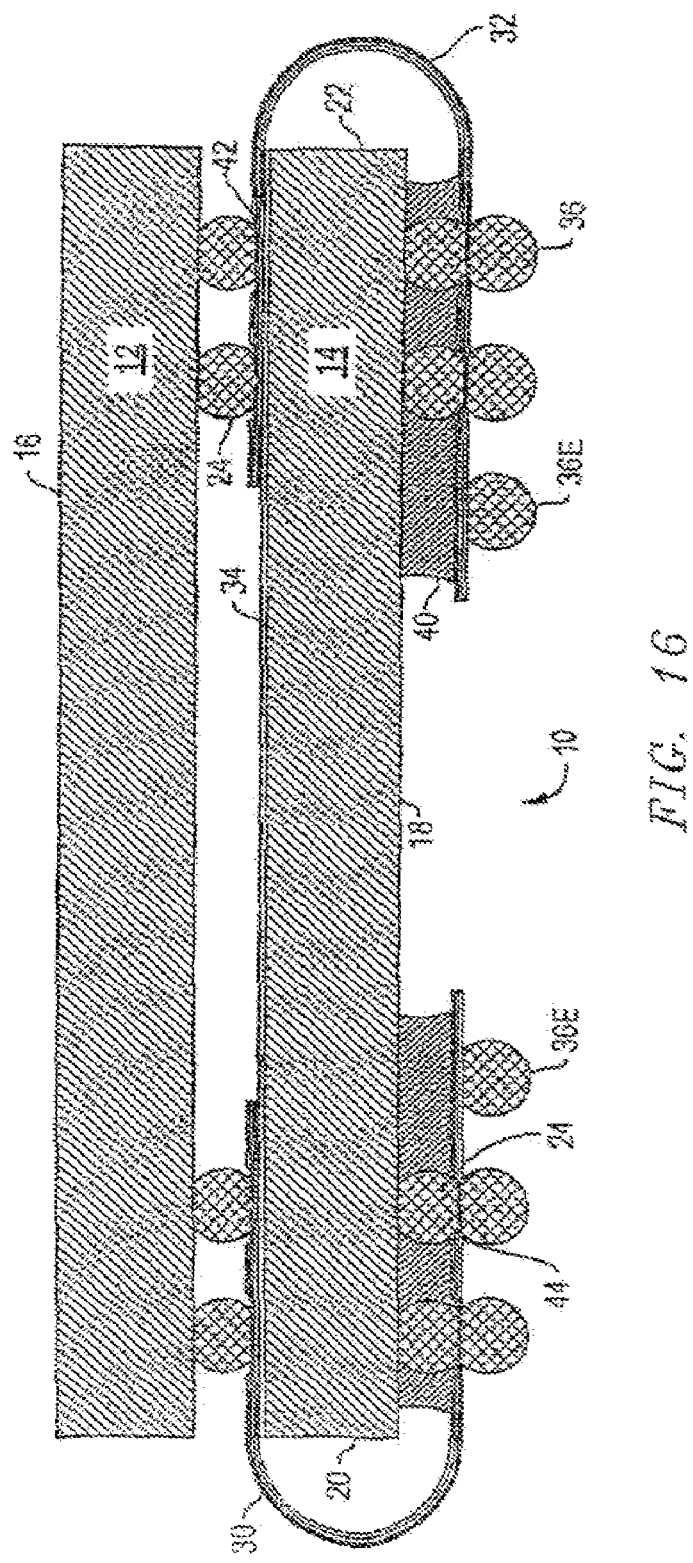
FIG. 16 depicts an alternative preferred embodiment of the present invention.

FIG. 16 depicts an alternative preferred embodiment of the present invention showing module 10. Those of skill will recognize that the embodiment depicted in FIG. 16 differs from that in FIG. 2 by the presence of module contacts 36E. Module contacts 36E supply a part of the datapath of module 10 and may provide a facility for differential enablement of the constituent CSPs. A module contact 36E not employed in wide datapath provision may provide a contact point to supply an enable signal to differentially enable upper CSP 12 or lower CSP 14.

In a wide datapath module 10, the data paths of the constituent upper CSP 12 and lower CSP 14 are combined to provide a module 10 that expresses a module datapath that is twice the width of the datapaths of the constituent CSPs in a two-high module 10. The preferred method of combination is concatenation, but other combinations may be employed to combine the datapaths of CSPs 12 and 14 on the array of module contacts 36 and 36E.

As an example, FIGS. 17, 18, and 19 are provided to illustrate using added module contacts 36E in alternative embodiments of the present invention to provide wider datapaths for module 10 than are present in constituent CSPs 12 and 14. FIG. 17 illustrates a JEDEC pinout for DDR-II FBGA packages. FIG. 18 illustrates the pinout provided by module contacts 36 and 36E of a module 10 expressing an 8-bit wide datapath. Module 10 is devised in accordance with the present invention and is, in the exemplar embodiment, comprised of an upper CSP 12 and lower CSP 14 that are DDR-II-compliant in timing, but each of which are only 4 bits wide in datapath. As will be recognized, the module 10 mapped in FIG. 18 expresses an 8-bit wide datapath. For example, FIG. 18 depicts DQ pins differentiated in source between upper CSP 12 ("top") and lower CSP 14 ("bot") to aggregate to 8-bits. FIG. 19 illustrates the pinout provided by module contacts 36 and 36E of module 10 expressing a 16-bit wide datapath. Module 10 is devised in accordance with the present invention and is, in this exemplar embodiment, comprised of an upper CSP 12 and lower CSP 14 that are DDR-II-compliant in timing, but each of which are only 8-bits wide in datapath. Those of skill in the art will recognize that the wide datapath embodiment may be employed with any of a variety of CSPs available in the field and such CSPs need not be DDR compliant.

Figure 20:
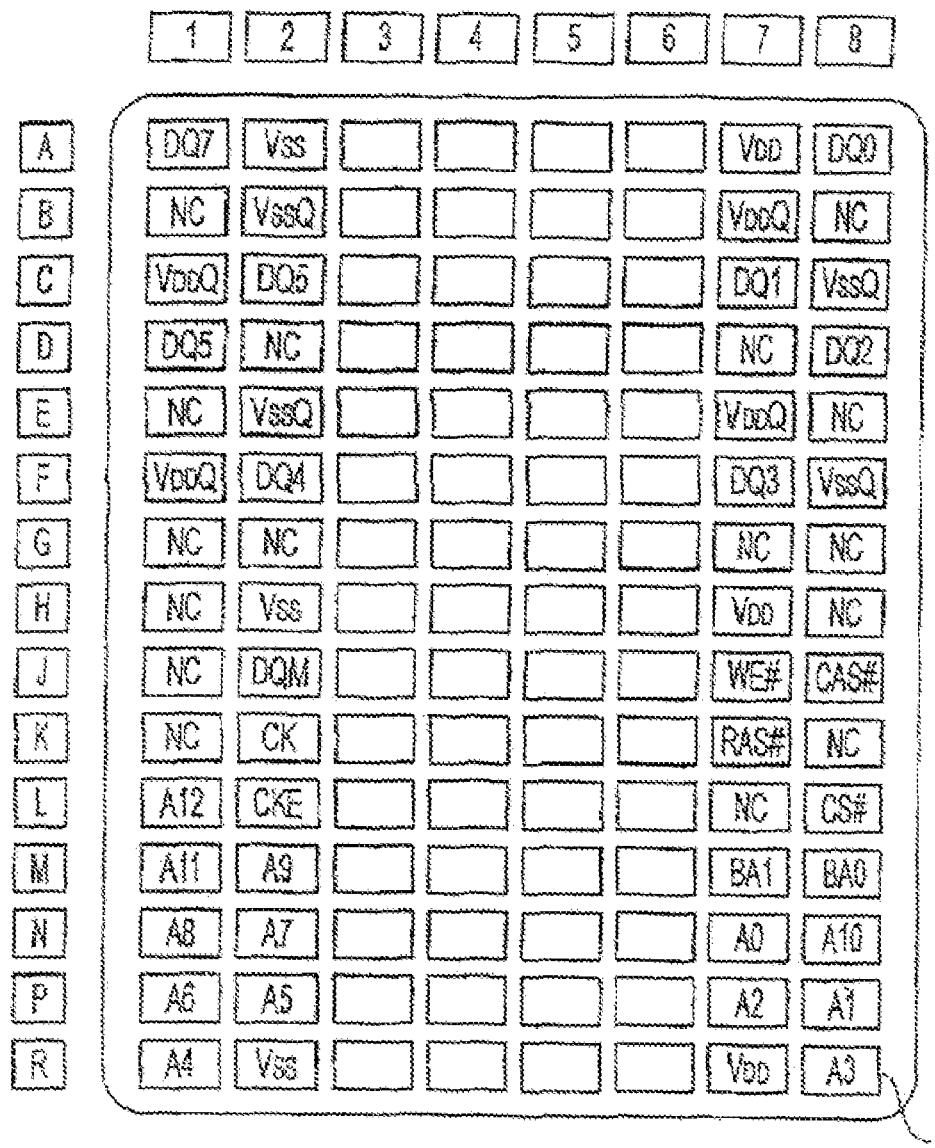
FIG. 20 depicts the pinout of an exemplar CSP employed in a preferred embodiment of the invention.
Figure 21:
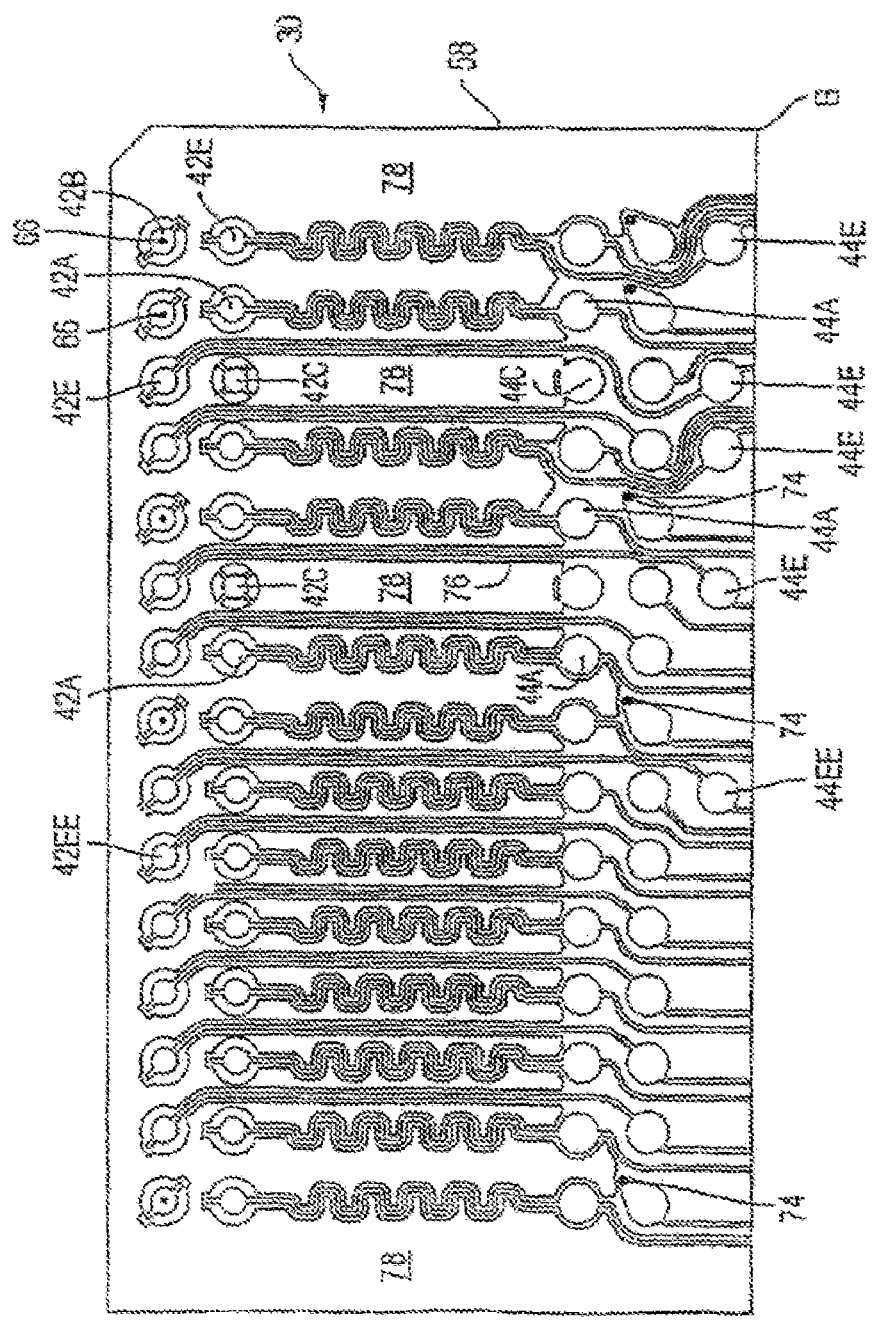
FIG. 21 depicts a second conductive layer of a flex circuit employed in an alternative preferred embodiment of the present invention.

FIG. 20 illustrates a typical pinout of a memory circuit provided as a CSP and useable in the present invention. Individual array positions are identified by the JEDEC convention of numbered columns and alphabetic rows. The central area (e.g., A3-A6; B3-B6; etc.) is unpopulated. CSP contacts 24 are present at the locations that are identified by alpha-numeric identifiers such as, for example, A3, shown as an example CSP contact 24. FIG. 21 depicts second metal layer 58 of flex 30 in an alternative embodiment of the invention in which module 10 expresses a datapath wider than that expressed by either of the constituent CSPs 12 and 14. Lower flex contacts 44E are not contacted by CSP contacts 24 of lower CSP 14, but are contacted by module contacts 36E to provide, with selected module contacts 36, a datapath for module 10 that is 2n-bits in width where the datapaths of CSPs 12 and 14 have a width of n-bits. As shown in FIG. 21, lower flex contacts 44E are connected to upper flex contacts 42E. As shown in earlier FIG. 14, windows 62 pass through second outer layer 52. In the alternative preferred embodiment for which second conductive layer 58 is shown in FIG. 21, module contacts 36 and 36E pass through windows 62 in second outer layer 52 of flex circuit 30, to contact appropriate lower flex contacts 44.

Figure 22:
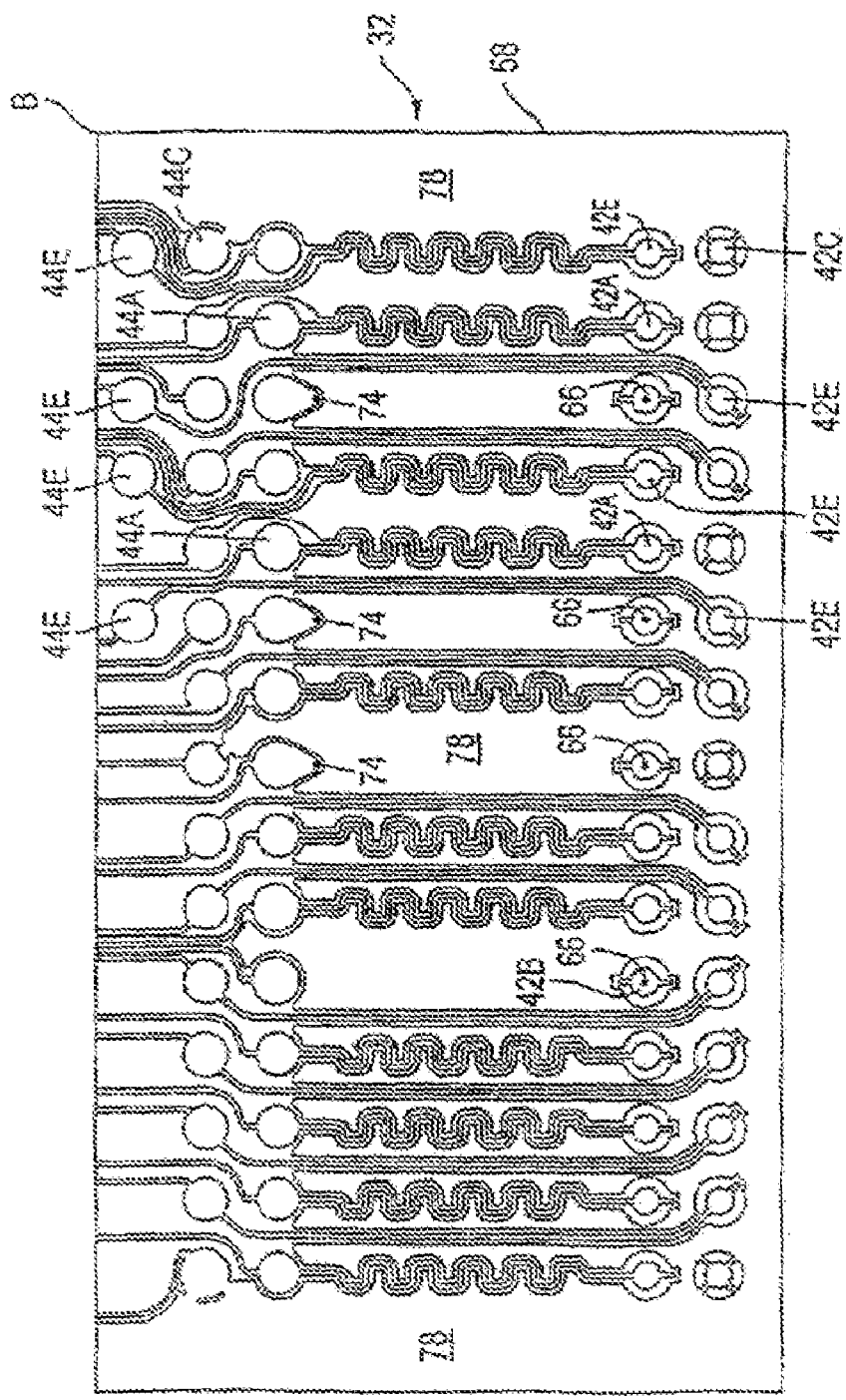
FIG. 22 depicts a second conductive layer of a flex circuit employed in an alternative preferred embodiment of the present invention.

FIG. 22 illustrates second metal layer 58 of flex 32 in an alternative embodiment of the invention in which module 10 expresses a datapath wider than that expressed by either of the constituent CSPs 12 and 14. Lower flex contacts 44E are not contacted by CSP contacts 24 of lower CSP 14, but are contacted by module contacts 36E to provide, with selected module contacts 36, a datapath for module 10 that is 2n-bits in width where the datapaths of CSPs 12 and 14 have a width of n-bits. As shown in FIG. 22, lower flex contacts 44E are connected to upper flex contacts 42E. As shown in earlier FIG. 14, windows 62 pass through second outer layer 52. In the alternative preferred embodiment for which second conductive layer 58 is shown in FIG. 22, module contacts 36 pass through windows 62 in second outer layer 52 of flex circuit 32, to contact appropriate lower flex contacts 44.

In particular, in the embodiment depicted in FIGS. 21 and 22, module contacts 36E contact flex contacts 44E and 44EE. Those of skill will recognize that lower flex contacts 44E are, in the depicted embodiment, eight (8) in number and that there is another lower flex contacts identified by reference 44EE shown on FIG. 21. Lower flex contact 44EE is contacted by one of the module contacts 36E to provide differential enablement between upper and lower CSPs. Those of skill will recognize that lower flex contacts 44E are connected to corresponding upper flex contacts 42E. CSP contacts 24 of upper CSP 12 that convey data are in contact with upper flex contacts 42E. Consequently, the datapaths of both upper CSP 12 and lower CSP 14 are combined to provide a wide datapath on module 10. With the depicted connections of FIGS. 21 and 22, lower flex contacts 44E of flex circuits 30 and 32 convey to module contacts 36E, the datapath of upper CSP 12, while other lower flex contacts 44 convey the datapath of lower CSP 14 to module contacts 36 to provide module 10 with a module datapath that is the combination of the datapath of upper CSP 12 and lower CSP 14. In the depicted particular embodiment of FIGS. 21 and 22, module 10 expresses a 16-bit datapath and CSP 12 and CSP 14 each express an 8-bit datapath.

Figure 23:
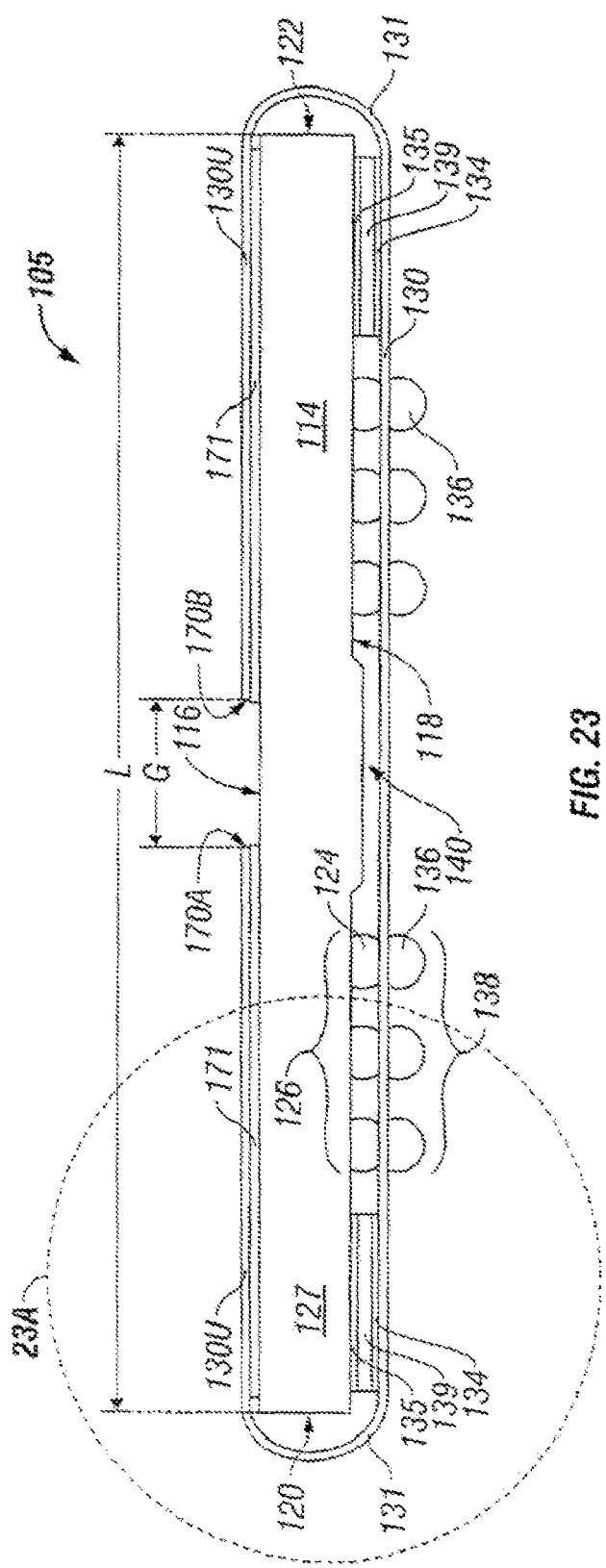
FIG. 23 is an elevation view of a precursor assembly devised in accordance with a preferred embodiment of the present invention comprising stiffeners.

FIGS. 23-33 depict aspects of alternative preferred embodiments of a precursor assembly for use as a component of a stacked circuit module. FIGS. 23-33 depict aspects of stiffeners comprised in exemplary precursor assemblies and additional aspects of other components used in manufacturing such precursor assemblies. FIG. 23 is an elevation view of an end of precursor assembly 105 comprising CSP 114 having an upper surface 116, a lower surface 118, and opposite lateral sides 120 and 122. Upon assembly of a stacked circuit module 110 using precursor assembly 105 of this embodiment, CSP 114 will become a lower CSP of a stacked circuit module 110.

Among the various CSPs that are useful for CSP 114 are the types that include at least one integrated circuit or semiconductor chip surrounded by a package body 127 with a lateral extent L defined by the opposite lateral edges or sides 120 and 122. The package body surrounding the integrated circuit(s) or semiconductor chip(s) need not be plastic, but a large majority of package bodies in CSP technologies are plastic. The package body need not surround the integrated circuit(s) or semiconductor chip(s) completely, leaving one or more sides, edges, surfaces, or other regions of the integrated circuit(s) or semiconductor chip(s) exposed, but a large majority of package bodies in CSP technologies completely encase the integrated circuit(s) or semiconductor chip(s) or leave only the terminals on integrated circuit or semiconductor chip active face(s) exposed. The invention may also be used with those CSP-like packages that exhibit bare die connectives on one major surface.

Those of skill will realize that various embodiments of the present invention may be devised to create modules and precursor assemblies with different size CSPs and that the constituent CSPs may be of different types within the same stacked circuit module 110. The disclosed structures and methods allow a single set of flex circuitry, whether comprised of one or two flex circuits, to be employed with a variety of package body sizes of CSPs. For example, one of the constituent CSPs of an example stacked circuit module 110 may be a typical CSP having lateral edges 120 and 122 that have an appreciable height to present a "side" while other constituent CSPs of the same stacked circuit module 110 may be devised in packages that have lateral edges 120 and 122 that are more in the character of an edge rather than a side having appreciable height. All devices such as those discussed above and similar devices are included within the meaning of the term CSP, which term should be broadly considered in the context of this application.

Figure 23A:
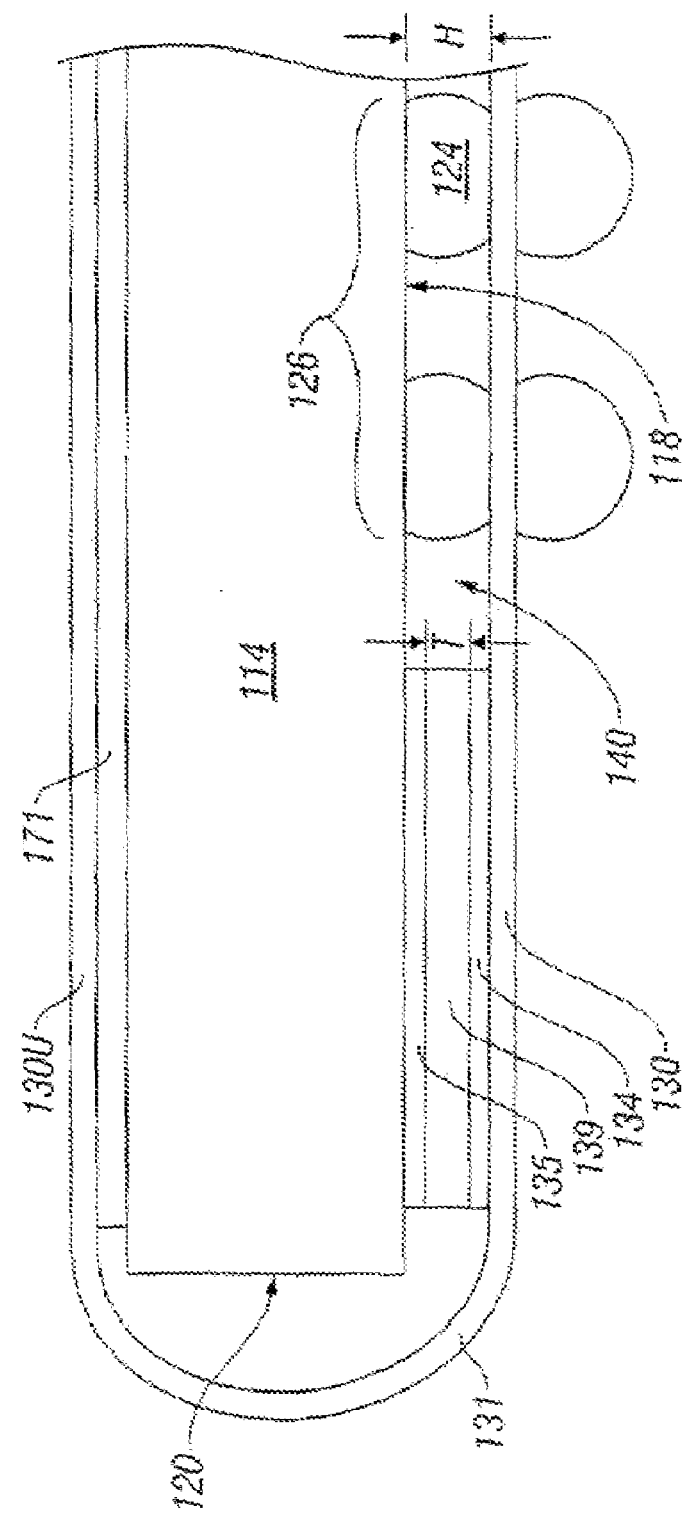
FIG. 23A depicts, in enlarged view, the area marked "23A" in FIG. 23.

The embodiment of a precursor assembly illustrated in FIG. 23 uses substantially planar stiffeners 139 that are initially disposed on a flex circuit 130 and affixed thereto with adhesive 134. When precursor assembly 105 is assembled, stiffeners 139 are disposed along a surface of CSP 114 even if literally separated from that surface, such as by adhesive 135, for example. In this embodiment, stiffeners 139 are attached to CSP 114 with adhesive 135. CSP contacts 124, regardless of configuration, generally will define a mounting height for CSP, such as mounting height H depicted in FIG. 23A for CSP contacts comprising solder balls. Preferably, thickness T of stiffeners 139 is less than mounting height H, for example as depicted in FIG. 23A, with the combined thickness of stiffener 139 and adhesives 134 and 135 approximately equal mounting height H so as to dispose the lower portion of the flex circuit 130 approximately parallel to the lower surface 118 of CSP 114. In preferred embodiments, stiffeners 139 also are configured to provide lateral clearance for the CSP arrays 126 comprising various CSP contacts 124. In the exemplar depicted in FIG. 23, for example, CSP contacts 124 are at least partially disposed within the volume 140 between stiffeners 139.

Stiffeners 139 may take several useful configurations, but in preferred embodiments herein, stiffeners 139 are substantially planar. A preferred embodiment is shown using stiffeners 139 disposed within the lateral extent L of CSP 114. Other embodiments may have stiffeners 139 disposed at least partially outside lateral extent L of CSP 114, one example of which is the embodiments further discussed below in connection with FIG. 38.

In preferred embodiments, flex circuit 130 has upper portions 130U that terminate in edges 170A and 170B which are separated by gap G above the upper surface 116 of CSP 114. In some embodiments, gap G is preselected and imposed when precursor assembly 105 is made. Upper portions 130U of flex circuit 130 are disposed along the upper surface 116 of CSP 114 even if literally separated from that surface, such as by adhesive 171, for example. In such configurations, flex circuit 130 has a folded portion 131.

Figure 34:
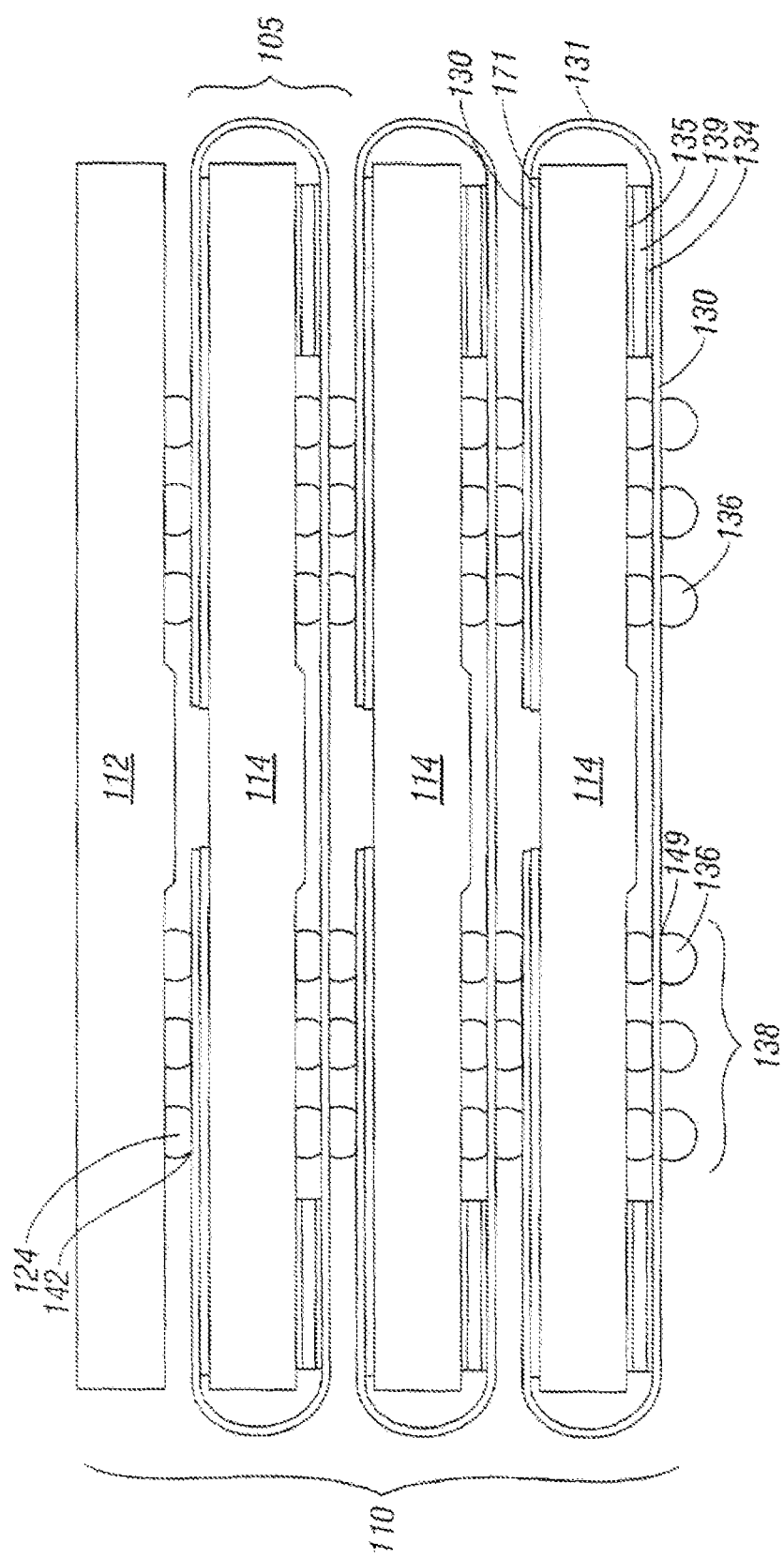
FIG. 34 is an elevation view of a stacked circuit module devised in accordance with a preferred embodiment of the present invention.

FIG. 23 depicts precursor assembly 105 with module contacts 136 through which the precursor assembly 105 may connect to an application environment or to another precursor assembly 105, for example, as shown in FIG. 34. In the illustrated embodiment, the module, contacts 136 are deployed in a module contact array 138, but other configurations of module contacts may be used. Those of skill will recognize that module contacts 136 in the form of the depicted solder balls are not required to connect a stacked circuit module 110 to an application environment or to connect a precursor assembly 105 to another precursor assembly 105, and that other connective strategies may be employed such as, for example, direct pad to pad connection schemes or connective structures other than solder balls.

Figure 24:
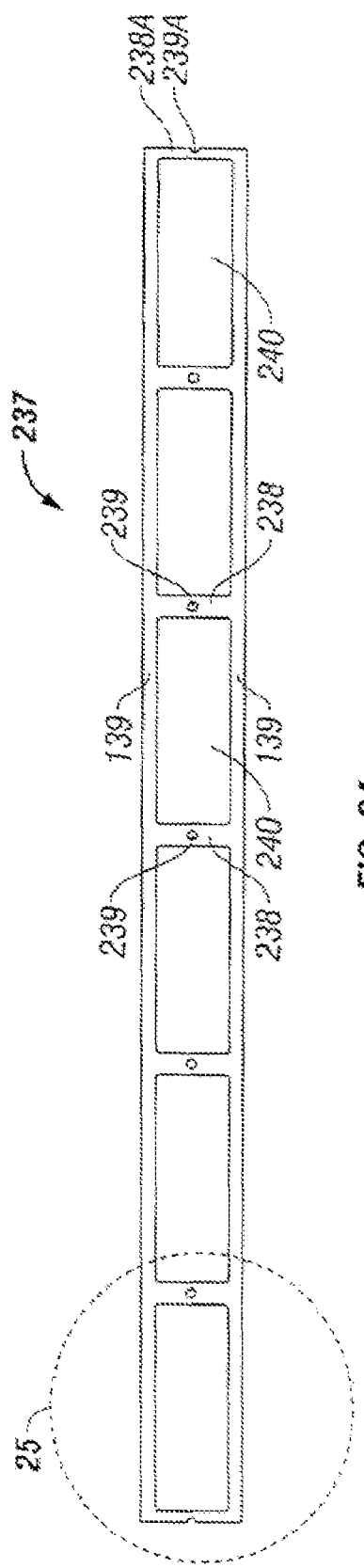
FIG. 24 is a plan view of stiffener stock devised in accordance with a preferred embodiment of the present invention.
Figure 25:
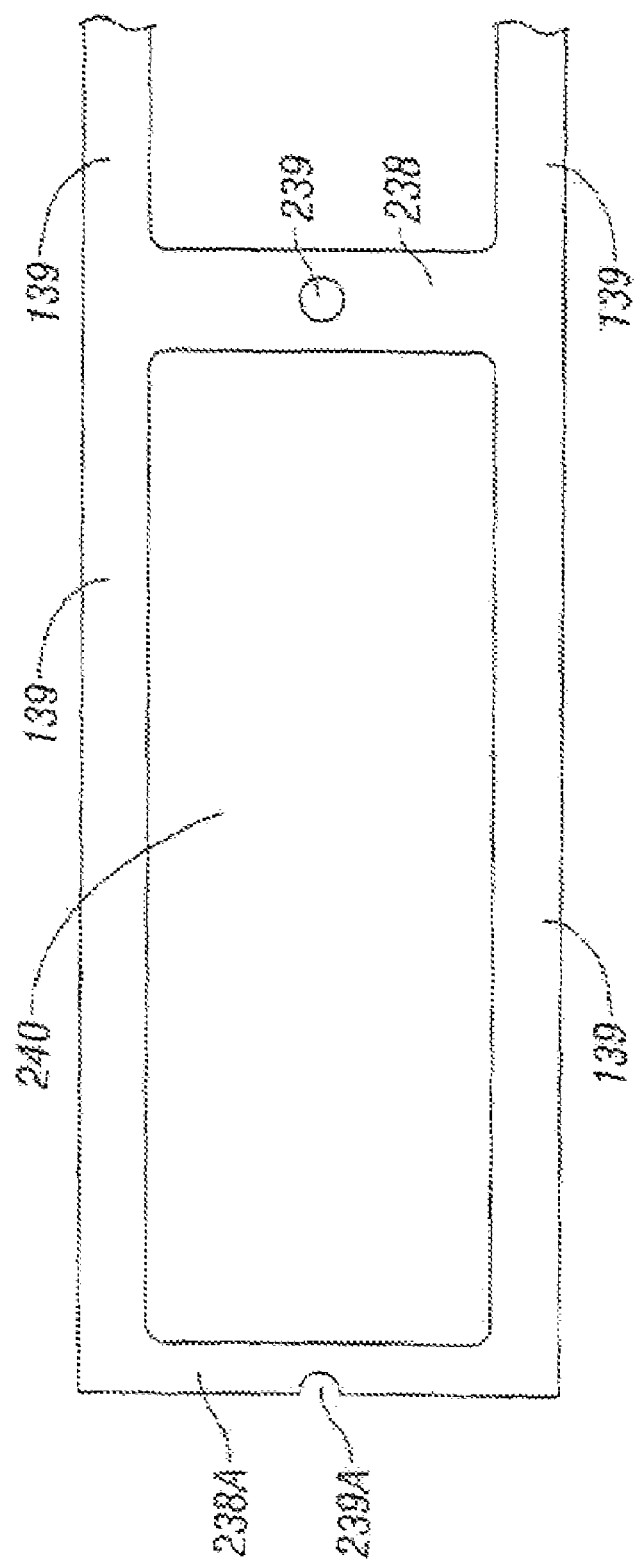
FIG. 25 depicts, in enlarged view, the area marked "25" in FIG. 24.

A preferred method for practicing the invention produces precursor assemblies 105 in batches of six. The stiffener(s) and flex circuit(s) for a particular precursor assembly are provided in aggregation with other stiffeners and flex circuits, respectively, for other precursor assemblies. Those of skill will recognize, however, that the inventive methods described herein can be used with other batch sizes or with continuous production techniques, for example those using known reel and tape formats. FIG. 24 depicts an exemplar strip or panel of stiffener stock 237 that may be employed in some preferred embodiments of the present invention, and FIG. 25 depicts an enlarged depiction of the area marked "25" in FIG. 24. The illustrated strip of stiffener stock 237 includes twelve stiffeners 139 retained by tabs 238 in configuration for deployment in six precursor assemblies 105. The stiffener material has cutouts comprising tooling holes 239 and windows 240. Windows 240 are configured to accommodate CSP arrays 126 comprising CSP contacts 124 of CSP 114. At each longitudinal end of the stiffener stock 237 depicted, tabs 238A and tooling holes 239A are disposed generally as half of a tab 238 and a tooling hole 239 as disposed between adjacent windows 240.

Stiffener stock 237 as depicted in the embodiment of FIG. 24 comprises a polymer having thermal properties adequate for the various temperatures at which various solder reflow and other attachment operations may occur in the production of precursor assemblies 105 and stacked circuit modules 110 and in the deployment of stacked circuit modules 110 in an application environment. In a preferred embodiment, stiffener stock 237 comprises a single layer or multiple laminated layers of polyimide film selected so that stiffeners 139 have mechanical properties compatible with the mechanical properties of flex circuit 130, but other materials that are compatible with the assembly processes may be used such as resin polymer matrix composites, engineering ceramics or ceramic fibers, graphite composites, or filled and non-filled plastics known to those of skill in the art. Preferably, compatibility of the mechanical properties of stiffeners 139 and flex circuit 130 are selected to reduce to an acceptable extent any warping and other deformations of precursor assembly 105 caused by differential thermal expansion of stiffeners 139 and flex circuit 130. As those of skill will recognize, stiffener stock 237 also may take other configurations and compositions and may, for example, be devised in more than one piece and/or be devised of material that is thermally conductive. In alternative embodiments, stiffener stock 237 may comprise material of sufficient rigidity such as stainless steels, aluminum, copper, or other metals or metal alloys so that stiffeners 139 control the coplanarity of CSP 114 by inhibiting warping.

Figure 26:
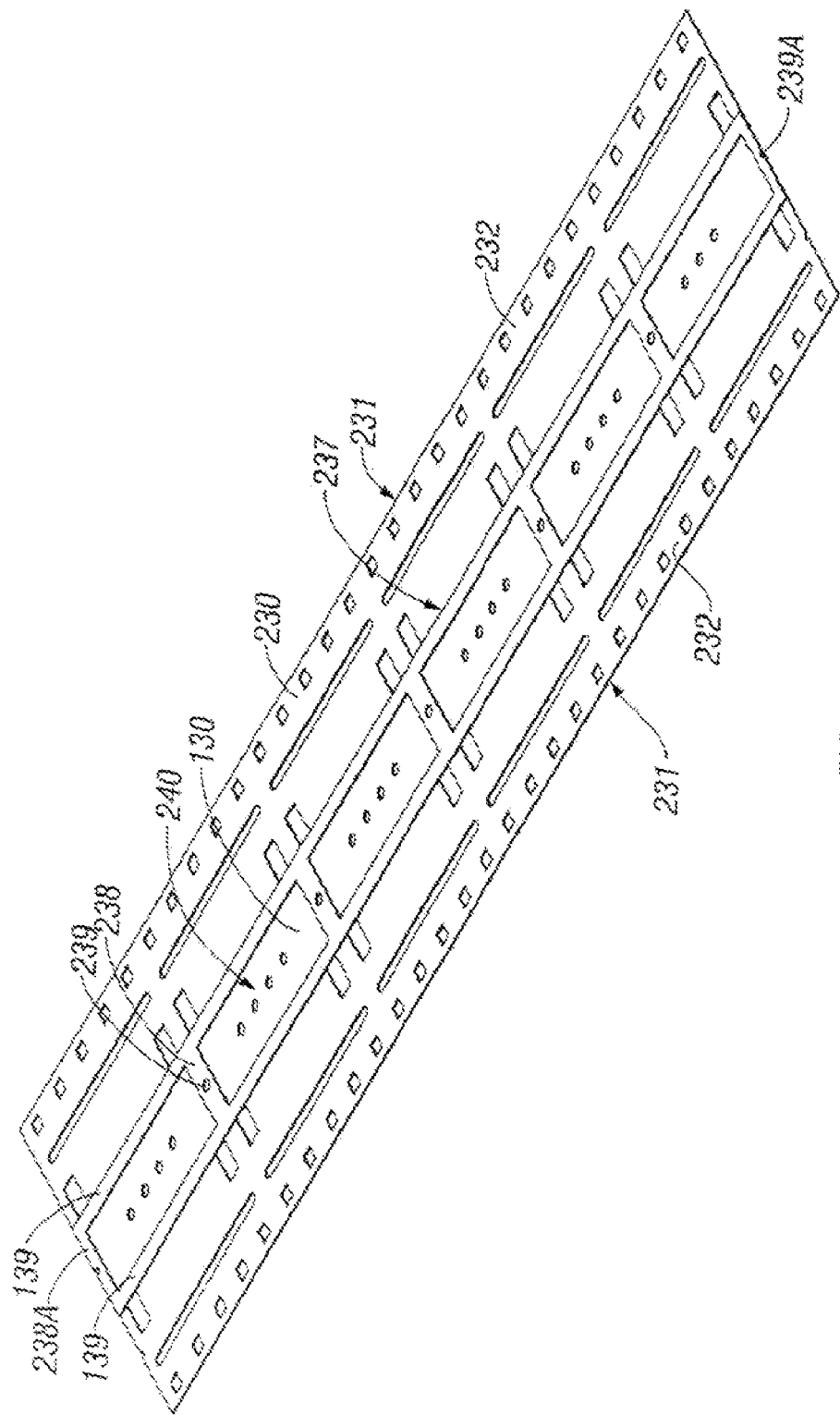
FIG. 26 is a perspective view of a panel or strip comprising flex circuits devised in accordance with a preferred embodiment of the present invention with stiffener stock attached.
Figure 27:
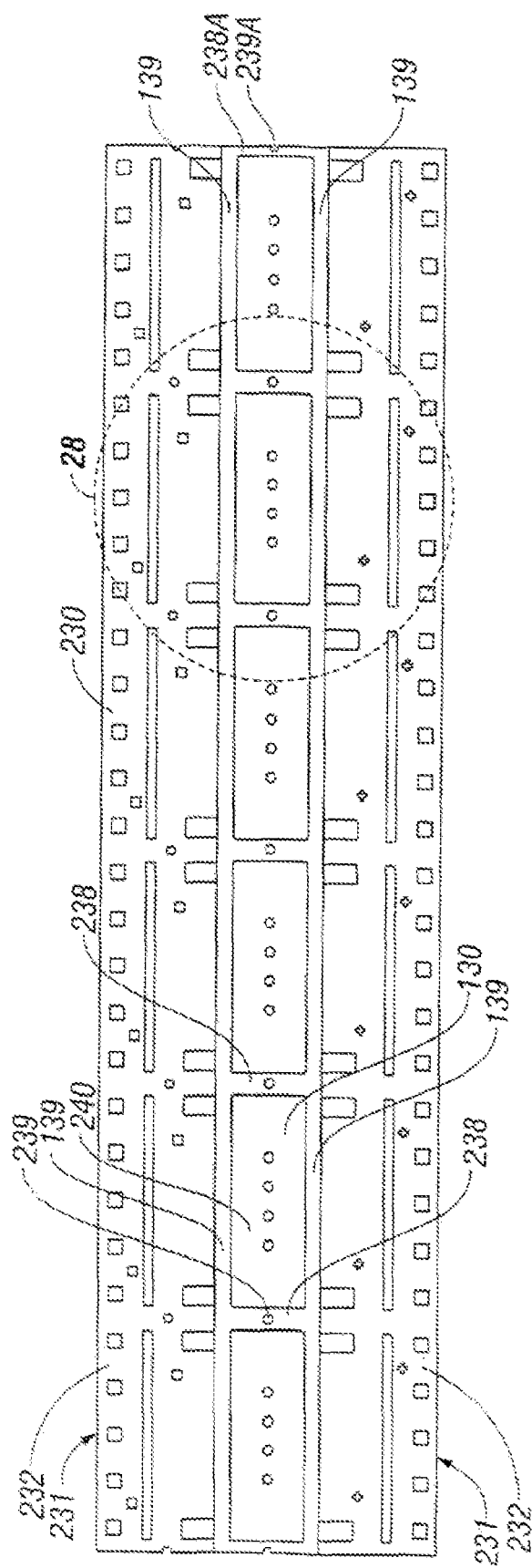
FIG. 27 is a plan view of a panel or strip comprising flex circuits devised in accordance with a preferred embodiment of the present invention with stiffener stock attached.

FIGS. 26 and 27 depict perspective and plan views, respectively, of stiffener stock 237 disposed on a panel or strip 230 comprising flex circuits 130. In the depicted embodiment, six flex circuits 130 are configured side-by-side, with a portion of each flex circuit 130 accessible through a respective window 240 of stiffener stock 237. Strip 230 further comprises lateral edges 231 and strip edge portions 232. In a preferred embodiment, an adhesive 134 (shown earlier) is used to attach stiffener stock 237 and its component stiffeners 139 and tabs 238 to strip or panel 230 and its component flex circuits 130. Adhesive 134 in a preferred embodiment comprises a dry film adhesive. Those of skill will recognize, however, that adhesive 134 may be selectively applied to selected portions of stiffener stock 237 or strip 230, or both, and that other methods for attaching stiffeners 139 to flex circuits 130 may be employed in accordance with various embodiments of the present invention including, for example, laminate tape adhesive, liquid adhesive, and ultrasonic or thermal bonding. Preferably, the adhesive will be thermally conductive. In a preferred embodiment, tooling holes 239 facilitate alignment of stiffener stock 237 and strip 230, although alternative methods such as machine vision aided pick & place may be employed.

Figure 28:
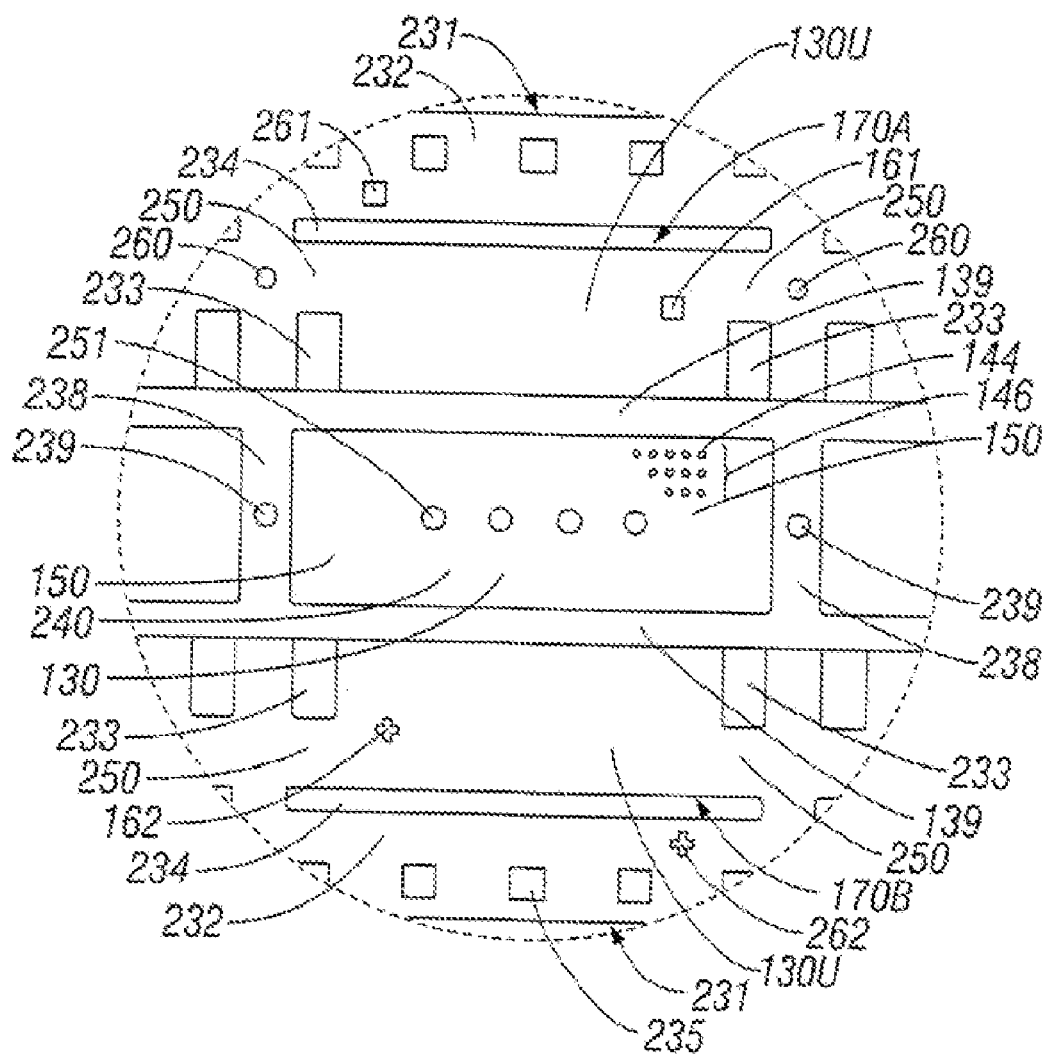
FIG. 28 depicts, in enlarged view, the area marked "28" in FIG. 24.

FIG. 28 depicts an enlarged depiction of the area marked "28" in FIG. 27. The depiction of FIG. 28 is centered on a site where a CSP 114 will be disposed. When a CSP 114 is disposed, selected CSP contacts 124 will be connected to respective ones of flex contacts disposed in flex contact arrays. For simplicity, the depiction of FIG. 28 shows through window 240 only selected ones of flex contacts 144 of a selected flex contact array 146. Components of stiffener stock 237 relevant to the illustrated site include stiffeners 139, tabs 238, tooling holes 239, and window 240.

The portion of strip 230 depicted in FIG. 28 also illustrates various features of flex circuit 130 of a preferred embodiment. In the illustrated embodiment, a singulation opening 233 is disposed through strip 230 adjacent to each longitudinal end of each stiffener 139. Additional singulation openings 234 are disposed through strip 230 along strip edge portions 232 adjacent to each lateral edge 231 of strip 230. Edges 170A and 170B of upper portions 130U of flex circuit 130 are disposed along singulation openings 234, with each upper portion 130U disposed between a respective singulation opening 234 and a respective stiffener 139.

Strip 230 and the flex circuits 130 disposed thereon can be configured with conductive components in a wide variety of ways. For example, strip 230 and the flex circuits 130 disposed thereon can be multi-layer flexible circuit structures, such as the embodiment discussed above having a first conductive layer and a second conductive layer that are interior to first and second outer surfaces, with an intermediate layer disposed between the first conductive layer and the second conductive layer. As those of skill in the art will recognize, a single conductive layer or three or more conductive layers can also be used, and typically the choice will depend on the complexity of the circuit routing required. Further, some embodiments may employ only one cover coat, such as those instances in which a ground plane is exposed. Circuit traces can be disposed in one or more conductive layers, and selected conductive layers may contain only ground or voltage planes.

In one exemplar preferred embodiment useful for stacking memory CSPs, conductive traces are disposed at one conductive layer with a ground plane disposed an another conductive layer. In that embodiment, a single outer surface is used leaving one of the conductive layers exposed. All contact pads on the exposed conductive layer are connected to the other conductive surface through vias, using no conductive traces on the exposed conductive layer. Connecting the contact pads directly through vias mitigates solder wicking and reduces costs and thickness of the flex circuitry.

The manufacture of strip 230 may employ various electroplating steps that use current supplied from sprocket rails engaging sprocket holes 235. Current for electroplating can be routed along bussing through trim tabs 250, which are severed from flex circuits 130 during singulation as discussed further below. Electroplating bus paths also can converge at various connection points of strip 230, which bussing connections can be severed following electroplating by making de-bussing punches 251 as illustrated in FIG. 28. As those of skill in the art will recognize, however, other methods may be used to dispose conductive material within and/or on strip 230. At each longitudinal end of flex circuit 130 in a preferred embodiment, nonbussed portion 150 of flex circuit 130 is disposed alongside tab 238 and between singulation openings 233 to provide additional clearance for circuitry of flex circuit 130 during singulation, as discussed further below.

FIG. 28 also depicts the various pattern recognition marks, or "fiducials," used by automated assembly equipment during manufacture: of precursor assemblies 105. Preferably, fiducials are metal defined, asymmetrically placed, and comprise a cross and a square where practical. The preferred embodiment depicted has global fiducials 260 defined by circular metal regions on the surface of strip 230 and aligned with tooling holes 239. Additional global fiducials are defined by metal regions in the form of a square (fiducials 261) and a cross (fiducials 262). The global fiducials are used as reference points during singulation of precursor assemblies 105 or stacked circuit modules 110. Also depicted are local fiducials defined by metal regions in the form of a square (fiducials 161) and a cross (fiducials 162) defined in a conductive layer of the flex circuit, which local fiducials are used by automated equipment as a reference during the placement of CSP 114 on flex circuit 130.

Although the description of the embodiment illustrated in FIG. 28 is directed to features related to a single precursor assembly 105 to be made using stiffener stock 237 and strip 230, those of skill will recognize that the described features can be replicated for other precursor assemblies 105 or that variations in the described features can be employed for other precursor assemblies 105.

Prior to placement of CSP 114 on flex circuit 130, in the disclosed embodiment adhesive 135 is applied to the exposed upper surface of stiffener 139. In a preferred embodiment, adhesive 135 comprises a liquid adhesive. Those of skill will recognize, however, that adhesive 135 may be selectively applied to selected portions of stiffener 139 and that other methods for attaching stiffeners 139 to CSP 114 may be employed in various embodiments of the present invention including, for example, laminate tape adhesive and dry film adhesive. Preferably, the adhesive will be thermally conductive.

Automated pick-and-place equipment know in the art is used to dispose CSP 114 on flex circuit 130 in a preferred embodiment. The pick-and-place equipment dips CSP contacts 124 in flux prior to placement of CSP 114 on flex circuit 130. After placement of CSP 114 on flex circuit 130, heat is supplied during a first solder reflow operation to produce a solder connection between CSP contacts 124 and flex contacts 144. The combination of adhesive 134, stiffener 139, and adhesive 135 cooperate to maintain flex circuit 130 and CSP 114 in proper position during the first solder reflow operation.

Figure 29:
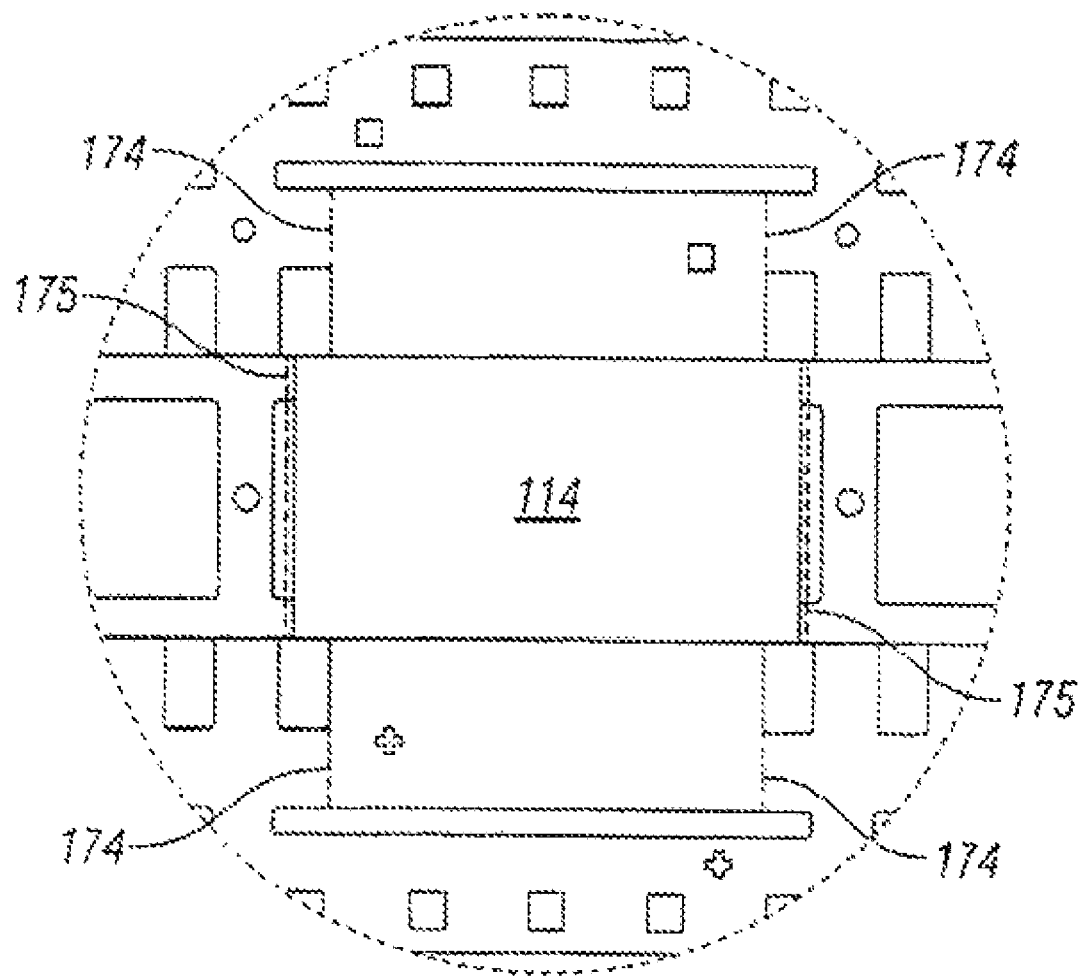
FIG. 29 depicts a CSP placed on a flex circuit in accordance with a preferred embodiment of the present invention.
Figure 30:
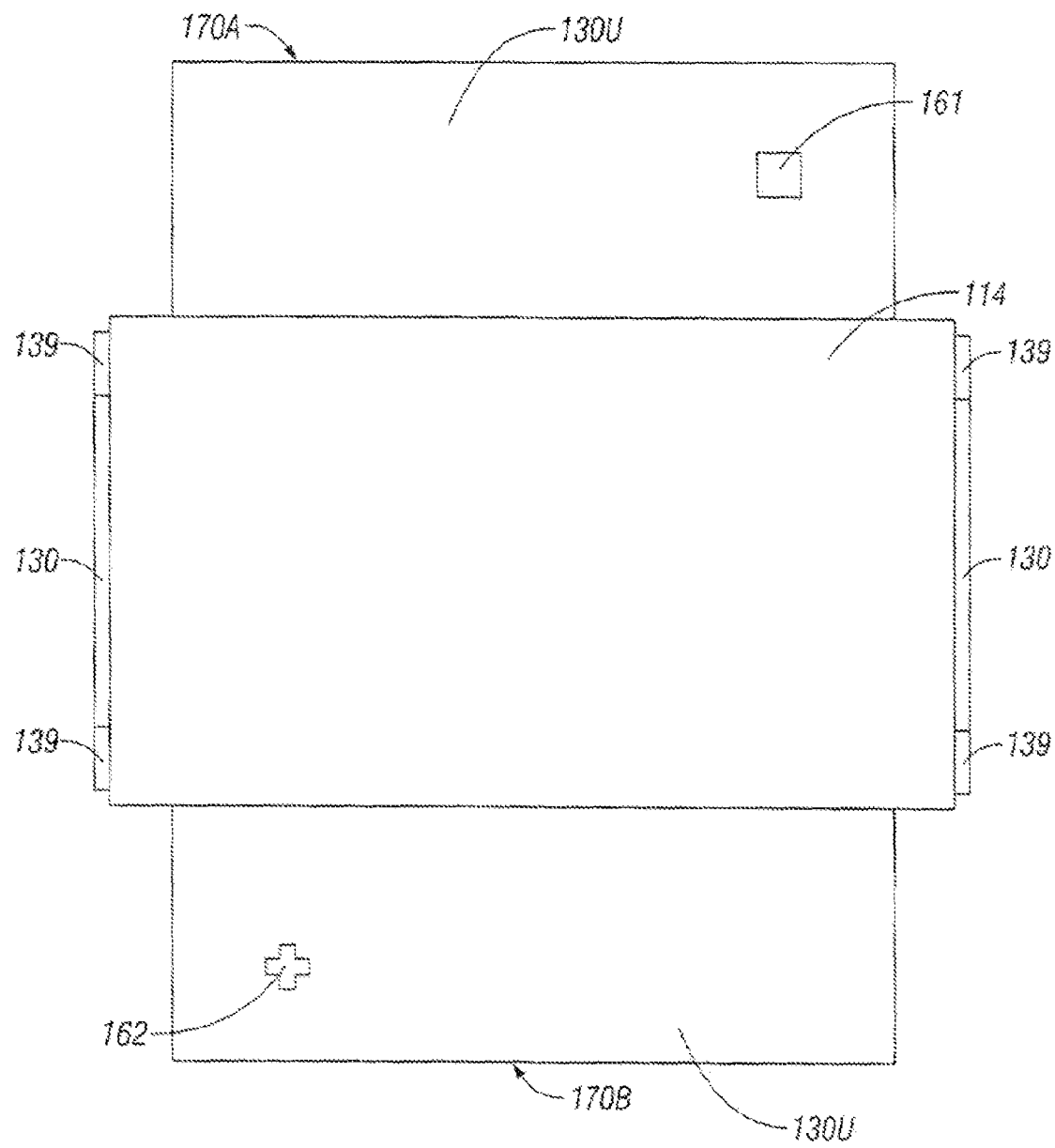
FIG. 30 presents another depiction of a CSP placed on a flex circuit in accordance with a preferred embodiment of the present invention.

After CSP 114 is soldered to flex circuit 130, upper portions 130U of flex circuits 130 are separated from strip 230 by upper flex cuts 174. FIG. 29 depicts the position of upper flex cuts 174, and also shows the position of singulation cuts 175 made later during singulation of precursor assemblies 105 or stacked circuit modules 110 as discussed below. FIG. 30 depicts the configuration of flex circuit 130, stiffeners 139, and CSP 114 following the making of upper flex cuts 174 as shown in FIG. 29, with such depiction bounded to the left and right by the positions where singulation cuts 175 will be made later in the assembly process.

In the depicted embodiments, adhesive 171 is applied to the upper surface 116 of CSP 114, to upper portions 130U of flex circuit 130, or to both upper surface 116 and upper portions 130U. In a preferred embodiment, adhesive 171 comprises a dry film adhesive. Those of skill will recognize, however, that adhesive 171 may be selectively applied to selected portions of upper surface 116 or upper portions 130U, or both, and that other methods for attaching the upper surfaces 118 to flex circuits 130 may be employed in various embodiments of the present invention including, for example, laminate tape adhesive and liquid adhesive. Preferably, the adhesive will be thermally conductive.

Figure 31:
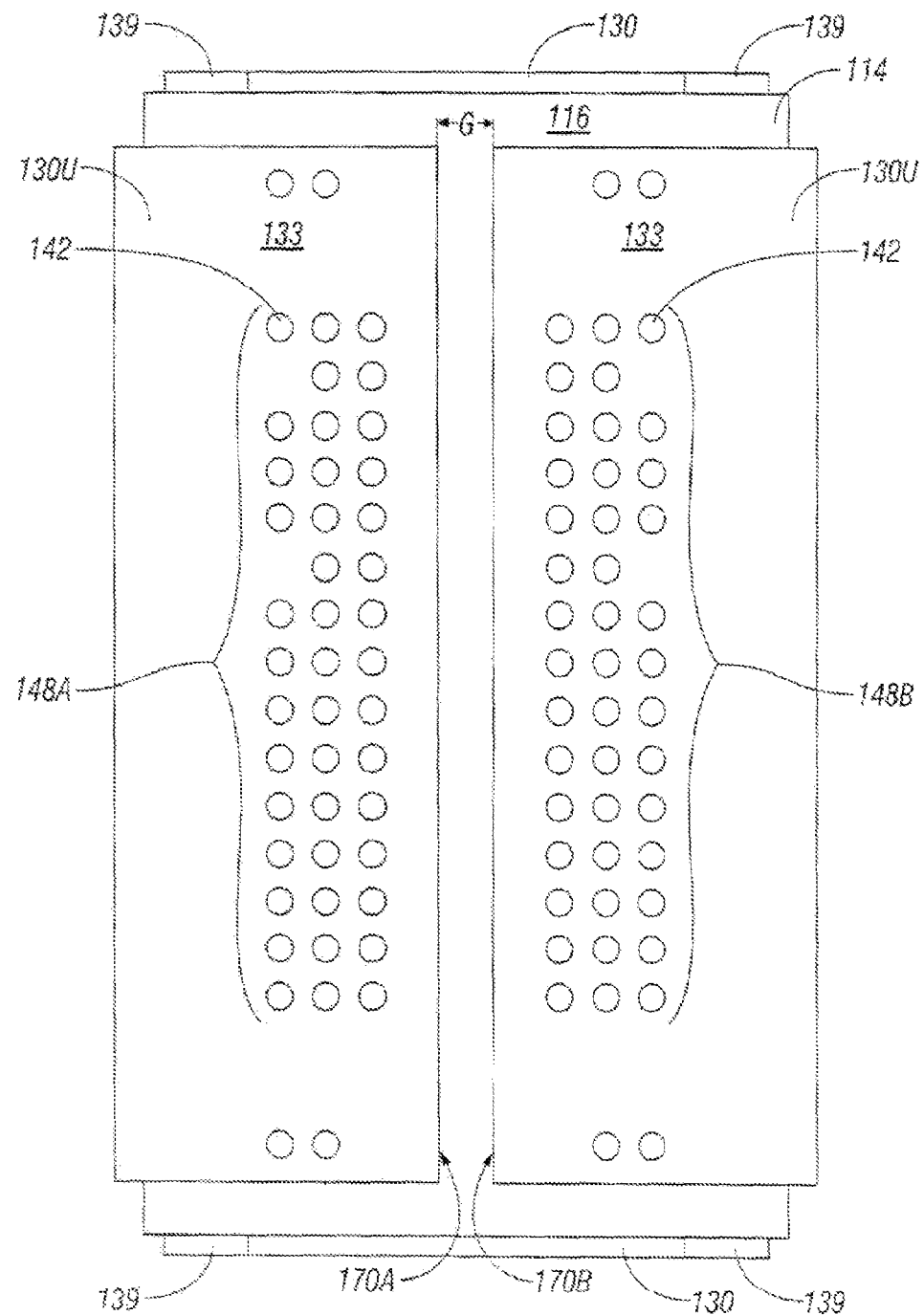
FIG. 31 depicts two flex circuit edges in an arrangement according to a preferred embodiment of the present invention.

As shown in FIGS. 23 and 31, in the disclosed embodiments, upper portions 130U of flex circuit 130 are disposed along the upper surface 116 of CSP 114 even if literally separated from that surface, such as by adhesive 171, for example. Disposition of upper portions 130U of flex circuit 130 along the upper surface 116 of CSP 114 can be accomplished using a tooling apparatus 180 devised in accordance with a preferred embodiment of the present invention, as depicted in FIGS. 39-43 and discussed below. FIG. 31 depicts flex circuit edges 170A and 170B in a proximal arrangement according to a preferred embodiment of the present invention.

As exemplified by the embodiment illustrated in FIG. 31, flex circuit 130 is configured for external electrical connection of lower CSP 114. Referring to FIG. 31, upper sides 133 of upper portions 130U of flex circuit 130 are depicted having upper flex contacts or pads 142 disposed in a first upper flex contact array 148A and a second upper flex contract array 148B. As those of skill will recognize, first upper flex contact array 148A and second upper flex contract array 148B have been abstracted to illustrate an exemplar set of upper flex contacts 142 when in practice, first upper flex contact array 148A and second upper flex contract array 148B may include a greater or lesser number of individual upper flex contacts or have flex contacts disposed in a different configuration, or both.

The depiction of FIG. 31 shows flex edges 170A and 170B separated by gap G. Flex edges 170A and 170B terminate respective upper portions 130U of flex circuit 130. Whether one or two distinct flex circuits are employed, gap G between edges 170A and 170B is controlled by a physical form during assembly of precursor assembly 105 and first upper flex contact array 148A and second upper flex contract array 148B will, therefore, be localized or fixed in relative position. In the exemplary embodiments, first upper flex contact array 148A and second upper flex contract array 148B together define an array of upper flex contacts 142 configured for connection to CSP contacts 124 of upper CSP 112.

Figure 32:
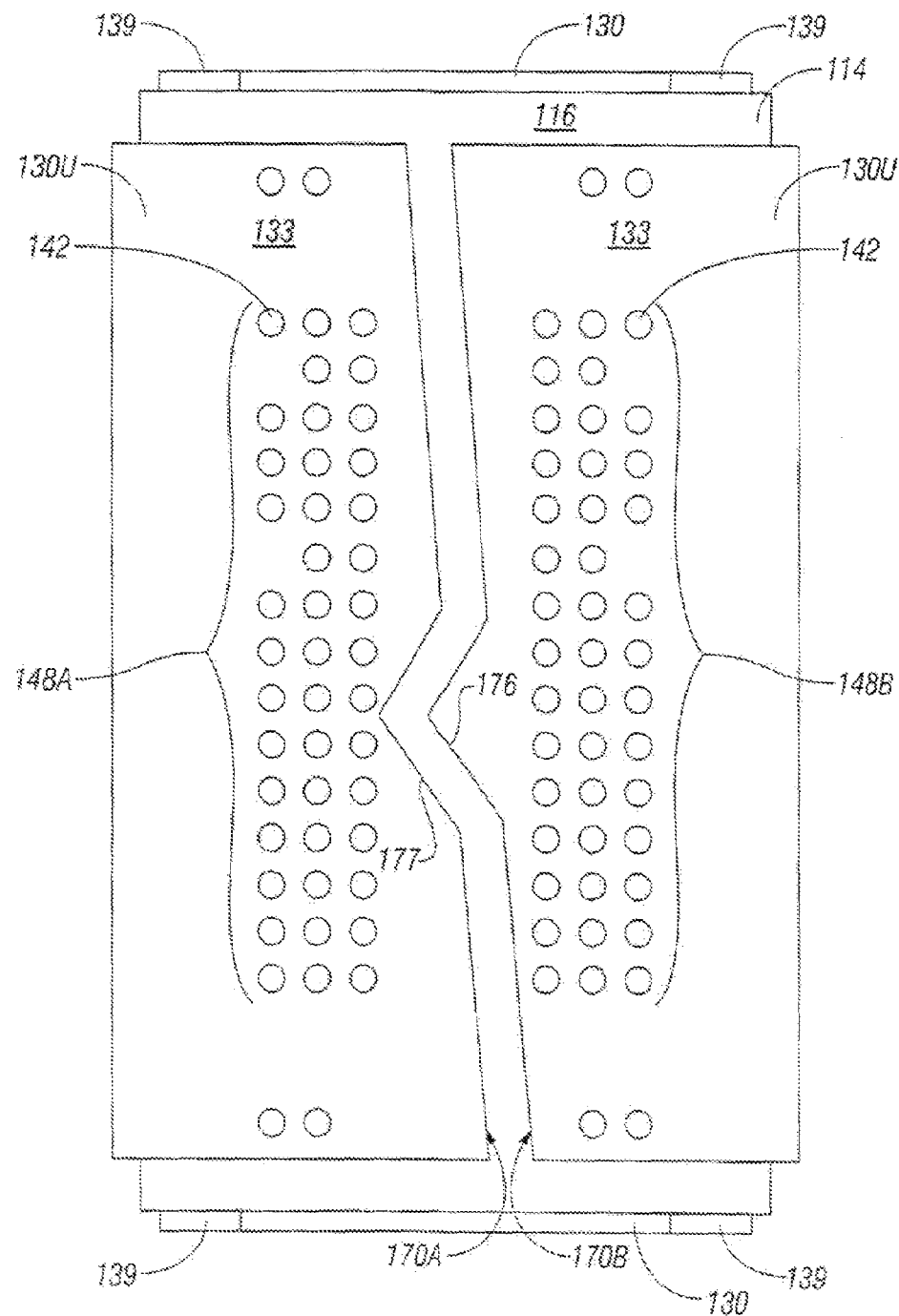
FIG. 32 depicts two flex edges in accordance with an alternative preferred embodiment of the present invention.
Figure 33:
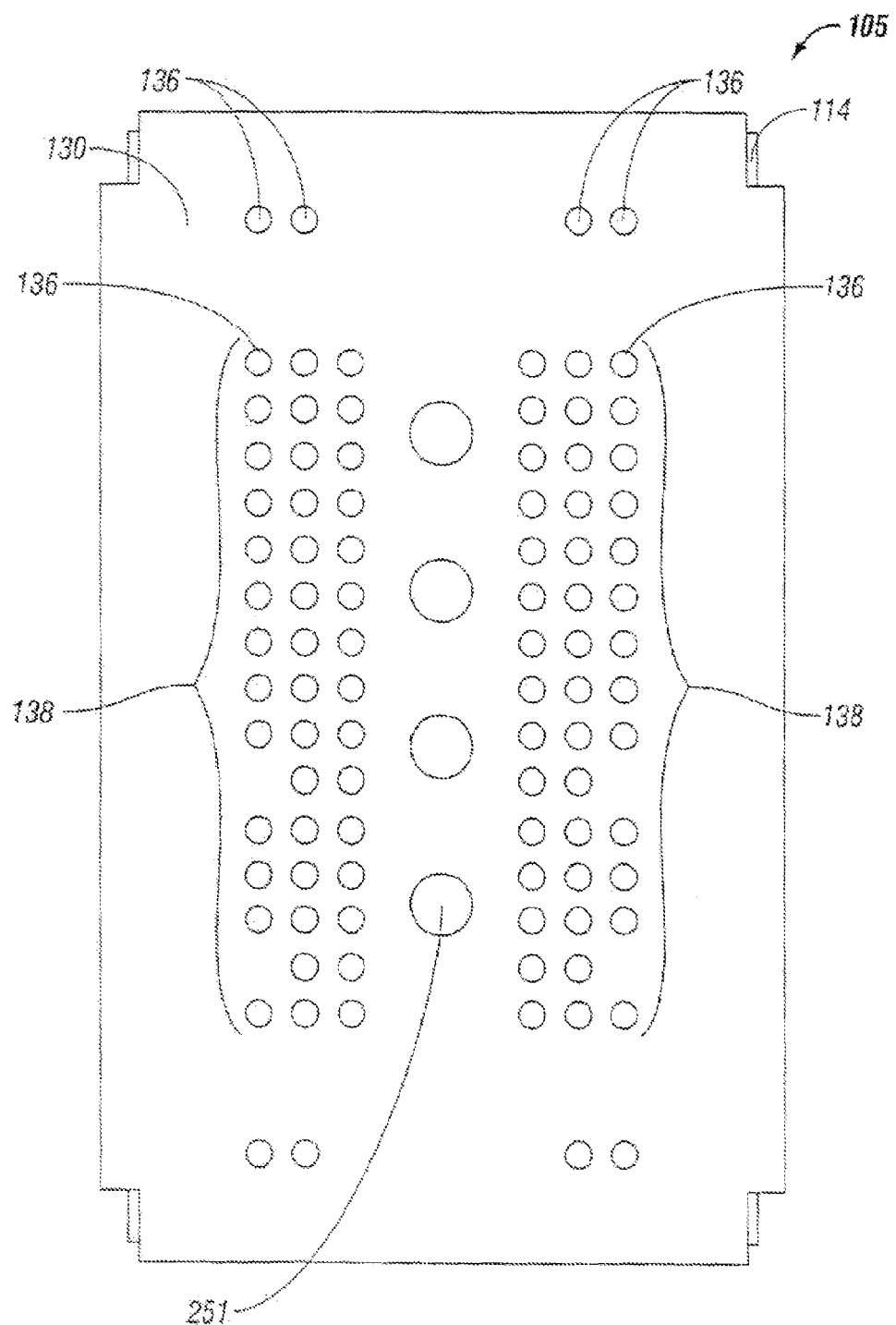
FIG. 33 is a plan view from below of a precursor assembly devised in accordance with a preferred embodiment of the present invention.

Other means may be employed to position or set edges 170A and 170B and, by extension, first upper flex contact array 148A and second upper flex contract array 148B. For example, flex edges 170A and 170B may be devised to be jointly fittable with each other as shown in FIG. 32 to position first upper flex contact array 148A and second upper flex contract array 148B. Protrusion 176 fits with receptive check 177 to both align laterally and transversely edges 170A and 170B. Other similar devices may be employed to laterally and/or transversely align edges 170A and 170B. Thus, first upper flex contact array 148A and second upper flex contract array 148B are disposed in predetermined relation to each other by the jointly fittable configuration of edges 170A and 170B to mesh with each other. Consequently, in this depicted alternative embodiment, edges 170A and 170B are disposed in predetermined relation to each other by their jointly fittable configurations.

Figure 35:
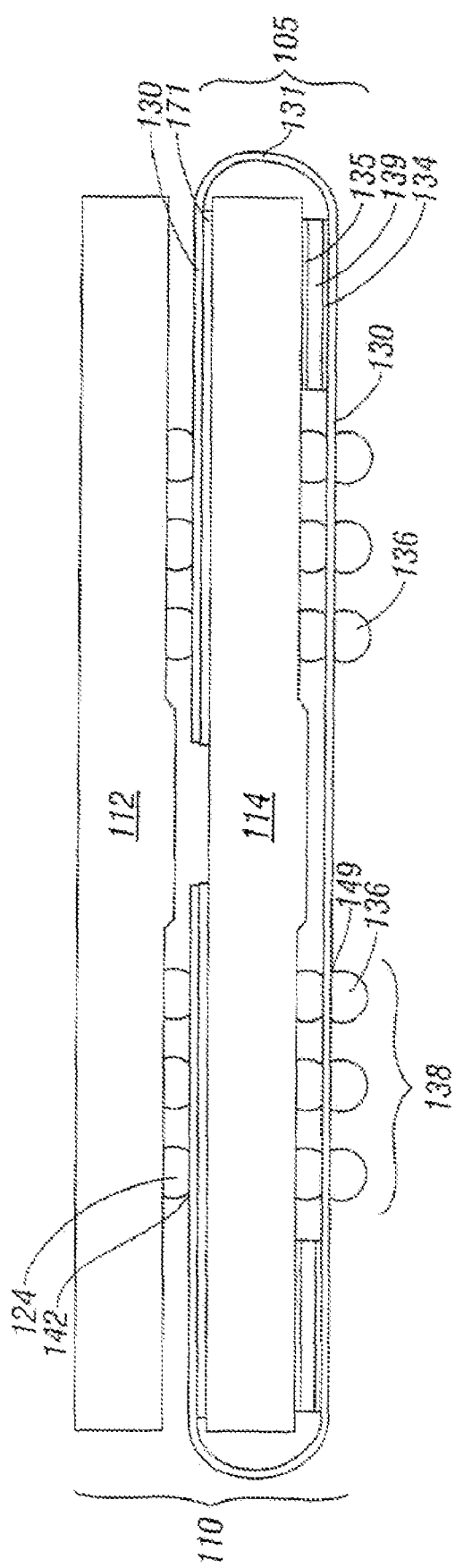
FIG. 35 is an elevation view of a stacked circuit module devised in accordance with another preferred embodiment of the present invention.

Stacked circuit modules devised in accordance with the invention can comprise multiple precursor assemblies 105 as shown in FIG. 34 or a single precursor assembly 105 as shown in FIG. 35. When assembling precursor assemblies 105 for use in stacked circuit modules comprising multiple precursor assemblies 105, the precursor assemblies 105 can be singulated at this stage with singulation cuts 175, placed for example as depicted in FIG. 29. In such embodiments, module contacts 136 are disposed along flex contacts or pads 149 on flex circuit 130 as exemplified in FIG. 33, which depicts a plan view of an exemplar precursor assembly 105 from below. As those of skill will recognize, module contact arrays 138 have been abstracted to illustrate an exemplar set of module contacts 136 when in practice, module contact arrays 138 may include a greater or lesser number of individual module contacts or module contacts disposed in a different configuration. Alternatively, in preferred embodiments singulation with singulation cuts 175 can be deferred until all precursor assemblies 105 and upper CSPs 112 have been assembled.

FIG. 34 depicts an exemplar stacked circuit module 110 in accordance with a preferred embodiment of the present invention that employs three precursor assemblies 105. In this embodiment, each flex circuit 130 has folded portions 131 respective disposed adjacent to first and second lateral sides of the stack. As those of skill in the art will recognize, however, stacked circuit modules 110 also can be devised with one, two, three, four, or more precursor assemblies 105, or with precursor assemblies using CSPs of different types. In some configurations, one or more lower CSPs 114 may have a lateral extent L having a proportion such that folded portions 131 of one or more other precursor assemblies 110 may not be disposed outside such lateral extent.

FIG. 35 depicts an exemplar stacked circuit module 110 in accordance with a preferred embodiment of the present invention that employs a single precursor assembly 105. In this embodiment, flex circuit 130 has folded portions 131 respective disposed adjacent to first and second lateral sides of the stack. For stacked circuit modules 110 comprising one lower CSP 114, in a preferred embodiment upper CSP 112 is attached to flex circuit 130 prior to singulation of stacked circuit modules 110. Automated pick-and-place equipment know in the art is used to dispose upper CSP 112 on flex circuit 130 as shown in FIG. 35. The pick-and-place equipment dips CSP contacts 124 in flux prior to placement of CSP 112 on flex circuit 130. After placement of CSP 112 on flex circuit 130, the stacked circuit modules 110 are clamped while heat is supplied during a second solder reflow operation to produce a solder connection between CSP contacts 124 and upper flex contacts 142. The combination of adhesive 134, stiffener 139, adhesive 135, and adhesive 171 cooperate to maintain flex circuit 130 and CSP 114 in proper position during the second solder reflow operation.

Figure 36:
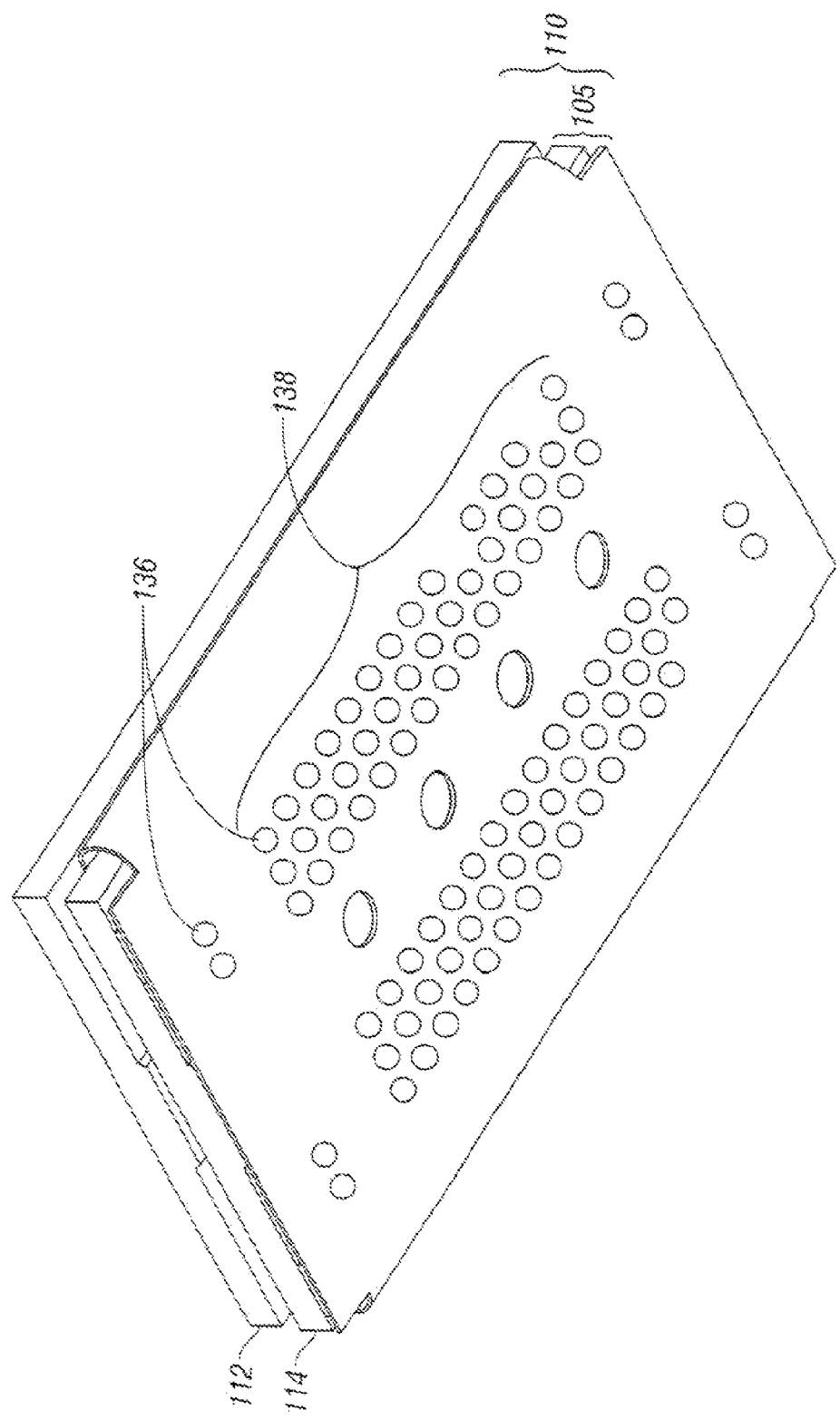
FIG. 36 is a perspective view from below of a stacked circuit module devised in accordance with a preferred embodiment of the present invention.
Figure 37:
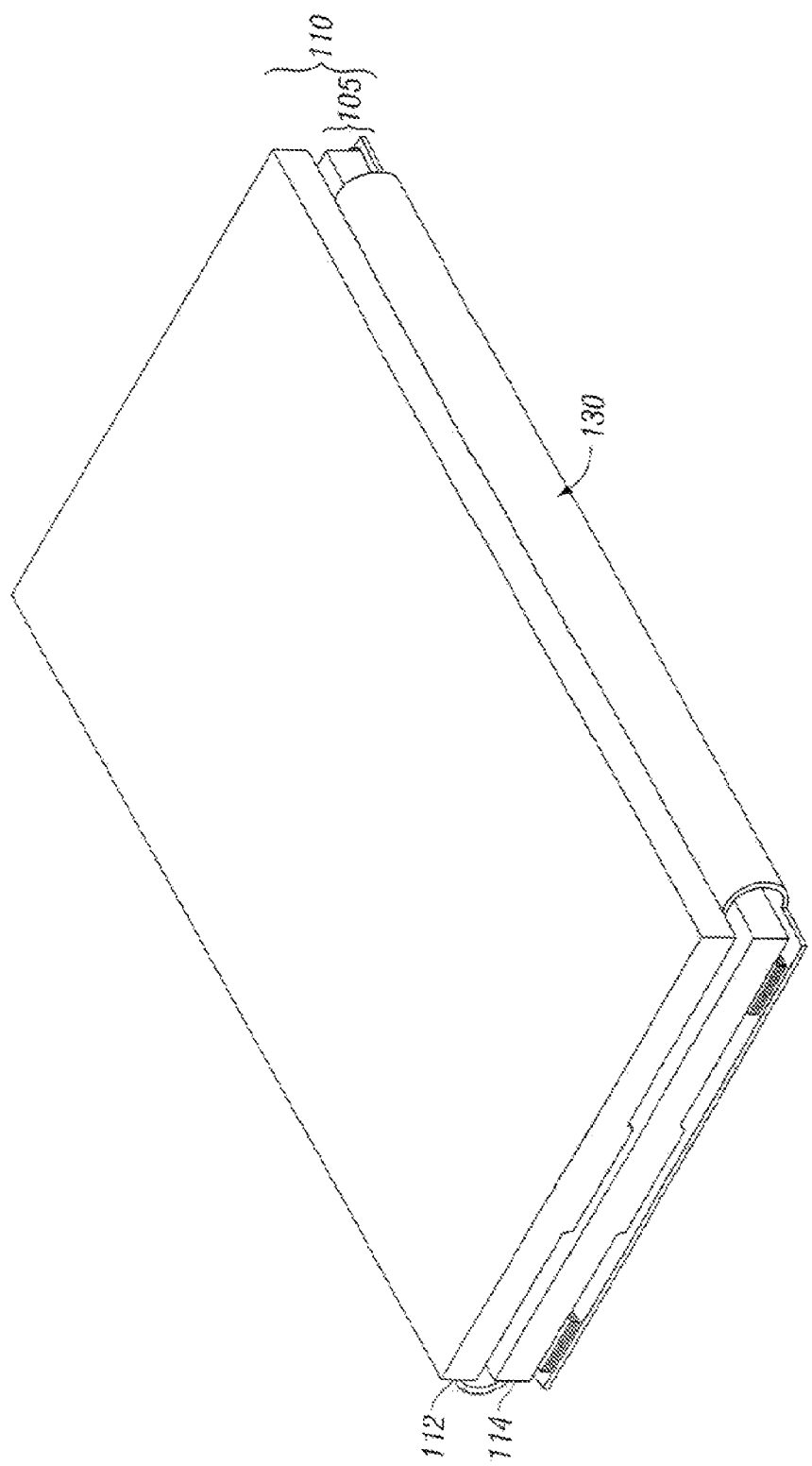
FIG. 37 is a perspective view from above of a stacked circuit module devised in accordance with a preferred embodiment of the present invention.

In a preferred embodiment, module contacts 136 are disposed along flex contacts or pads 149 on flex circuit 130 in module contact arrays 138. FIGS. 36 and 37 depict, respectively, lower perspective and upper perspective views of an exemplar stacked circuit module 110 in accordance with a preferred embodiment of the present invention that employs a single precursor assembly 105. Exemplar stacked circuit modules 110 typically are connected to an application environment, such as a printed circuit board, in a third solder reflow operation. The combination of adhesive 134, stiffener 139, adhesive 135, and adhesive 171 cooperate to maintain flex circuit 130, CSP 114, and CSP 112 in proper position during the third solder reflow operation.

Figure 38:
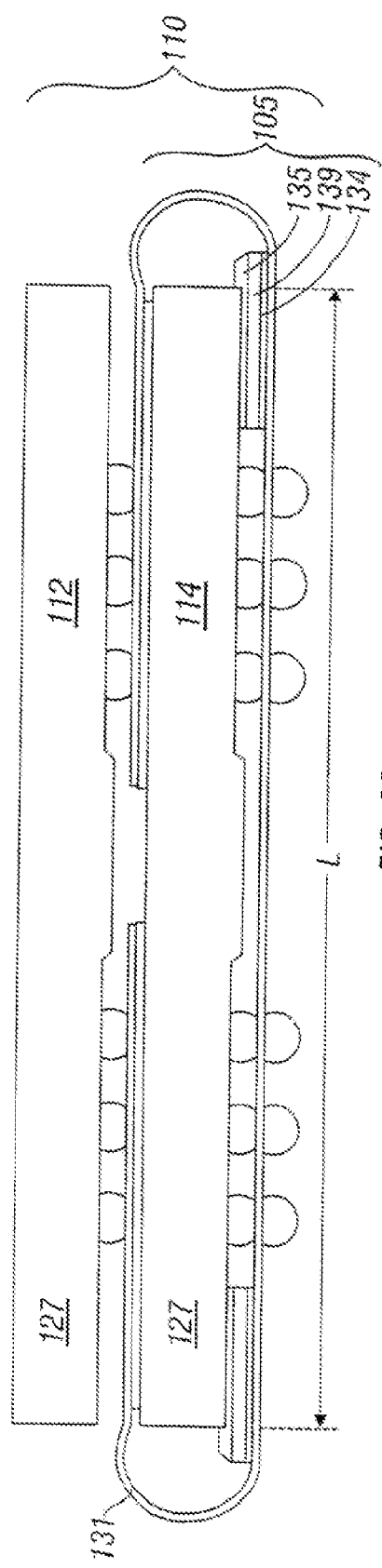
FIG. 38 is an elevation view of a stacked circuit module devised in accordance, with another preferred embodiment of the present invention.

FIG. 38 depicts an exemplar stacked circuit module 110 in accordance with a preferred embodiment of the present invention that has stiffeners 139 disposed at least partially outside lateral extent L of CSP 114. Embodiments as illustrated in FIG. 38 may be devised when using a strip 230 and stiffener stock 237 devised for use with a CSPs having larger dimensions than CSP 114 depicted in FIG. 38. Accordingly, in preferred embodiments, a single size of strip 230 and stiffener stock 237 can be used for a variety of CSP package sizes. In various embodiments of precursor assembly 105 in which stiffeners 139 are disposed at least partially outside lateral extent L of CSP 114, the portions of stiffeners 139 outside lateral extent L will substantially control the size of gap G in many alternative methods of assembly.

A wide variety of other variations in the configuration and materials of precursor assemblies 105 and stacked circuit modules 110 will be apparent to those skilled in the art. For example, tabs 238 need not be rectangular or completely trimmed away during singulation with singulation cuts 175, but can also extend along some or all of the ends of precursor assembly 105. Singulation openings 233 and upper flex cuts 174 can take other shapes and be disposed in different positions, which for example provide a narrower portion of flex circuit 130 between stiffener 139 and upper surface 116 of CSP 114 to allow enhanced ventilation. In alternative embodiments, a stabilizing fill may be employed between flex circuit 130 and CSP 114, for example as illustrated by conformal media 40 depicted in FIGS. 2 and 16.

In preferred embodiments, a low profile for precursor assembly 105 is provided. In such embodiments, stiffener 139 typically is about 0.13 mm thick, and adhesive 134 is about 0.05 mm thick. Adhesive 135 typically is about 0.07 mm thick, but can range across a variety of thicknesses. For example, in various preferred embodiments Adhesive 135 ranges from about 0.04 mm to about 0.10 mm thick. Adhesive 171 typically is about 0.08 mm thick. The various thicknesses used in embodiments devised in accordance with the invention are subject to wide ranges of alternatives, as those of skill will recognize.

Figure 39:
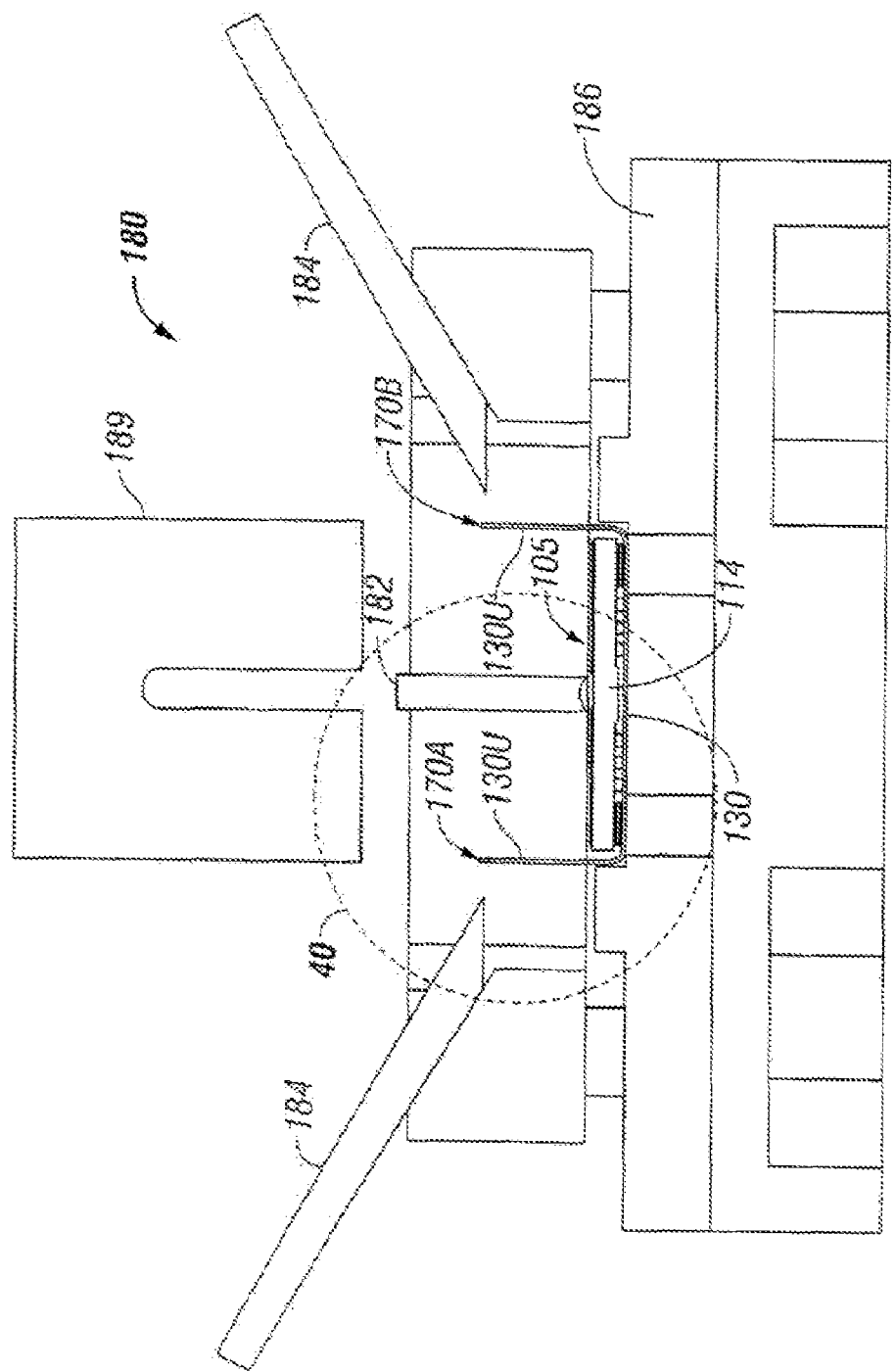
FIG. 39 depicts a tooling apparatus devised in accordance with a preferred embodiment of the present invention.

FIG. 39 depicts a tooling apparatus 180 devised in accordance with a preferred embodiment of the present invention illustrating the use of a physical form to set gap G between edges 170A and 170B of flex circuit 130. Tooling apparatus 180 includes a flex aligner 182 as shown in FIG. 39 used as a physical form to impose a preselected distance between the first and second edges. When forming tool 184 disposes flex circuit 130 adjacent to upper surface 116 of CSP 114 in forming precursor assembly 105, edges 170A and 170B of flex circuit 130 are limited in lateral placement along upper surface 116 of CSP 114 by flex aligner 182. Gap "G" is, therefore, preselected and determined by the dimensions of flex aligner 182 when disposed between edges 170A and 170B. With gap G and edges 170A and 170B thus determined, first upper flex contact array 148A and second upper flex contract array 148B are positioned during assembly as exemplified in FIG. 31.

Figure 40:
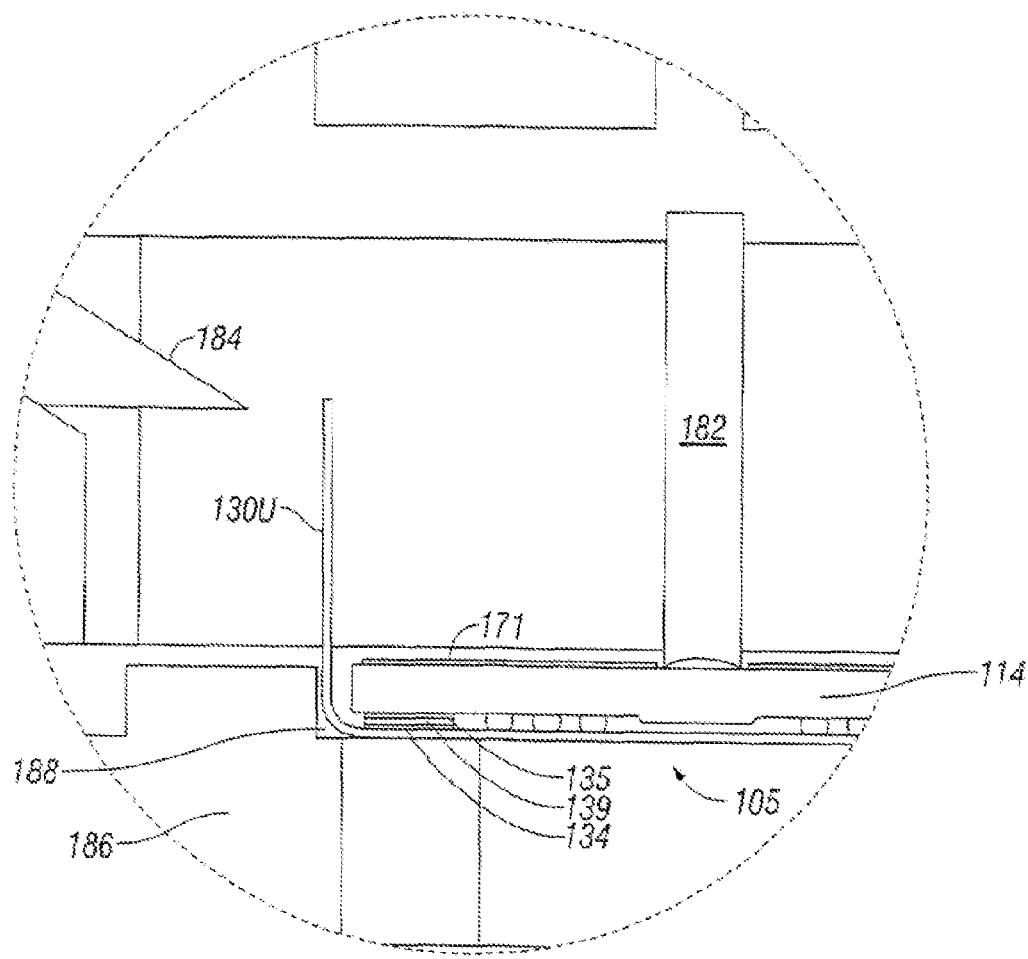
FIG. 40 depicts an enlarged depiction of the area marked "40" in FIG. 39.

FIG. 40 depicts an enlarged depiction of the area marked "40" in FIG. 39. As shown in the construction of the example precursor assembly 105, flex circuit 130 is attached to stiffener 139 with adhesive 134. When precursor assembly 105 comprising CSP 114, stiffeners 139, adhesives 134 and 135, and flex circuit 130 is disposed in cavity 188 of jig 186, flex circuit 130 is deflected in an upward direction as shown in FIG. 40.

Figure 41:
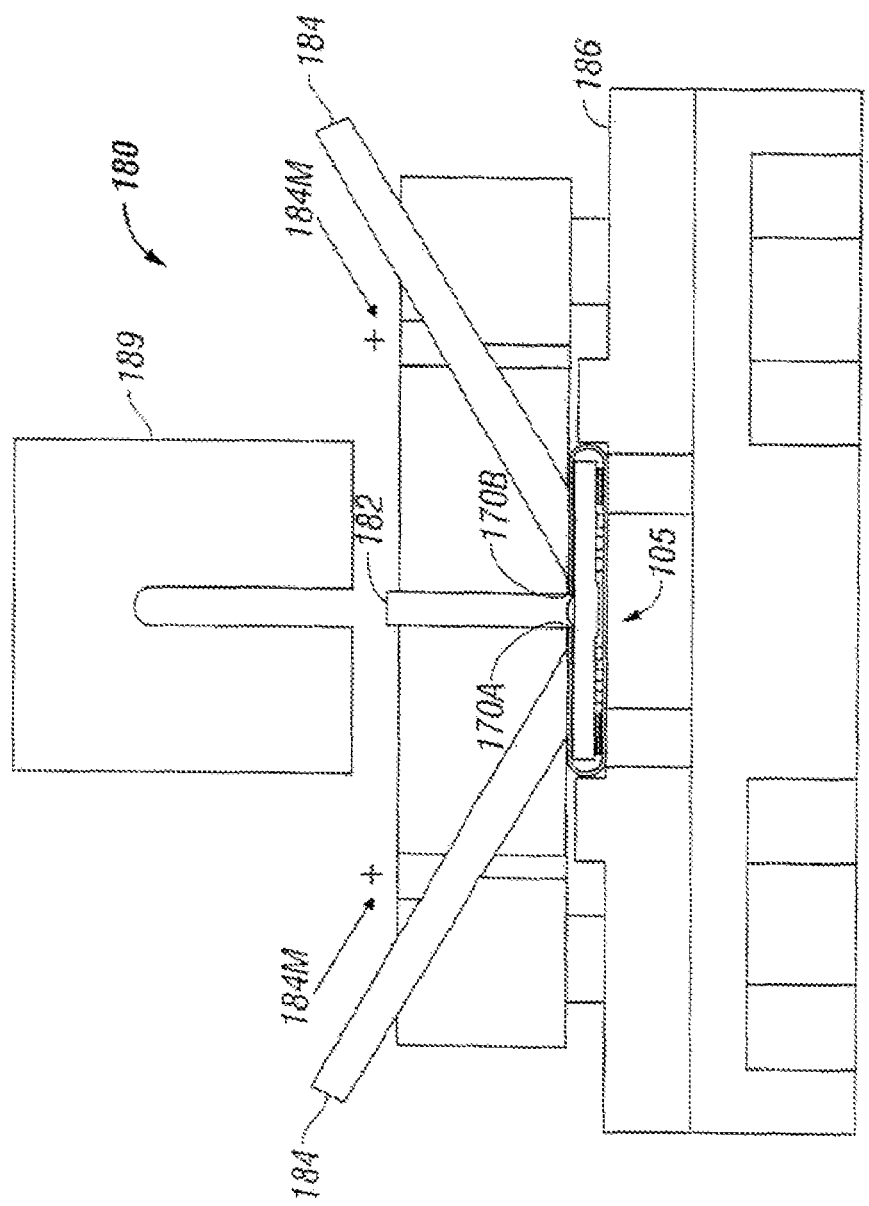
FIG. 41 illustrates a tooling apparatus in accordance with a preferred embodiment of the present invention.

FIG. 41 illustrates a step in a method of devising an precursor assembly 105 in accordance with a preferred embodiment of the present invention. As indicated, forming tools 184 are moveable as indicated by the arrow 184M to indicate with the "+" sign movement of forming tools 184 to dispose upper ends 130U of flex circuit 130 over CSP 114. The ends 170A and 170B are set apart at distance "G" apart by flex aligner 182.

Figure 42:
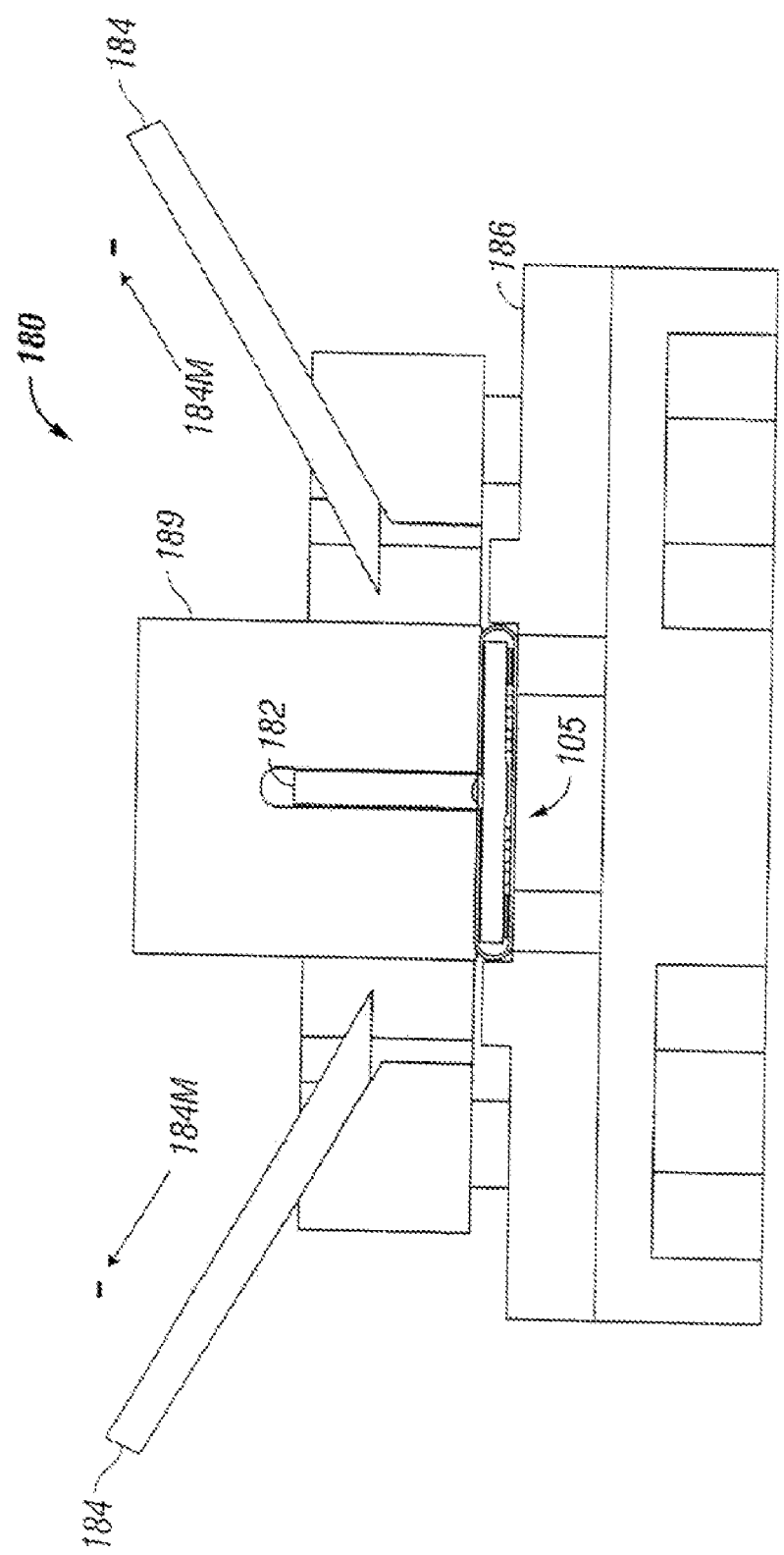
FIG. 42 illustrates another step in devising an assembly in accordance with a preferred embodiment of the present invention.

FIG. 42 illustrates another step in a method for devising a precursor assembly 105 in accordance with a preferred embodiment of the present invention. Press tool 189 is imposed on precursor assembly 105 after upper portions 130U of flex circuit 130 have been disposed over the upper surface 116 of the CSP 114 and forming tools 184 are withdrawn as indicated by the arrow 184M to indicate with the "−" sign movement of forming tools 184. Press tool 189 preferably may be heated.

Figure 43:
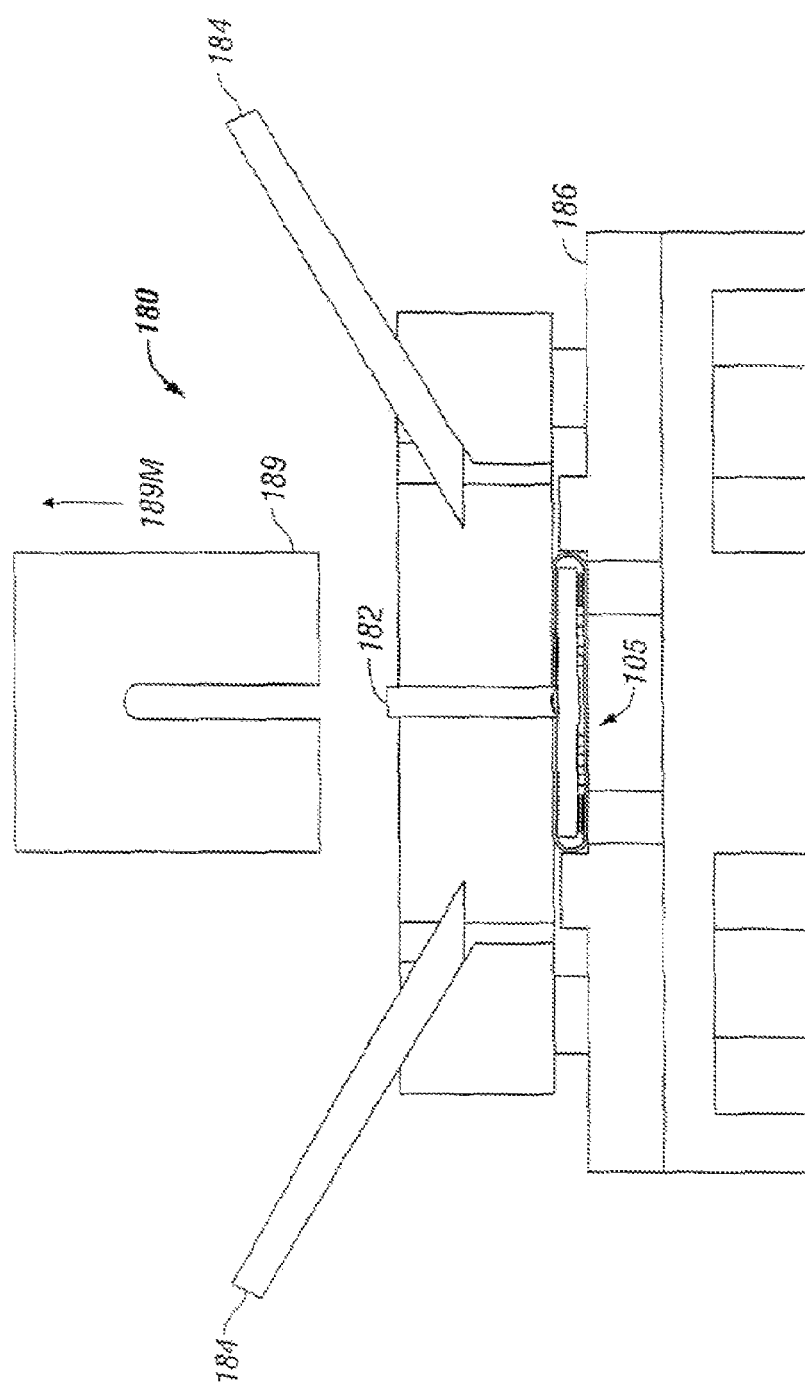
FIG. 43 depicts another step in devising an assembly in accordance with a preferred embodiment of the present invention.

FIG. 43 depicts another step in a method for devising a precursor assembly 105 in accordance with a preferred embodiment of the present invention. Press tool 189 has moved up off of precursor assembly 105 as indicated by motion arrow 189M. Flex aligner 182 may now be withdrawn and precursor assembly 105 is ready for combination with either another precursor assembly 105 or a CSP 112 to form a module 110.

Figure 44:
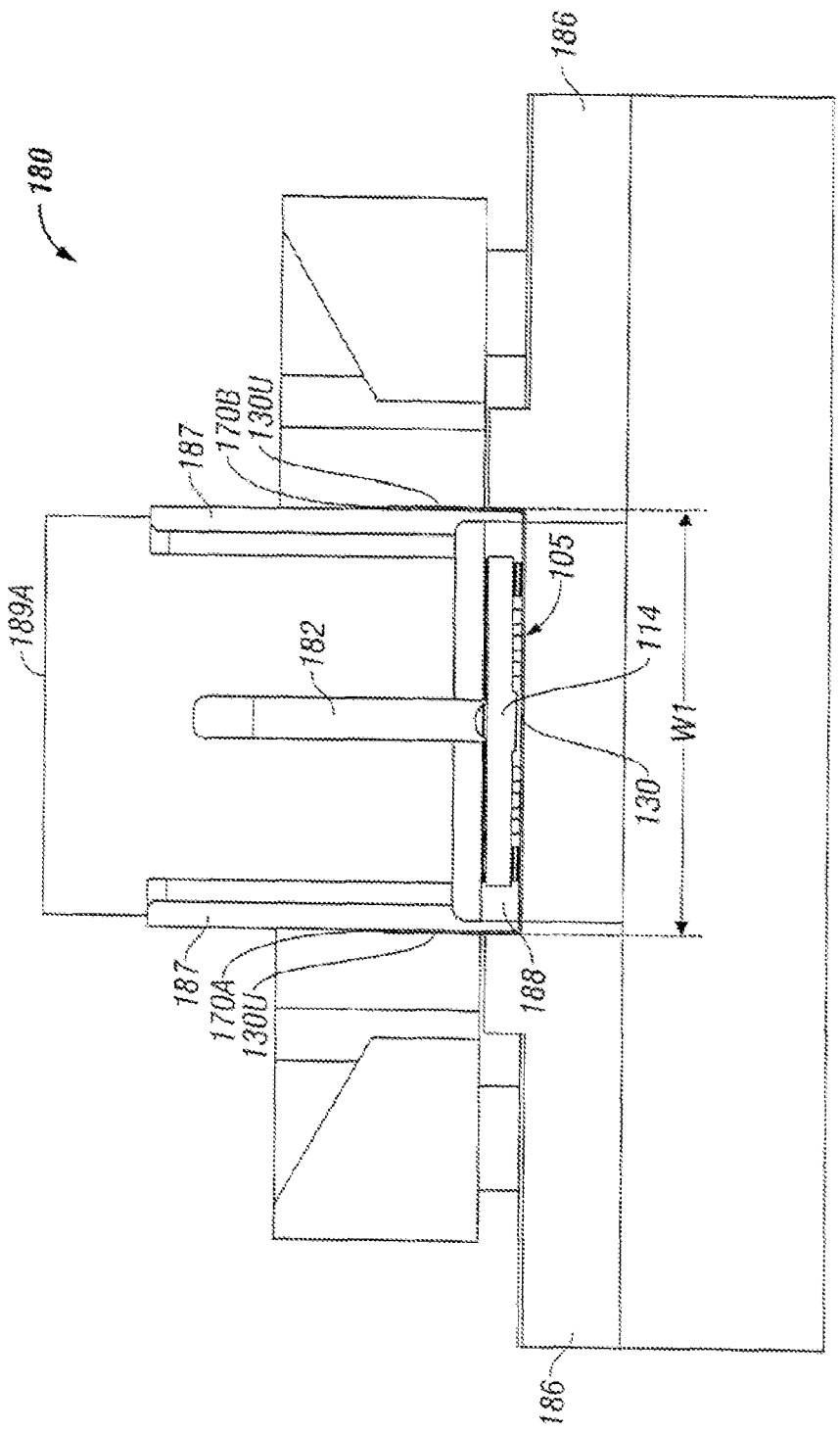
FIG. 44 depicts a tooling apparatus devised in accordance with another preferred embodiment of the present invention, and illustrates a step in accordance with another preferred embodiment of the present invention.

FIG. 44 depicts a tooling apparatus 180 devised in accordance with another preferred embodiment of the present invention also using a physical form to set gap G between edges 170A and 170B of flex circuit 130. In a step of a preferred method for using the tooling apparatus 180 depicted in FIG. 44, jigs 186 are placed in first configuration with jigs 186 set apart by a first width W1. In this embodiment, precursor assembly 105, comprising CSP 114, stiffeners 139, adhesives 134 and 135, and flex circuit 130 is disposed in cavity 188 by flex aligner 182; and upper portions 130U of flex circuit 130 are deflected in an upward direction in the configuration shown in FIG. 44 by preform tools 187 comprised in press tool 189A.

Figure 45:
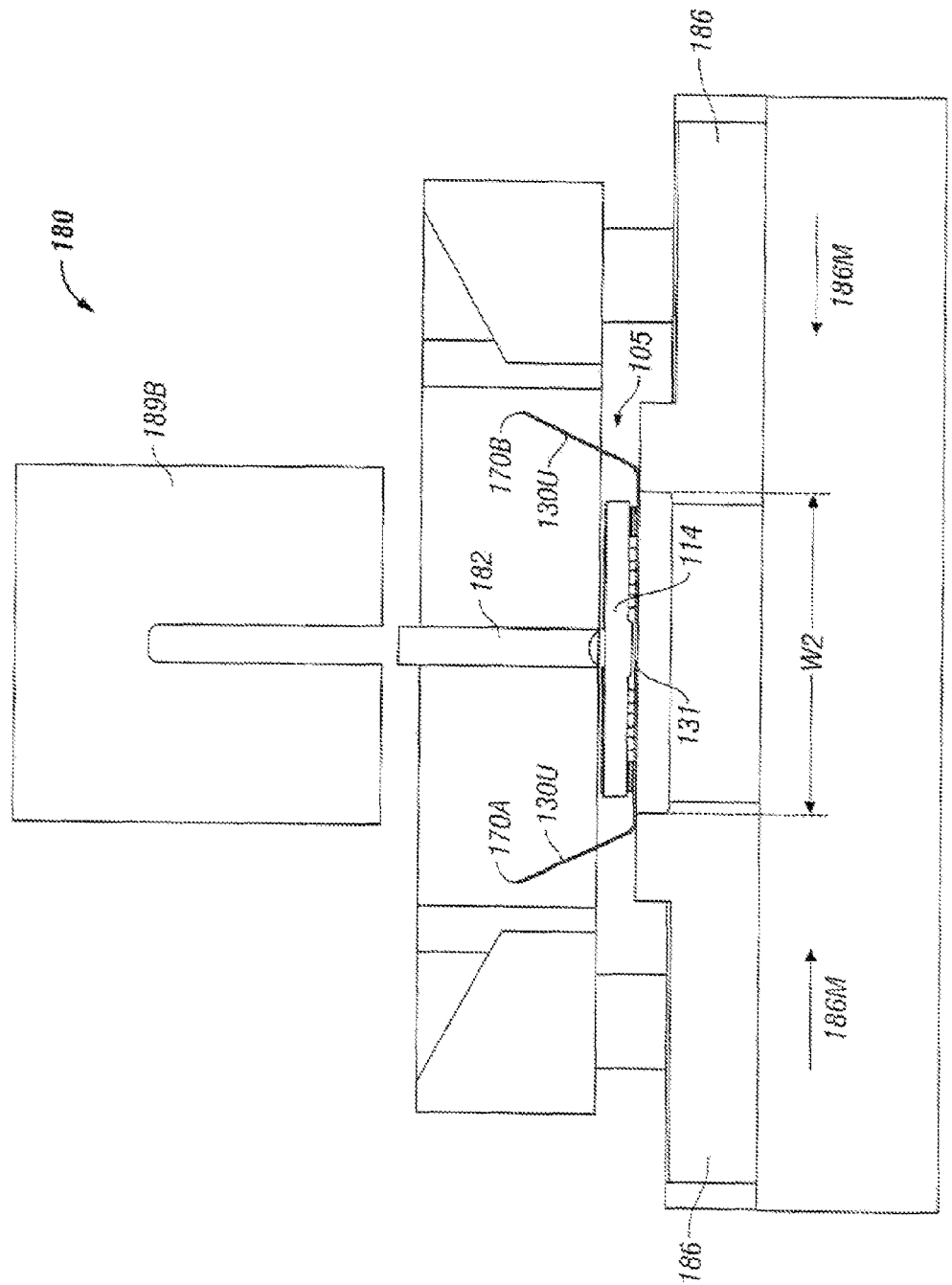
FIG. 45 illustrates another step in devising an assembly in accordance with another preferred embodiment of the present invention.

In the embodiment depicted in FIG. 45, press tool 189A used for the step depicted in FIG. 44 is retracted and exchanged for press tool 189B shown, which does not comprise preform tools 187. With precursor assembly 105 raised above cavity 188, jigs 186 are moved in the direction indicated by motion arrows 186M to a second configuration, in which jigs 186 are set apart by a second width W2. In the configuration depicted in FIG. 45., the flex preformed by the step depicted in FIG. 44 relaxes, with upper portions 130U of flex circuit 130 springing back to some extent from the position depicted in FIG. 44.

Figure 46:
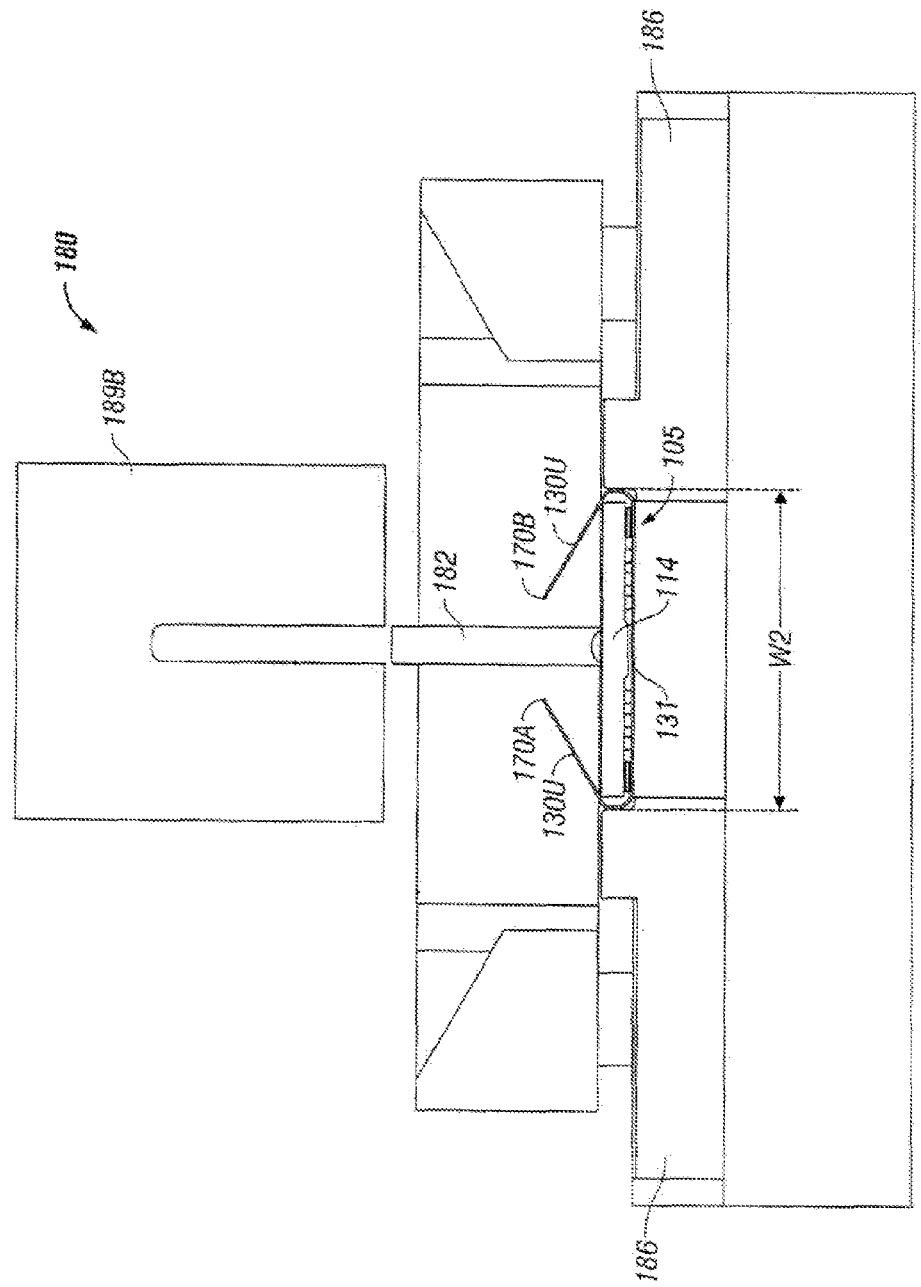
FIG. 46 depicts another step in devising an assembly in accordance with another preferred embodiment of the present invention.

FIG. 46 depicts another step in a preferred method for using the illustrated tooling apparatus 180. With jigs 186 set apart by second width W2, precursor assembly 105 is disposed in cavity 188 by flex aligner 182, which causes upper portions 130U of flex circuit 130 to be deflected in an inward direction in the configuration shown in FIG. 46 by interference with jigs 186 set apart at second width W2.

FIG. 47 depicts another step in a preferred method for using the illustrated tooling apparatus 180. With upper portions 130U of flex circuit 130 disposed above CSP 114, such as depicted in FIG. 46, press tool 189B is imposed on precursor assembly 105. Press tool 189B preferably may be heated. In this configuration, the ends 170A and 170B of flex circuit 130 are set apart at distance G by flex aligner 182, and upper portions 130U of flex circuit 130 are attached to top surface 116 of CSP 114 by adhesive 171, for example as illustrated in FIG. 23.

FIG. 48 depicts another step in a method for devising a precursor assembly 105 in accordance with a preferred embodiment of the present invention. Press tool 189B has moved up off of precursor assembly 105 as indicated by motion arrow 189M. Flex aligner 182 may now be withdrawn and precursor assembly 105 is ready for combination with either another precursor assembly 105 or a CSP 112 to form a module 110.

The tooling apparatus and methods depicted in FIGS. 44-48 do not have or use forming tools 184 such as those depicted in FIGS. 39-43, but forming tools 184 and other similar structures could be used in the methods and with the tooling apparatus depicted in FIGS. 44-48 instead of, or with, press tool 189B.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive, and therefore the scope of the invention is indicated by the following claims.

The invention claimed is

1. An assembly devised as a component for a stacked circuit module comprising:
   a first CSP comprising upper and lower major surfaces and first CSP contacts disposed along the lower major surface;
   a flex circuit comprising plural conductive layers, lower flex contacts, and a first upper portion disposed above the upper major surface of the first CSP, the flex circuit further comprising a first fiducial defined by a generally square metallic region and a second fiducial defined by a cross-shaped metallic region, the first and second fiducials being asymmetrically disposed along the flex circuit; and
   a stiffener attached to the lower major surface of the first CSP and to the flex circuit.

2. An assembly devised as a component for a stacked circuit module comprising:
   a first CSP comprising
      a package body having upper and lower major surfaces and first and second lateral sides,
      a lateral extent defined by the first and second lateral sides,
      first CSP contacts disposed along the lower major surface, and
      a mounting height defined by the first CSP contacts;
   a flex circuit configured for external electrical connection of the first CSP, the flex circuit comprising
      lower flex contacts connected to selected ones of the first CSP contacts, and
      first and second upper portions terminated by first and second edges, respectively, the first and second upper portions of the flex circuit being disposed above the upper major surface of the first CSP, and the first and second edges being disposed a preselected distance apart within the lateral extent defined by the first and second lateral sides; and
   first and second generally planar stiffeners each attached to the lower major surface of the first CSP and each having a thickness that does not exceed the mounting height, the first generally planar stiffener being disposed along the first lateral side of the first CSP and the second generally planar stiffener being disposed along the second lateral side of the first CSP.

3. The assembly of claim 2 in which the flex circuit has plural conductive layers.

4. The assembly of claim 2 in which the first and second generally planar stiffeners are disposed within the lateral extent defined by the first and second lateral sides.

5. The assembly of claim 2 in which the first upper portion exhibits first upper flex contacts and the second upper portion exhibits second upper flex contacts, the first and second upper flex contacts being collectively configured for connection to a second CSP.

6. The assembly of claim 2 in which the first and second generally planar stiffeners comprise one or more laminated layers of polyimide film having mechanical properties compatible with the mechanical properties of the flexible circuit.

7. The assembly of claim 2 in which the first and second generally planar stiffeners are attached to the flex circuit with adhesive.

8. The assembly of claim 7 in which the adhesive is a dry film adhesive.

9. The assembly of claim 2 in which the first and second generally planar stiffeners are attached to the first CSP with adhesive.

10. The assembly of claim 9 in which the adhesive is a liquid adhesive.

11. The assembly of claim 2 in which the first CSP contacts at least partially project into a volume between the first and second generally planar stiffeners.

12. The assembly of claim 11 in which the first and second generally planar stiffeners comprise one or more laminated layers of polyimide film having mechanical properties compatible with the mechanical properties of the flexible circuit.

* * * * *